(12) United States Patent
Nakayama et al.

(10) Patent No.: US 9,978,642 B2
(45) Date of Patent: *May 22, 2018

(54) III-V NITRIDE SEMICONDUCTOR DEVICE HAVING REDUCED CONTACT RESISTANCE

(71) Applicant: Renesas Electronics Corporation, Tokyo (JP)

(72) Inventors: Tatsuo Nakayama, Hitachinaka (JP); Hironobu Miyamoto, Hitachinaka (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/076,753

(22) Filed: Mar. 22, 2016

(65) Prior Publication Data

US 2016/0293709 A1 Oct. 6, 2016

(30) Foreign Application Priority Data

Mar. 31, 2015 (JP) .................................. 2015-070738

(51) Int. Cl.

| H01L 29/10 | (2006.01) |
|---|---|
| H01L 29/207 | (2006.01) |
| H01L 29/34 | (2006.01) |
| H01L 29/66 | (2006.01) |
| H01L 29/778 | (2006.01) |

(Continued)

(52) U.S. Cl.
CPC .... *H01L 21/76898* (2013.01); *H01L 29/1087* (2013.01); *H01L 29/207* (2013.01); *H01L 29/34* (2013.01); *H01L 29/66446* (2013.01); *H01L 29/66462* (2013.01); *H01L 29/7786* (2013.01); *H01L 29/78* (2013.01);
(Continued)

(58) Field of Classification Search
CPC ........ H01L 29/778–29/7789; H01L 29/66462; H01L 21/76898
See application file for complete search history.

(56) References Cited

U.S. PATENT DOCUMENTS 9,306,051 B2 * 4/2016 Miura
9,520,489 B2 * 12/2016 Nakayama .......... H01L 27/0605
(Continued)

FOREIGN PATENT DOCUMENTS

JP 2010-109086 A 5/2010

*Primary Examiner* — Erik Kielin
(74) *Attorney, Agent, or Firm* — Sughrue Mion, PLLC

(57) ABSTRACT

Characteristics of a semiconductor device are improved. A semiconductor device includes a voltage clamp layer, a channel base layer, a channel layer, and a barrier layer on a substrate. A trench extends to a certain depth of the channel layer through the barrier layer. A gate electrode is disposed on a gate insulating film within the trench. A source electrode and a drain electrode are provided on the two respective sides of the gate electrode. A coupling within a through-hole that extends to the voltage clamp layer electrically couples the voltage clamp layer to the source electrode. An impurity region containing an impurity having an acceptor level deeper than that of a p-type impurity is provided under the through-hole. The voltage clamp layer decreases variations in characteristics such as threshold voltage and on resistance. The contact resistance is reduced through hopping conduction due to the impurity in the impurity region.

14 Claims, 70 Drawing Sheets

(51) Int. Cl.
*H01L 29/78* (2006.01)
*H01L 21/768* (2006.01)
H01L 29/423 (2006.01)
H01L 29/417 (2006.01)
H01L 29/45 (2006.01)

(52) U.S. Cl.
CPC .... *H01L 29/41758* (2013.01); *H01L 29/4236* (2013.01); *H01L 29/452* (2013.01)

(56) References Cited

U.S. PATENT DOCUMENTS

| | | | |
|---|---|---|---|
| 9,601,609 B2* | 3/2017 | Nakayama | H01L 29/0649 |
| 2004/0004247 A1* | 1/2004 | Forbes | G11C 11/5671 |
| | | | 257/324 |
| 2007/0034853 A1* | 2/2007 | Robbins | H01S 5/305 |
| | | | 257/13 |
| 2016/0043219 A1* | 2/2016 | Liu | H01L 29/7827 |
| | | | 257/329 |

* cited by examiner

FIG. 25A
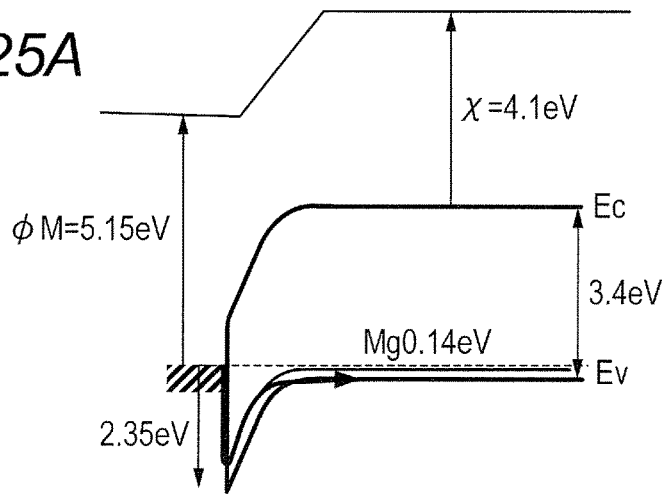
FIG. 25B
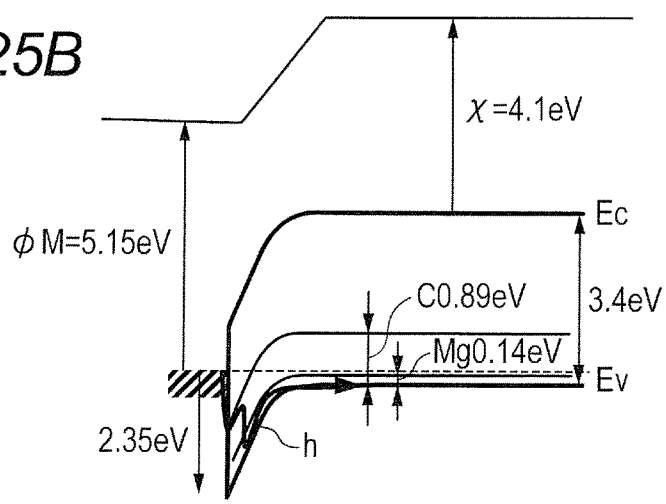
FIG. 25C
| Ga(vacancy) | 0.14 |
|---|---|
| Mg | 0.14~0.21eV |
| Si | 0.19eV |
| Zn | 0.21~0.34eV |
| Hg | 0.41eV |
| Cd | 0.55eV |
| Be | 0.7eV |
| Li | 0.75eV |
| C | 0.89eV |
| Ga | 0.59~1.09eV |

III-V NITRIDE SEMICONDUCTOR DEVICE HAVING REDUCED CONTACT RESISTANCE

CROSS-REFERENCE TO RELATED APPLICATIONS

The disclosure of Japanese Patent Application No. 2015-070738 filed on Mar. 31, 2015 including the specification, drawings and abstract is incorporated herein by reference in its entirety.

BACKGROUND

The present invention relates to a semiconductor device. For example, the invention is preferably used for a semiconductor device including a nitride semiconductor.

A semiconductor device including a III-V compound having a bandgap larger than that of silicon (Si) are now the subject of interest. In particular, a MISFET including gallium nitride (GaN) is advantageous in 1) a high dielectric breakdown field, 2) a high electron saturation velocity, 3) a large thermal conductivity, 4) formation of a good heterojunction between AlGaN and GaN, and 5) a nontoxic or safe material.

For example, Japanese Unexamined Patent Application Publication No. 2010-109086 discloses a normally-off nitride semiconductor element, in which a p-GaN layer is electrically coupled to a source electrode via a contact plug.

SUMMARY

The inventors have conducted research and development of such a semiconductor device including the nitride semiconductor, and have made earnest investigations on improvement in characteristics of the semiconductor device. Through such investigations, it has been found that there is room for improvement in characteristics of the semiconductor device including the nitride semiconductor.

Other issues and novel features will be clarified from the description of this specification and the accompanying drawings.

A typical one of some embodiments disclosed herein is briefly summarized as follows.

A semiconductor device of the one embodiment disclosed herein includes a voltage clamp layer and a channel layer provided over a substrate. The semiconductor device further includes a gate electrode disposed over the channel layer and a source electrode and a drain electrode provided over the channel layer on the two respective sides of the gate electrode. The voltage clamp layer is coupled to the source electrode via a coupling within a through-hole that extends to the voltage clamp layer. An impurity region containing an impurity having an acceptor level deeper than that of a p-type impurity contained in the voltage clamp layer is disposed under the through-hole. A defect region may be disposed under the through-hole.

A method of manufacturing a semiconductor device in one embodiment disclosed herein includes the steps of: forming a voltage clamp layer, a channel layer, and a gate electrode over a substrate; and forming a source electrode and a drain electrode over the channel layer on the two respective sides of the gate electrode. The method further includes the steps of: forming a through-hole that extends to the voltage clamp layer through the channel layer or a device isolation region provided in the channel layer; forming an impurity region under the through-hole; and forming a coupling by filling the inside of the through-hole with a conductive film. The coupling couples the source electrode to the voltage clamp layer. In the step of forming the impurity region, the impurity region is formed by injecting an impurity, which has an acceptor level deeper than that of a p-type impurity contained in the voltage clamp layer, into a portion under the through-hole.

According to the semiconductor device described in each of the typical embodiments disclosed herein, the characteristics of the semiconductor device can be improved.

According to the method of manufacturing the semiconductor device described in each of the typical embodiments disclosed herein, a semiconductor device having good characteristics can be manufactured.

BRIEF DESCRIPTION OF THE DRAWINGS

FIGS. 25A to 25C are diagrams illustrating a band structure near a bottom of a through-hole and acceptor levels of various elements.

DETAILED DESCRIPTION

Although each of the following embodiments may be dividedly described in a plurality of sections or embodiments for convenience as necessary, they are not unrelated to one another except for the particularly defined case, and are in a relationship where one is a modification, an application, detailed explanation, supplementary explanation, or the like of part or all of another one. In each of the following embodiments, when the number of elements and the like (including the number, a numerical value, amount, and a range) are mentioned, the number is not limited to a specified number except for the particularly defined case and for the case where the number is principally clearly limited to the specified number. In other words, the number may be not less than or not more than the specified number.

In each of the following embodiments, a constitutional element (including an element step etc.) of the embodiment is not necessarily indispensable except for the particularly defined case and for the case where the constitutional element is probably indispensable in principle. Similarly, in each of the following embodiments, when a configuration such as a shape of a constitutional element or a positional relationship is described, any configuration substantially closely related to or similar to the configuration should be included except for the particularly defined case and for the case where that configuration is probably not included in principle. The same holds true in the number of elements and the like (including the number, a numerical value, amount, and a range).

Hereinafter, some embodiments of the invention will be described in detail with reference to the accompanying drawings. In all drawings for explaining the embodiments, components having the same function are designated by the same or relevant numeral, and duplicated description is omitted. If a plurality of similar components (sites) exist, the numeral for a general term may be further marked with a sign to indicate an individual or a particular site. In the following embodiments, the same or similar portion is not repeatedly described in principle except for a particularly required case.

Furthermore, a sectional view for explaining each embodiment may also not be hatched for better viewability. A plan view may also be hatched for better viewability.

In the sectional views and the plan views, size of each site does not correspond to an actual device, and a particular site may be illustrated to be relatively large for better viewability. When there are given a section view and a plan view corresponding to each other, a particular site may also be illustrated to be relatively large for better viewability.

First Embodiment

A semiconductor device of a first embodiment is now described in detail with reference to the accompanying drawings.

Description of Structure

Figure 1:
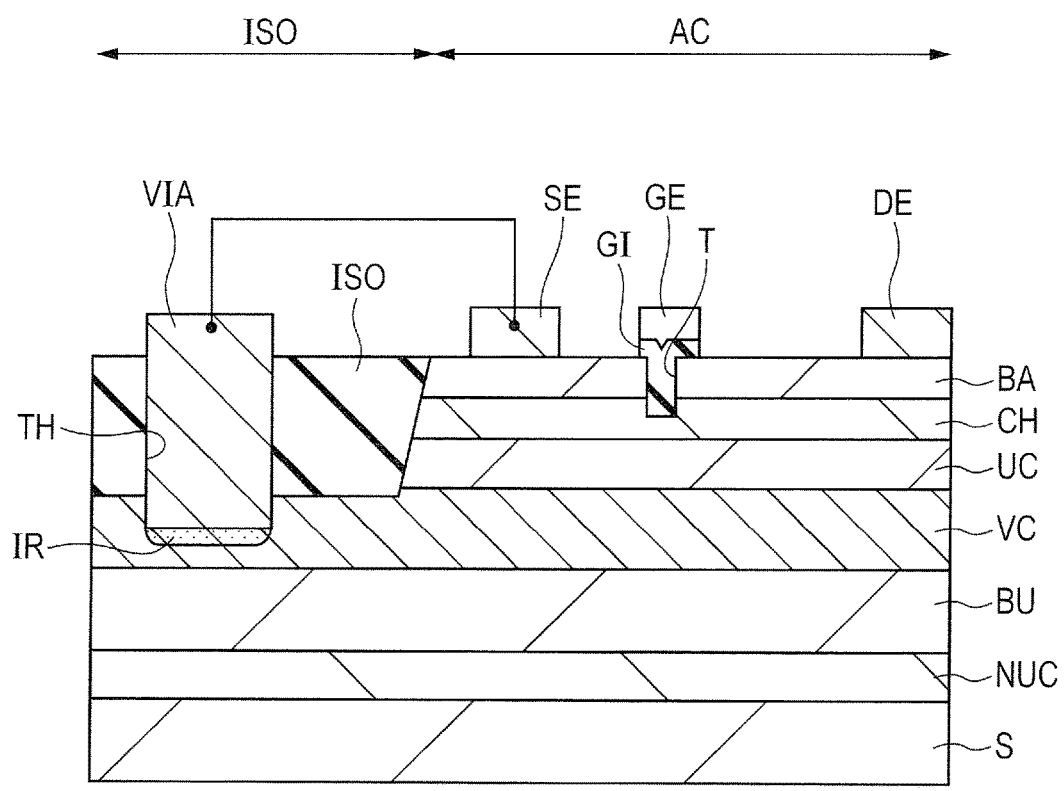
FIG. 1 is a sectional view schematically illustrating a configuration of a semiconductor device of a first embodiment.

FIG. 1 is a sectional view schematically illustrating a configuration of the semiconductor device of a first embodiment. The semiconductor device (semiconductor element) of the first embodiment illustrated in FIG. 1 and the like is a field effect transistor (FET) of a metal insulator semiconductor (MIS) type including a nitride semiconductor. The semiconductor device can be used as a power transistor of a high electron mobility transistor (HEMT) type. The semiconductor device of the first embodiment is what is called a recess-gate semiconductor device.

In the semiconductor device of the first embodiment, a nucleation layer NUC, a buffer layer BU, a voltage clamp layer VC, a channel base layer UC, a channel layer (also referred to as electron traveling layer) CH, and a barrier layer BA are provided in this order on a substrate S. The nucleation layer NUC includes a nitride semiconductor layer. The buffer layer BU includes one or more nitride semiconductor layers each including a nitride semiconductor doped with an impurity forming a deep level. In this exemplary case, the buffer layer BU includes a superlattice structure (also referred to as superlattice layer) including a plurality of nitride semiconductor layers. The voltage clamp layer VC includes a nitride semiconductor layer including a nitride semiconductor doped with a p-type impurity, and is conductive. The channel base layer UC includes a nitride semiconductor layer having an electron affinity smaller than that of the channel layer CH. The channel layer CH includes a nitride semiconductor layer having an electron affinity larger than that of the channel base layer UC. The barrier layer BA includes a nitride semiconductor layer having an electron affinity that is smaller than that of the channel layer CH and than that of the channel base layer UC. An undepicted insulating film is provided on the barrier layer BA. A cap layer may be provided between the insulating film (protective film) and the barrier layer BA. The cap layer preferably includes a nitride semiconductor layer having an electron affinity larger than that of the barrier layer BA.

The MISFET of the first embodiment includes the channel layer CH, a gate insulating film GI on the channel layer CH, a gate electrode GE on the gate insulating film GI, and a source electrode SE and a drain electrode DE on the barrier layer BA on the two respective sides of the gate electrode GE. The MISFET is provided in an active region AC divided by a device isolation region ISO. The gate electrode GE is provided on the gate insulating film GI within a trench T that extends to a certain depth of the channel layer CH through the barrier layer BA.

A two-dimensional electron gas (2DEG) is generated on a channel layer CH side in the vicinity of an interface between the channel layer CH and the barrier layer BA. When a positive potential (threshold potential) is applied to the gate electrode GE, a channel is formed in the vicinity of an interface between the gate insulating film GI and the channel layer CH.

The two-dimensional electron gas (2DEG) is formed by the following mechanism. The nitride semiconductor layers (in this exemplary case, a gallium nitride semiconductor layer) configuring the channel layer CH and the barrier layer BA are different in electron affinity (bandgap) from each other. That is, the barrier layer BA includes a nitride semiconductor layer having an electron affinity smaller than that of a nitride semiconductor layer of the channel layer CH. This results in formation of a well-type potential at a junction plane of such semiconductor layers. Electrons are accumulated within the well-type potential, thereby the two-dimensional electron gas (2DEG) is generated in the vicinity of the interface between the channel layer CH and the barrier layer BA. In particular, since the channel layer CH and the barrier layer are each epitaxially formed with a nitride semiconductor material grown with gallium (or aluminum) face polarity, positive fixed polarization charge is generated at the interface between the channel layer CH and the barrier layer BA, and electrons are accumulated to neutralize the positive fixed polarization charge. This enhances generation of the two-dimensional electron gas (2DEG).

The two-dimensional electron gas (2DEG) generated in the vicinity of the interface between the channel layer CH and the barrier layer BA is divided by the trench T having the gate electrode GE thereon. Hence, the semiconductor device of the first embodiment can maintain its off state while the positive potential (threshold potential) is not applied to the gate electrode GE, and can maintain its on state while the positive potential (threshold potential) is applied to the gate electrode GE. The semiconductor device thus performs normally-off operation. The source electrode SE has, for example, the ground potential in each of the on and off states.

The channel layer CH is sandwiched by the barrier layer BA and the channel base layer UC each having an electron affinity smaller than that of the channel layer CH, which enhances the electron confinement effect. This suppresses a short channel effect, increases an amplification factor, and increases operation speed. When the channel base layer UC is strained due to tensile strain, negative charge caused by piezo polarization and spontaneous polarization is induced at the interface between the channel base layer UC and the channel layer CH; hence, the threshold potential shifts to a positive side. This improves normally-off operability. When strain in the channel base layer UC is relaxed, the negative charge caused by spontaneous polarization is induced at the interface between the channel base layer UC and the channel layer CH; hence, the threshold potential shifts to the positive side. This improves normally-off operability.

In the first embodiment, a coupling (also referred to as via.) VIA, which extends through the device isolation region ISO to the underlying voltage clamp layer VC, is provided in the device isolation region ISO, and is electrically coupled to the source electrode SE. In this way, the voltage clamp layer VC is provided and coupled to the source electrode SE, allowing holes caused by impact ionization to be extracted. In addition, even if electrons and holes are generated by avalanche breakdown due to high voltage application, the holes can be extracted. The element is therefore less likely to be broken even if avalanche breakdown occurs, leading to high avalanche tolerance. In addition, since the voltage clamp layer in the vicinity of the gate is also allowed to have a source potential, delivery of electrons or holes in the buffer layer does not affect the channel layer, leading to a decrease in variations in characteristics such as threshold potential and on resistance (voltage clamp effect).

Furthermore, the semiconductor device of the first embodiment has an impurity region IR in contact with the bottom of the coupling VIA. The impurity region IR contains an impurity (element, dopant) having an acceptor level deeper than that of the p-type impurity contained in the voltage clamp layer VC. Hopping conduction occurs due to the impurity having the acceptor level deeper than that of the p-type impurity contained in the voltage clamp layer VC as described later, so that contact resistance between the coupling VIA and the voltage clamp layer VC can be reduced.

In this way, the impurity region IR is provided, thereby even if the concentration of the p-type impurity in the voltage clamp layer VC is low, the contact resistance between the coupling VIA and the voltage clamp layer VC can be reduced. To put it differently, while the p-type impurity concentration in the voltage clamp layer VC is controlled to be low to maintain the breakdown voltage of the semiconductor device, good contact can be provided between the coupling VIA and the voltage clamp layer VC. This enhances the voltage clamp effect of the voltage clamp layer VC.

Figure 2:
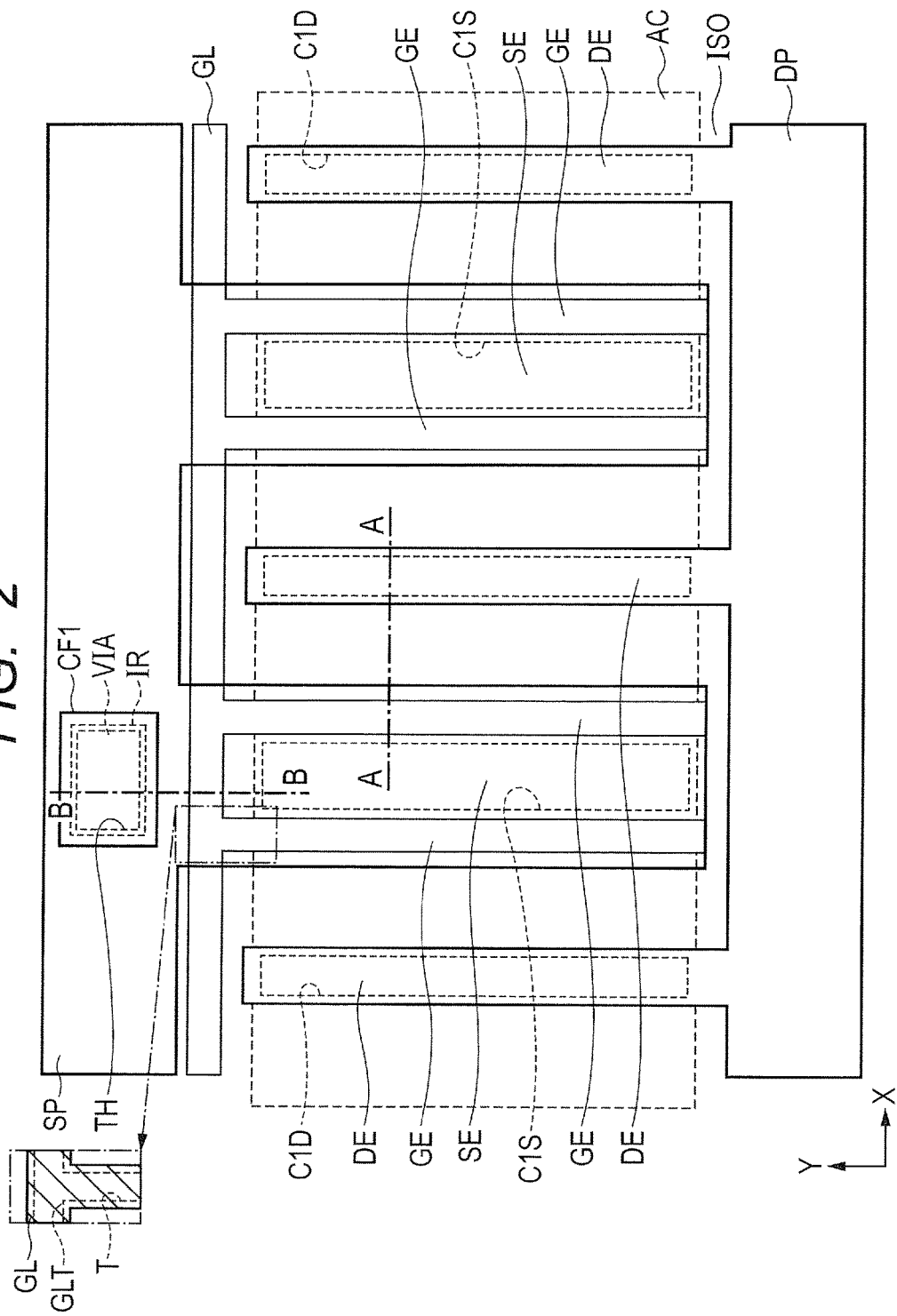
FIG. 2 is a plan view illustrating the configuration of the semiconductor device of the first embodiment.
Figure 3:
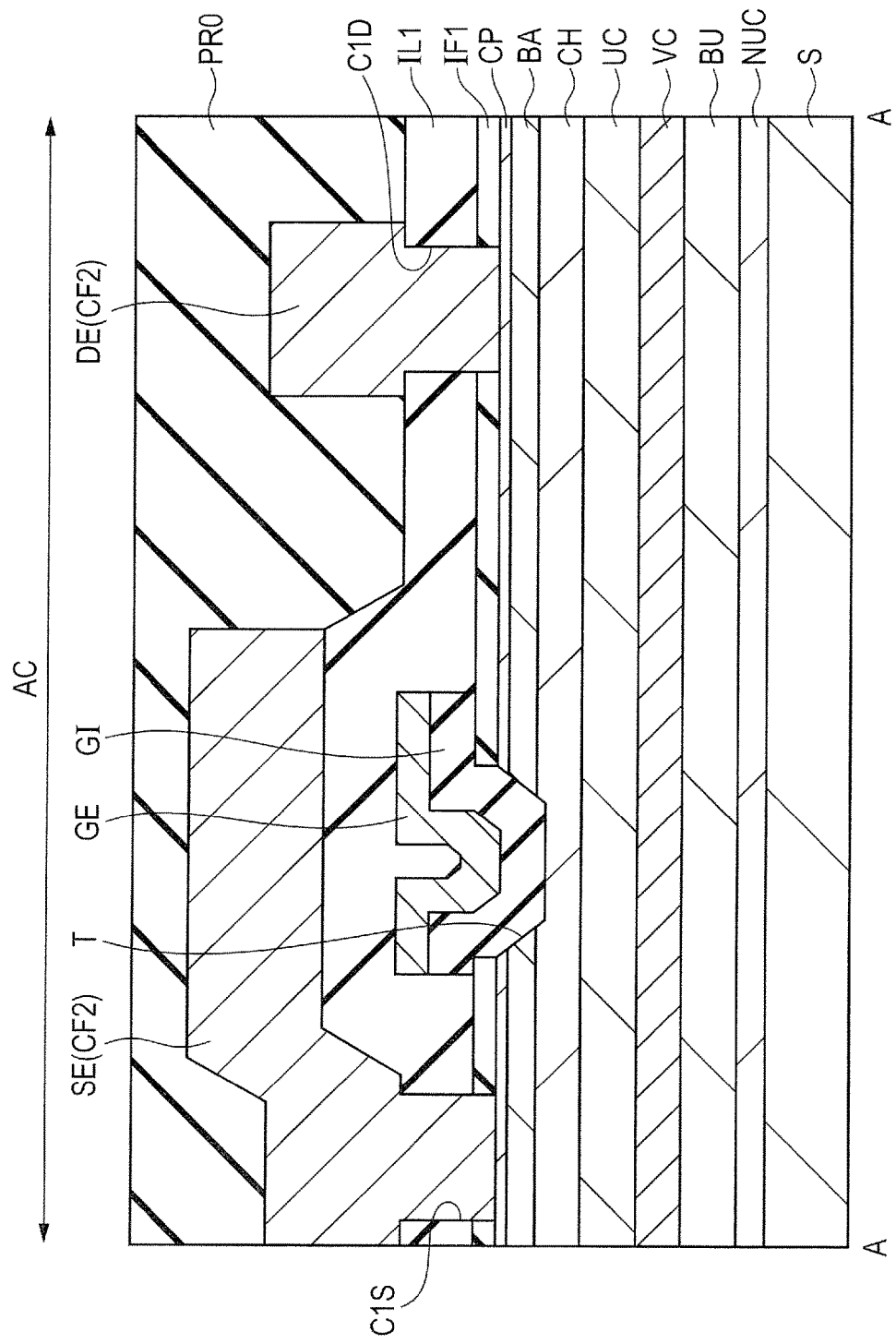
FIG. 3 is a sectional view illustrating the configuration of the semiconductor device of the first embodiment.
Figure 4:
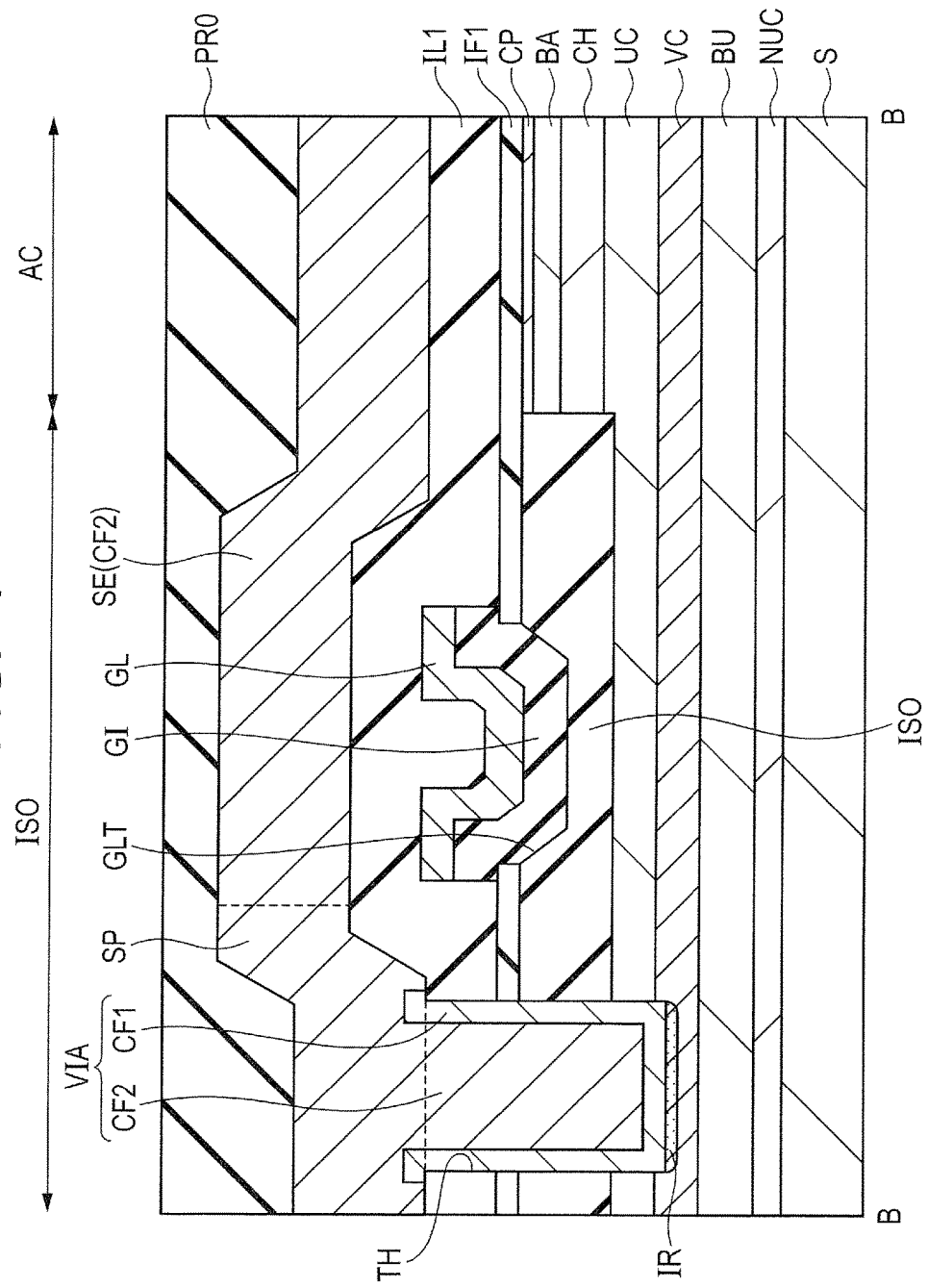
FIG. 4 is a sectional view illustrating the configuration of the semiconductor device of the first embodiment.

The semiconductor device of the first embodiment is described further in detail with reference to FIGS. 2 to 4. FIG. 2 is a plan view illustrating the configuration of the semiconductor device of the first embodiment. FIGS. 3 and 4 are each a sectional view illustrating the configuration of the semiconductor device of the first embodiment. FIG. 3 corresponds to a section along A-A in FIG. 2. FIG. 4 corresponds to a section along B-B in FIG. 2.

As illustrated in FIG. 2, the drain electrode DE has a planar shape being a rectangular shape having a long side in a Y direction. A plurality of linable drain electrodes DE are disposed in an X direction with a certain interval. The source electrode SE has a planar shape being a rectangular shape having a long side in the Y direction. A plurality of linable source electrodes SE are disposed in the X direction with a certain interval. The source electrodes SE and the drain electrodes DE are alternately disposed along the X direction.

A contact hole C1D as a coupling between the drain electrode DE and a cap layer CP (the barrier layer BA) is disposed under the drain electrode DE. The contact hole C1D has a planar shape being a rectangular shape having a long side in the Y direction. A contact hole C1S as a coupling between the source electrode SE and the cap layer CP (the barrier layer BA) is disposed under the source electrode SE. The contact hole C1S has a planar shape being a rectangular shape having a long side in the Y direction.

The gate electrode GE is disposed between the contact hole C1D under the drain electrode DE and the contact hole C1S under the source electrode SE. The gate electrode GE has a rectangular shape having a long side in the Y direction. Two (a pair of) gate electrodes GE are disposed below one source electrode SE. The two gate electrodes GE are disposed on the two respective sides of the contact hole C1S under the source electrode SE. In this way, the two gate electrodes GE are disposed for each of the source electrodes SE.

The drain electrodes DE are coupled to one another by a drain pad (also referred to as terminal section) DP. The drain pad DP is disposed so as to extend in the X direction on one end side (a bottom side in FIG. 2) of each drain electrode DE. In other words, the drain electrodes DE are disposed so as to protrude in the Y direction from the drain pad DP extending in the X direction. Such a shape may be referred to as comb shape.

The source electrodes SE are coupled to one another by a source pad (also referred to as terminal section) SP. The source pad SP is disposed so as to extend in the X direction on one end side (a top side in FIG. 2) of each source electrode SE. In other words, the source electrodes SE are disposed so as to protrude in the Y direction from the source pad SP extending in the X direction. Such a shape may be referred to as comb shape.

The gate electrodes GE are coupled to one another by a gate line GL. The gate line GL is disposed so as to extend in the X direction on one end side (the top side in FIG. 2) of each gate electrode GE. In other words, the gate electrodes GE are disposed so as to protrude in the Y direction from the gate line GL extending in the X direction. The gate line GL is coupled to an undepicted gate pad provided on either side (each of the right and left sides in FIG. 2) in the X direction of the gate line GL.

The source electrodes SE, the drain electrodes DE, and the gate electrodes GE are largely disposed on the active region AC enclosed by the device isolation region ISO. The active region AC has a planar shape being a rectangular shape having a long side in the X direction. The drain pad DP, the gate line GL, and the source pad SP are disposed on the device isolation region ISO. The gate line GL is disposed between the active region AC and the source pad SP.

A through-hole (also referred to as via) TH is disposed under the source pad SP. The through-hole TH is filled with conductive films (CF1, CF2) to form the coupling VIA. As described later, the coupling VIA is electrically coupled to the voltage clamp layer VC. Hence, the source electrode SE is electrically coupled to the voltage clamp layer VC via the source pad SP and the coupling VIA. The impurity region IR is disposed under the coupling VIA. To put it differently, the impurity region IR is disposed in the vicinity of the boundary between the coupling VIA and the voltage clamp layer VC. In other words, the coupling VIA is electrically coupled to the voltage clamp layer VC via the impurity region IR.

As illustrated in FIGS. 2 and 3, the MISFET of the first embodiment includes the gate electrode GE on the active region AC of the substrate S, and the source electrode SE and the drain electrode DE provided in formation regions of the contact holes (C1S and C1D) on the cap layer CP on the two respective sides of the gate electrode GE. A protective film (also referred to as insulating film, cover film, or surface protective film) PRO is disposed over the source electrode SE and the drain electrode DE.

As described above, the nucleation layer NUC, the buffer layer BU, the voltage clamp layer VC, the channel base layer UC, the channel layer (also referred to as electron traveling layer) CH, the barrier layer BA, the cap layer CP, and an insulating film IF1 are provided in this order on the substrate S. The gate electrode GE is provided on the gate insulating film GI within a trench T that extends to a certain depth of the channel layer CH through the insulating film IF1, the cap layer CP, and the barrier layer BA.

For example, a semiconductor substrate (conductive substrate) including silicon (Si) can be used as the substrate S. The substrate S may include the silicon substrate, a substrate of a nitride semiconductor such as GaN, and a substrate of AlN, SiC, or sapphire. In particular, when a nitride semiconductor layer such as a GaN layer is provided on the silicon substrate, the buffer layer BU is often provided as described later in order to improve crystallinity of the nitride semiconductor layer and relax the strain (internal stress) in the substrate. This facilitates charge accumulation described later; hence, the semiconductor device of the first embodiment is effectively used in the case where the nitride semiconductor is combined with the silicon substrate.

The nucleation layer NUC is provided to generate a crystalline nucleus for growth of an overlying layer such as the buffer layer BU. In addition, the nucleation layer NUC is provided to prevent deterioration of the substrate S due to a compositional element (for example, Ga) of the overlying layer diffused from the overlying layer to the substrate S. For example, an aluminum nitride (AlN) layer can be used as the nucleation layer NUC. The AlN layer has a thickness of about 200 nm. The material for the nucleation layer NUC or the thickness thereof can be appropriately selected depending on materials of the substrate S or applications of the semiconductor device. When a GaN substrate is used as the substrate S, or when the nucleation layer NUC is not necessary depending on film formation conditions of the buffer layer and the like, the nucleation layer NUC can be omitted.

The buffer layer BU is provided to improve crystallinity of the overlying nitride semiconductor through lattice constant adjustment, and relax film stress of the laminated nitride semiconductor. Consequently, the crystallinity of the nitride semiconductor is improved. In addition, the buffer layer BU relaxes strain (internal stress) of the substrate S, and thus suppresses occurrence of a warp or a crack in the substrate S. The buffer layer BU may include a superlattice structure including a film stack (AlN/GaN films) formed by alternately stacking a gallium nitride (GaN) layer and an aluminum nitride (AlN) layer in cycles. The superlattice structure includes two or more stacks being repeatedly disposed, each stack including nitride semiconductor layers having different electron affinities. The superlattice structure is doped with carbon (C). For example, a usable superlattice structure includes film stacks deposited in 80 cycles, each film stack including a GaN layer about 20 nm thick and an AlN layer about 5 nm thick. The carbon concentration (doping amount) is, for example, about $1 \times 10^{19}$ (1E19) cm$^{-3}$. However, a material for each film of the film stack or thickness of the film should be appropriately selected depending on applications of the semiconductor device. The buffer layer BU may include a layer other than the superlattice structure. For example, another material film may be provided on the superlattice structure. The buffer layer BU may also include a single-layer film including no superlattice structure.

Materials for each of the superlattice structure and the single-layer film may include AlN and GaN as described above, and InN. A mixed crystal of such nitride semiconductors may also be used. For example, the film stack of the superlattice structure may include the AlN/GaN films and AlGaN/GaN films. For example, the single-layer film may include an AlGaN layer and an InAlN layer.

Although the above-described superlattice structure is doped with carbon, another dopant may be used. The dopant preferably includes an element forming a deep level, such as carbon as described above, transition metals such as iron (Fe), magnesium (Mg), and beryllium (Be). The doping amount or the impurity element should be appropriately selected depending on applications of the semiconductor device.

For example, an AlGaN layer doped with a p-type impurity can be used as the voltage clamp layer VC. The voltage clamp layer VC may include the AlGaN layer, a GaN layer, an AlN layer, and an InN layer. A mixed crystal of such nitride semiconductors may also be used.

In this way, the voltage clamp layer VC is doped with the p-type impurity and is conductive. For example, the voltage clamp layer VC may include an AlGaN layer doped with Mg as a p-type impurity at about $1 \times 10^{18}$ (1E18) cm$^{-3}$. The voltage clamp layer VC has a thickness of about 200 nm, for example.

In this way, the voltage clamp layer VC is preferably doped with the impurity to the extent where the voltage clamp layer VC becomes conductive (for example, the doping amount is $5 \times 10^{16}$ (5E16) $cm^{-3}$ or more in the concentration of an activated impurity for the layer structure of the first embodiment). Examples of the p-type impurity include Be, C, and Mg. In light of longitudinal breakdown voltage, the doping amount of the impurity is preferably $1 \times 10^{18}$ (1E18) $cm^{-3}$ or less in the concentration of the activated impurity. For example, for the layer structure of the first embodiment, the doping amount is preferably $5 \times 10^{17}$ (5E17) $cm^{-3}$ or less in the concentration of the activated impurity to maintain a longitudinal breakdown voltage of 500 V or more.

For example, an AlGaN layer can be used as the channel base layer UC. The channel base layer UC is not intentionally doped with an impurity. If a deep level is formed by the impurity doping, variations in characteristics such as threshold potential may be caused. Consequently, the doping amount of the impurity (n-type or p-type impurity) is preferably $1 \times 10^{16}$ (1E16) $cm^{-3}$ or less.

The AlGaN layer has a thickness of, for example, 1000 nm, and an Al composition of about 3%. The channel base layer UC may include the AlGaN layer and an InAlN layer.

In the first embodiment, the lattice constant in the in-plane direction of the channel base layer UC is transferred to the overlying channel layer CH and barrier layer BA due to epitaxial growth. For example, when a layer having a lattice constant larger than that of the channel base layer (AlGaN layer) UC, such as a GaN layer, an $In_xGa_{(1-x)}N$ layer ($0 \leq X \leq 1$), or an InAlN layer, is formed over the channel base layer UC, compressive strain is applied to the overlying layer. Conversely, when a layer having a lattice constant smaller than that of the channel base layer (AlGaN layer) UC, such as an InAlN layer having a high Al compositional ratio, is formed over the channel base layer UC, tensile strain is applied to the overlying layer.

For example, a GaN layer can be used as the channel layer CH. The channel layer CH is not intentionally doped with an impurity. The GaN layer has a thickness of, for example, about 80 nm. Materials for the channel layer CH may include the GaN layer, an AlN layer, and an InN layer. A mixed crystal of such nitride semiconductors may also be used. The material for the channel layer CH or the thickness thereof can be appropriately selected depending on applications of the semiconductor device. Although a non-doped channel layer CH is used in the first embodiment, the channel layer CH may be appropriately doped with an impurity. The dopant may include an n-type impurity or a p-type impurity. Examples of the n-type impurity include Si, S, and Se. Examples of the p-type impurity include Be, C, and Mg.

However, since the channel layer CH is an electron traveling layer, an excessively high doping amount of the impurity may lower the mobility due to the Coulomb scattering. The channel layer CH is therefore preferably doped with the impurity in the amount of $1 \times 10^{17}$ (1E17) $cm^{-3}$ or less.

The channel layer CH must include a nitride semiconductor having an electron affinity larger than that of the channel base layer UC and than that of the barrier layer BA. When such layers have different lattice constants, and when the AlGaN layer is used as the channel base layer UC while the GaN layer is used as the channel layer CH as in the first embodiment, the thickness of the channel layer CH must be equal to or less than a critical thickness in which dislocation increase.

For example, an $Al_{0.2}Ga_{0.8}N$ layer can be used as the barrier layer BA. The $Al_{0.2}Ga_{0.8}N$ layer has a thickness of about 30 nm, for example. Materials for the barrier layer BA may include the AlGaN layer and an InAlN layer. An Al composition ratio and the like may be appropriately adjusted. The barrier layer BA may have a multilayer structure including a stack of films having different Al composition ratios. Furthermore, materials for the barrier layer BA may include a GaN layer, an AlN layer, and an InN layer. A mixed crystal of such nitride semiconductors may also be used. The material for the barrier layer BA or the thickness thereof can be appropriately selected depending on applications of the semiconductor device. The barrier layer BA may be a non-doped layer, or may be appropriately doped with an impurity depending on applications. The dopant may include an n-type impurity or a p-type impurity. Examples of the n-type impurity include Si, S, and Se. Examples of the p-type impurity include Be, C, and Mg. However, if the doping amount of the impurity in the barrier layer BA is excessively large, the barrier layer BA in the vicinity of the gate electrode GE described later is easily affected by electric potential of the drain electrode DE, leading to a reduction in breakdown voltage. The impurity in the barrier layer BA may cause the Coulomb scattering in the channel layer CH, which may result in a reduction in electron mobility. The barrier layer BA is therefore preferably doped with the impurity in the amount of $1 \times 10^{17}$ (1E17) $cm^{-3}$ or less. The non-doped barrier layer BA is more preferably used.

When the layers have different lattice constants, for example, when the GaN layer is used as the channel layer CH while the AlGaN layer is used as the barrier layer BA, the thickness of the barrier layer BA must be at most a critical thickness above which dislocation increases.

As described above, a nitride semiconductor having an electron affinity smaller than that of the channel layer CH must be used for the barrier layer BA. However, when the barrier layer BA has a multilayer structure, the multilayer may include a layer having an electron affinity larger than that of the channel layer CH and should include at least one layer having an electron affinity smaller than that of the channel layer CH.

For example, a GaN layer can be used as the cap layer CP. The GaN layer has a thickness of about 2 nm, for example. The cap layer CP may include the GaN layer, an AlN layer, and an InN layer. A mixed crystal (for example, AlGaN or InAlN) of such nitride semiconductors may also be used. The cap layer CP may be omitted.

The cap layer CP preferably includes a nitride semiconductor having an electron affinity larger than that of the barrier layer BA. The cap layer CP may be a non-doped layer, or may be appropriately doped with an impurity depending on applications. The dopant may include an n-type impurity or a p-type impurity. Examples of the n-type impurity include Si, S, and Se. Examples of the p-type impurity include Be, C, and Mg.

When the layers have different lattice constants, for example, when the AlGaN layer is used as the barrier layer BA while the GaN layer is used as the cap layer CP, the thickness of the cap layer CP must be at most a critical thickness above which dislocation increases.

For example, a silicon nitride film can be used as the insulating film IF1. The silicon nitride film has a thickness of about 100 nm, for example. An insulating film other than the silicon nitride film may also be used. A stacked structure of several types of insulating films may also be used. The material for the insulating film IF1 or the thickness thereof can be appropriately selected depending on applications of the semiconductor device. The insulating film IF1 preferably has a large bandgap and a small electron affinity compared with the underlying nitride semiconductor. Films satisfying such a condition include the silicon nitride (SiN) film, a silicon oxide ($SiO_2$) film, a silicon oxynitride film, a silicon oxycarbide (SiOC) film, an aluminum oxide (($Al_2O_3$, alumina) film, a hafnium oxide ($HfO_2$) film, and a zirconium oxide ($ZrO_2$) film. Various organic films also satisfy the condition. In particular, a film having a low density of interface states, which are formed at an interface with the underlying nitride semiconductor, is preferably selected to suppress current collapse.

The gate electrode GE is provided on the gate insulating film GI within a trench (also referred to as recess) that is excavated up to a certain depth of the channel layer CH through the insulating film IF1, the cap layer CP, and the barrier layer BA.

An aluminum oxide ($Al_2O_3$) film can be used as the gate insulating film GI. The aluminum oxide film has a thickness of about 50 nm, for example. An insulating film other than the aluminum oxide film may be used as the gate insulating film GI. A stacked structure of several types of insulating films may also be used. The material for the gate insulating film GI or the thickness thereof can be appropriately selected depending on applications of the semiconductor device. The gate insulating film GI preferably has a large bandgap and a small electron affinity compared with the underlying nitride semiconductor. Films satisfying such a condition include the aluminum oxide film, a silicon oxide ($SiO_2$) film, a silicon nitride (SiN) film, a hafnium oxide ($HfO_2$) film, and a zirconium oxide ($ZrO_2$) film. The gate insulating film GI has influence on a voltage applicable to the gate electrode GE and the threshold voltage, and is therefore preferably set in consideration of its breakdown voltage, dielectric constant, and thickness.

A titanium nitride (TiN) film can be used as the gate electrode GE. The titanium nitride film has a thickness of about 200 nm, for example. A conductive film other than the titanium nitride film may also be used as the gate electrode GE. For example, a polycrystalline silicon film doped with an impurity such as boron (B) or phosphorus (P) may be used. A metal including Ti, Al, Ni, or Au may also be used. A film (metal silicide film) of a compound of the metal including Ti, Al, Ni, or Au and Si may also be used. A film of a nitride of the metal including Ti, Al, Ni, or Au may also be used. A stacked structure of several types of conductive films may also be used. The material for the gate electrode GE or the thickness thereof can be appropriately selected depending on applications of the semiconductor device.

A material that is less likely to react with an underlying film (for example, the gate insulating film GI) or an overlying film (for example, an interlayer insulating film IL1) is preferably selected for the gate electrode GE.

The interlayer insulating film IL1 is disposed on the gate electrode GE. The interlayer insulating film IL1 has a through-hole TH and the contact holes C1S and C1D. The impurity region IR is disposed under the through-hole TH (FIG. 4).

For example, a silicon oxide film can be used as the interlayer insulating film IL1. The silicon oxide film has a thickness of about 2000 nm, for example. An insulating film other than the silicon oxide film may also be used. A stacked structure of several types of insulating films may also be used. The material for the interlayer insulating film IL1 or the thickness thereof can be appropriately selected depending on applications of the semiconductor device. The interlayer insulating film IL1 preferably has a large bandgap and a small electron affinity compared with the underlying nitride semiconductor. A material, which is less likely to react with the contactual gate electrode GE, is preferably selected for the interlayer insulating film IL1. Films satisfying such a condition include the silicon oxide film, a silicon nitride film, a silicon oxynitride film, an aluminum oxide ($Al_2O_3$) film, a hafnium oxide ($HfO_2$) film, and a zirconium oxide ($ZrO_2$) film.

A film stack of a conductive film CF1 and a conductive film CF2 is provided over the through-hole TH and the interlayer insulating film IL1 in the periphery of the through-hole TH (see FIG. 4). In this exemplary case, a Ni film is used as the conductive film CF1. The Ni film has a thickness of about 50 nm, for example. An Al film is used as the conductive film CF2. The Al film has a thickness of about 500 nm, for example. The conductive films CF1 and CF2 within the through-hole TH configure the coupling VIA. Materials (CF1 or CF2) for the through-hole TH may include the Ni film, and metal films of Pt, Au, Sn, Zn, Ti, Al, molybdenum (Mo), niobium (Nb), and vanadium (V). The materials may also include a mixture (alloy) of such metals, a film (metal silicide film) of a compound of such a metal and Si, a nitride of such a metal (for example, TiN), and an oxide of such a metal (for example, NiO). A film stack of such materials (for example, a film stack of a NiSi film and an Au film) may also be used. The investigation of the inventors has revealed that when the coupling VIA is coupled to the voltage clamp layer VC via the impurity region IR while nickel (Ni), platinum (Pt), or gold (Au) is used for the conductive film CF1 within the through-hole TH, the coupling resistance between the coupling VIA and the voltage clamp layer VC is preferably low.

The conductive film CF2 is provided over the interlayer insulating film IL1 including the contact holes C1S and C1D (see FIGS. 2, 3, and 4). In this exemplary case, an Al film is used as the conductive film. The Al film has a thickness of about 500 nm, for example. The conductive film CF2 within the contact hole C1S or C1D serves as the source electrode SE or the drain electrode DE. Materials for the source electrode SE or the drain electrode DE may include the Al film and metal films of Ti, molybdenum (Mo), niobium (Nb), and vanadium (V). The materials may also include a mixture (alloy) of such metals, a film (metal silicide film) of a compound of such a metal and Si, and a nitride of such a metal (for example, TiN). A film stack of such materials (for example, a film stack of a TiN film and an Al film) may also be used.

A material similar to that for either conductive film within the through-hole TH may be used for the source electrode SE and for the drain electrode DE. The material for each of the source electrode SE and the drain electrode DE should be a material to be in ohmic contact with the nitride semiconductor layer (cap layer CP) on the bottom of the contact hole (C1S or C1D). In particular, when the nitride semiconductor layer (cap layer CP) on the bottom of the contact hole (C1S or C1D) or a further underlying nitride semiconductor layer is doped with an n-type impurity, ohmic contact is easily provided. Consequently, a material can be selected from among a wide variety of materials for each of the source electrode SE and the drain electrode DE.

A material that is less likely to react with the contactual interlayer insulating film IL1 is preferably selected as a material for each of the through-hole TH, the source electrode SE, and the drain electrode DE.

The impurity region IR under the bottom of the through-hole TH is a partial region of the voltage clamp layer VC, and contains an impurity (element, dopant) having an acceptor level deeper than that of the p-type impurity contained in the voltage clamp layer VC. For example, the impurity region IR can be formed by implanting the impurity having the deep acceptor level into the voltage clamp layer VC exposed from the bottom of the through-hole TH. Consequently, the region into which the impurity having the deep acceptor level is introduced acts as the impurity region IR.

Although the impurity region IR is provided over the entire bottom of the through-hole TH in FIG. 4, the impurity region IR may be provided over only part of the bottom of the through-hole TH. The impurity in the impurity region IR may be diffused so that a lower portion of each sidewall of the through-hole TH is covered with the impurity region IR. In other words, a formation region of the impurity region IR may be larger than the bottom of the through-hole TH. The impurity in the impurity region IR may be diffused to the buffer layer BU under the voltage clamp layer VC.

The bottom of the through-hole TH may be located at the surface of the impurity region IR, or may be located at a certain depth of the impurity region IR.

As described above, the source pad SP and the drain pad DP are integrated with the source electrode SE and the drain electrode DE, respectively. Hence, the source pad SP and the drain pad DP are formed of the same materials as those of the source electrode SE and the drain electrode DE, respectively. The coupling VIA is disposed under the source pad SP, and the impurity region IR is disposed under the coupling VIA with the conductive film CF1 in between (FIG. 4).

An insulating film such as a silicon oxynitride (SiON) film can be used as a protective film PRO over the source electrode SE and the drain electrode DE.

Description of Manufacturing Method

A method of manufacturing the semiconductor device of the first embodiment is now described with reference to FIGS. 5 to 23 while the configuration of the semiconductor device is further clarified. FIGS. 5 to 23 include sectional views and plan views illustrating a manufacturing process of the semiconductor device of the first embodiment.

Figure 5:
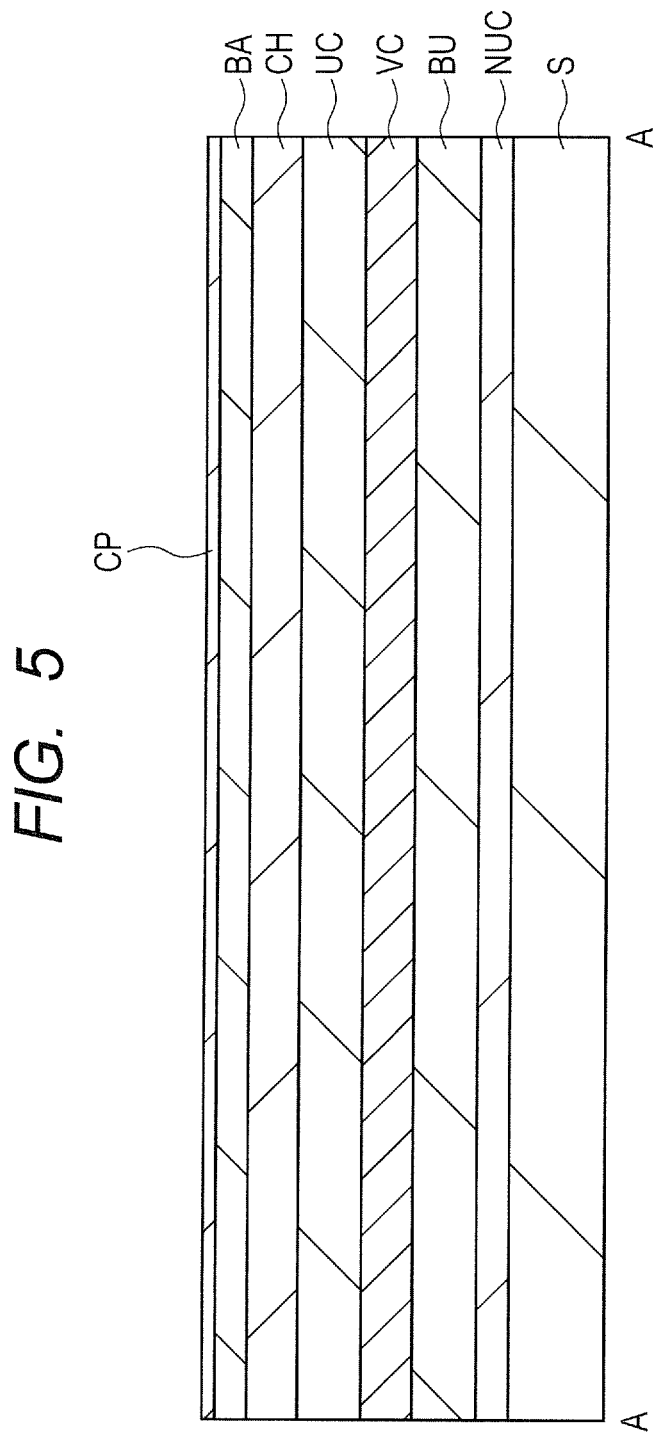
FIG. 5 is a sectional view illustrating a manufacturing process of the semiconductor device of the first embodiment.

As illustrated in FIG. 5, the nucleation layer NUC and the buffer layer BU are sequentially formed on the substrate S. A semiconductor substrate including silicon (Si) exposing a (111) plane is used as the substrate S, and, for example, an aluminum nitride (AlN) layer is heteroepitaxially grown as the nucleation layer NUC on the substrate S in a thickness of about 200 nm using a metal organic chemical vapor deposition (MOCVD) process or the like.

The substrate S may include the silicon substrate, a SiC substrate, a sapphire substrate, and the like. Typically, the nucleation layer NUC and nitride semiconductor layers (III-V compound semiconductor layer) subsequent to the nucleation layer NUC are all formed by group III face growth (in this exemplary case, gallium face growth or aluminum face growth).

Subsequently, a superlattice structure is formed as the buffer layer BU on the nucleation layer NUC, the superlattice structure including film stacks (AlN/GaN films) each including a gallium nitride (GaN) layer and an aluminum nitride (AlN) layer. For example, the gallium nitride (GaN) layer about 20 nm thick and the aluminum nitride (AlN) layer about 5 nm thick are heteroepitaxially grown by turns using the metal organic chemical vapor deposition process or the like. For example, the film stacks are formed by 40 layers. Such film stacks may be grown while being doped with carbon (C). For example, each film stack is doped with carbon so as to have a carbon concentration of about $1 \times 10^{19}$ (1E19) $cm^{-3}$.

In addition, for example, an AlGaN layer may be heteroepitaxially grown as part of the buffer layer BU on the buffer layer BU using the metal organic chemical vapor deposition process or the like.

Subsequently, for example, an AlGaN layer containing a p-type impurity is heteroepitaxially grown as the voltage clamp layer VC on the buffer layer BU using the metal organic chemical vapor deposition process or the like. For example, magnesium (Mg) is used as the p-type impurity. For example, the AlGaN layer is deposited about 200 nm while being doped with magnesium (Mg). The Mg concentration in the deposited film is about $5 \times 10^{18}$ (5E18) $cm^{-3}$, for example.

Subsequently, the channel base layer UC is formed on the voltage clamp layer VC. For example, an AlGaN layer is heteroepitaxially grown as the channel base layer UC on the voltage clamp layer VC using the metal organic chemical vapor deposition process or the like. The AlGaN layer is grown while being not intentionally doped with an impurity. The AlGaN layer has a thickness of, for example, 1000 nm, and has an Al composition of about 3%.

Subsequently, the channel layer CH is formed on the channel base layer UC. For example, a gallium nitride layer (GaN layer) is heteroepitaxially grown on the channel base layer UC using the metal organic chemical vapor deposition process or the like. The GaN layer is grown while being not intentionally doped with an impurity. The channel layer CH has a thickness of, for example, about 80 nm.

Subsequently, for example, an AlGaN layer is heteroepitaxially grown as the barrier layer BA on the channel layer CH using the metal organic chemical vapor deposition process or the like. For example, an $Al_{0.2}Ga_{0.8}N$ layer is formed with an Al composition ratio of 0.2 and a Ga composition ratio of 0.8. The Al composition ratio of the AlGaN layer as the barrier layer BA is controlled to be larger than the Al composition ratio of the AlGaN layer as the buffer layer BU.

In this way, a stack of the channel base layer UC, the channel layer CH, and the barrier layer BA is formed. Two-dimensional electron gas (2DEG) is generated in the vicinity of the interface between the channel layer CH and the barrier layer BA.

Subsequently, the cap layer CP is formed on the barrier layer BA. For example, a gallium nitride layer (GaN layer) is heteroepitaxially grown on the barrier layer BA using the metal organic chemical vapor deposition process or the like. The gallium nitride layer is grown while being not intentionally doped with an impurity. The cap layer CP has a thickness of, for example, about 2 nm.

Figure 6:
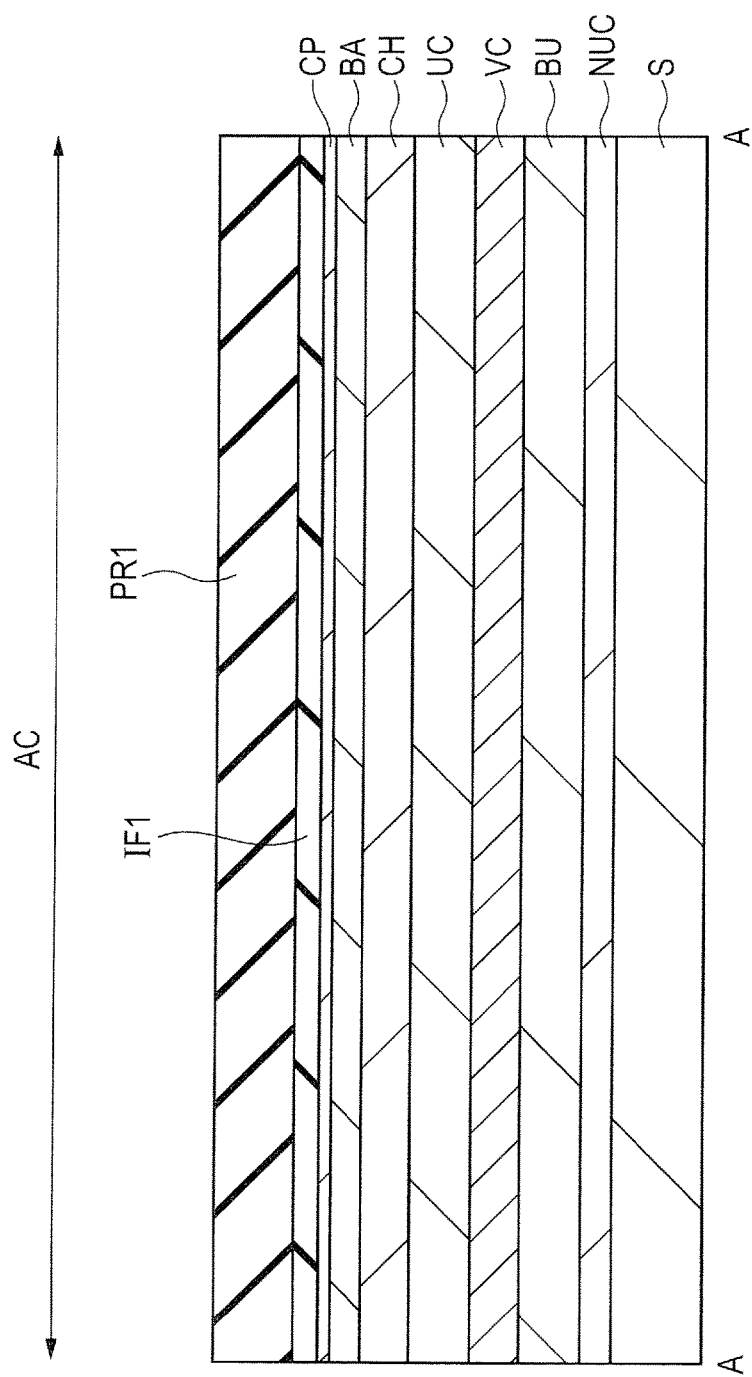
FIG. 6 is a sectional view illustrating the manufacturing process of the semiconductor device of the first embodiment, showing a step following FIG. 5.
Figure 7:
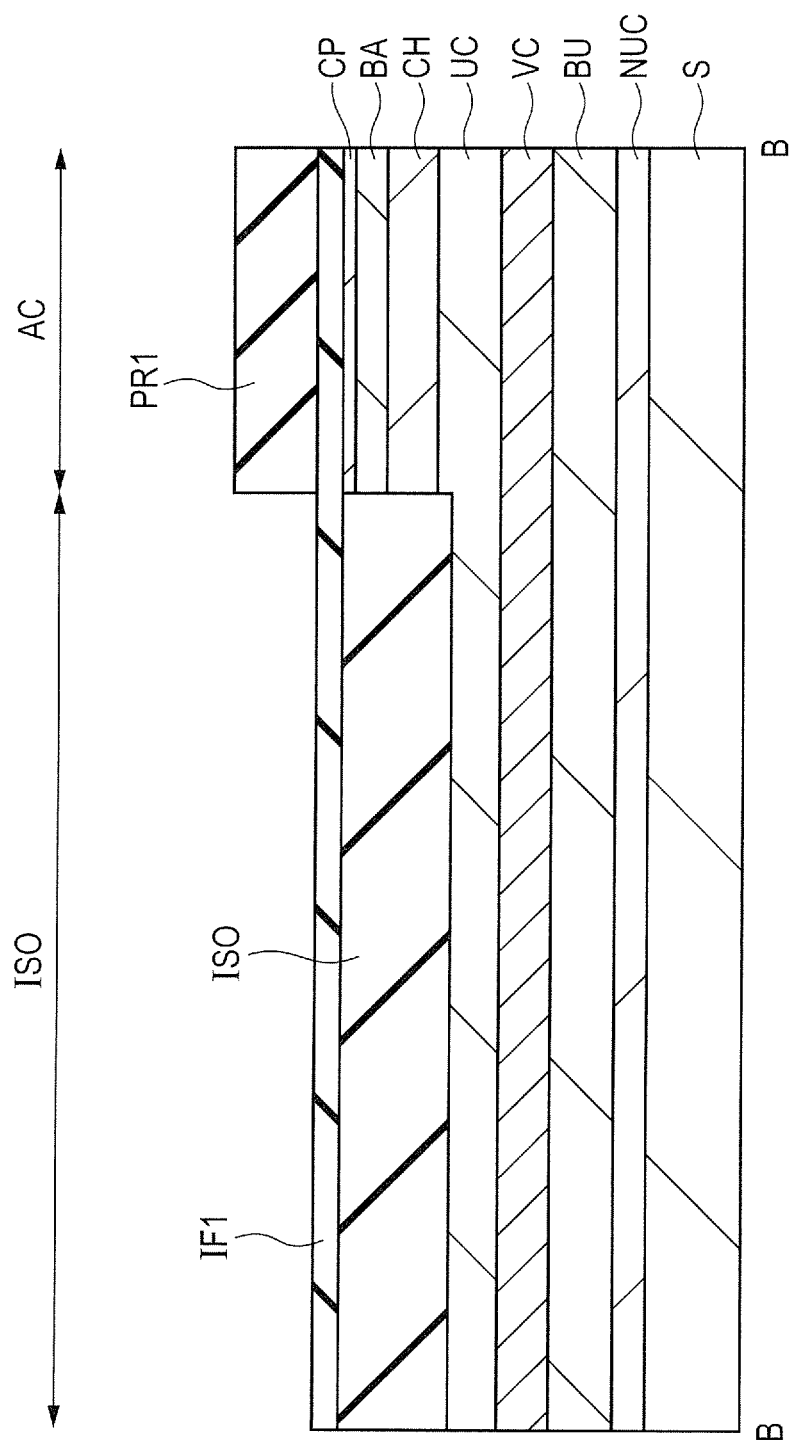
FIG. 7 is a sectional view illustrating the manufacturing process of the semiconductor device of the first embodiment.
Figure 8:
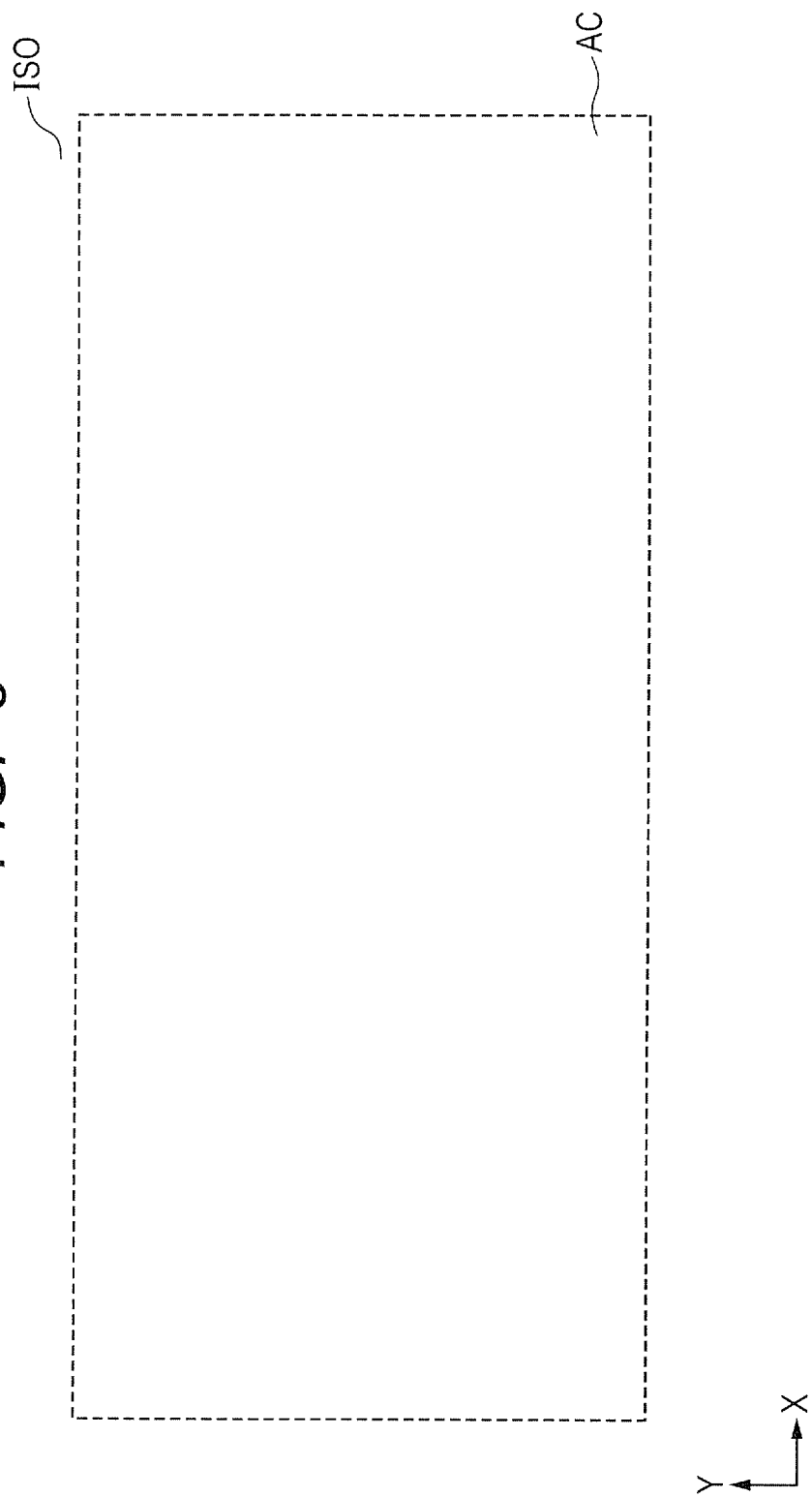
FIG. 8 is a plan view illustrating the manufacturing process of the semiconductor device of the first embodiment.

Subsequently, as illustrated in FIGS. 6 and 7, a silicon nitride film is deposited, for example, about 100 nm as the insulating film IF1 on the cap layer CP using a plasma-enhanced chemical vapor deposition (PECVD) process or the like.

Subsequently, a photoresist film PR1 is formed on the insulating film IF1 to open the device isolation region by a photolithography process. Subsequently, nitrogen ions are implanted with the photoresist film PR1 as a mask to form the device isolation region ISO. Ion species such as nitrogen (N) or boron (B) is thus implanted, thereby a crystal state is changed so that resistance becomes higher.

For example, nitrogen ions are implanted at a density of about $5 \times 10^{14}$ (5E14) $cm^2$ into the stack of the channel base layer UC, the channel layer CH, and the barrier layer BA through the insulating film IF1. The implantation energy is about 120 keV, for example. The implantation condition of the nitrogen ions is adjusted such that implantation depth, i.e., the bottom of the device isolation region ISO is located below the bottom of the channel layer CH and above the bottom of the voltage clamp layer VC. The bottom of the device isolation region ISO is located above the bottom of the through-hole TH (coupling VIA) described later. In this way, the device isolation region ISO is formed. A region enclosed by the device isolation region ISO acts as the active region AC. As described in FIG. 8, the active region AC has a roughly rectangular shape having a long side in the X direction, for example. Subsequently, the photoresist film PR1 is removed by a plasma stripping process or the like.

Figure 9:
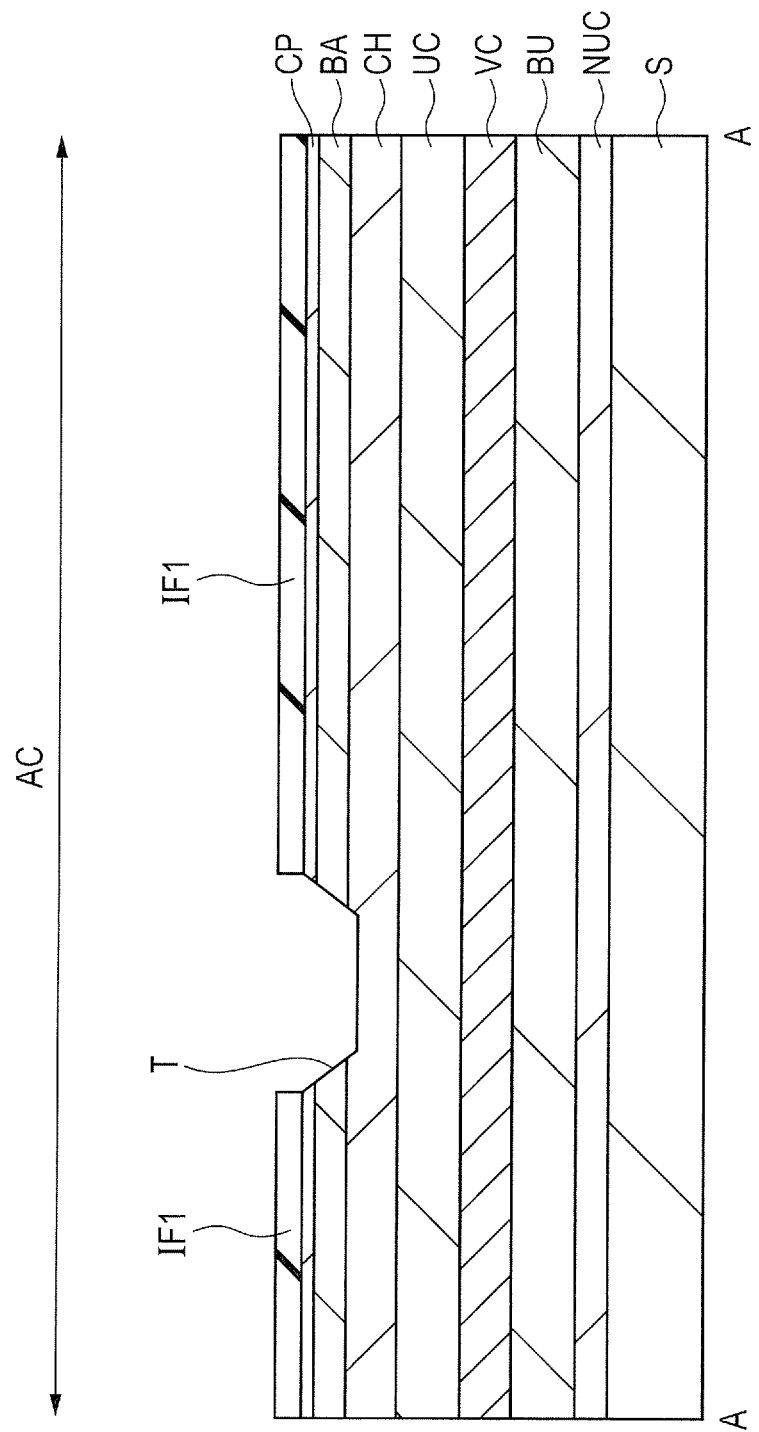
FIG. 9 is a sectional view illustrating the manufacturing process of the semiconductor device of the first embodiment, showing a step following FIG. 6.
Figure 10:
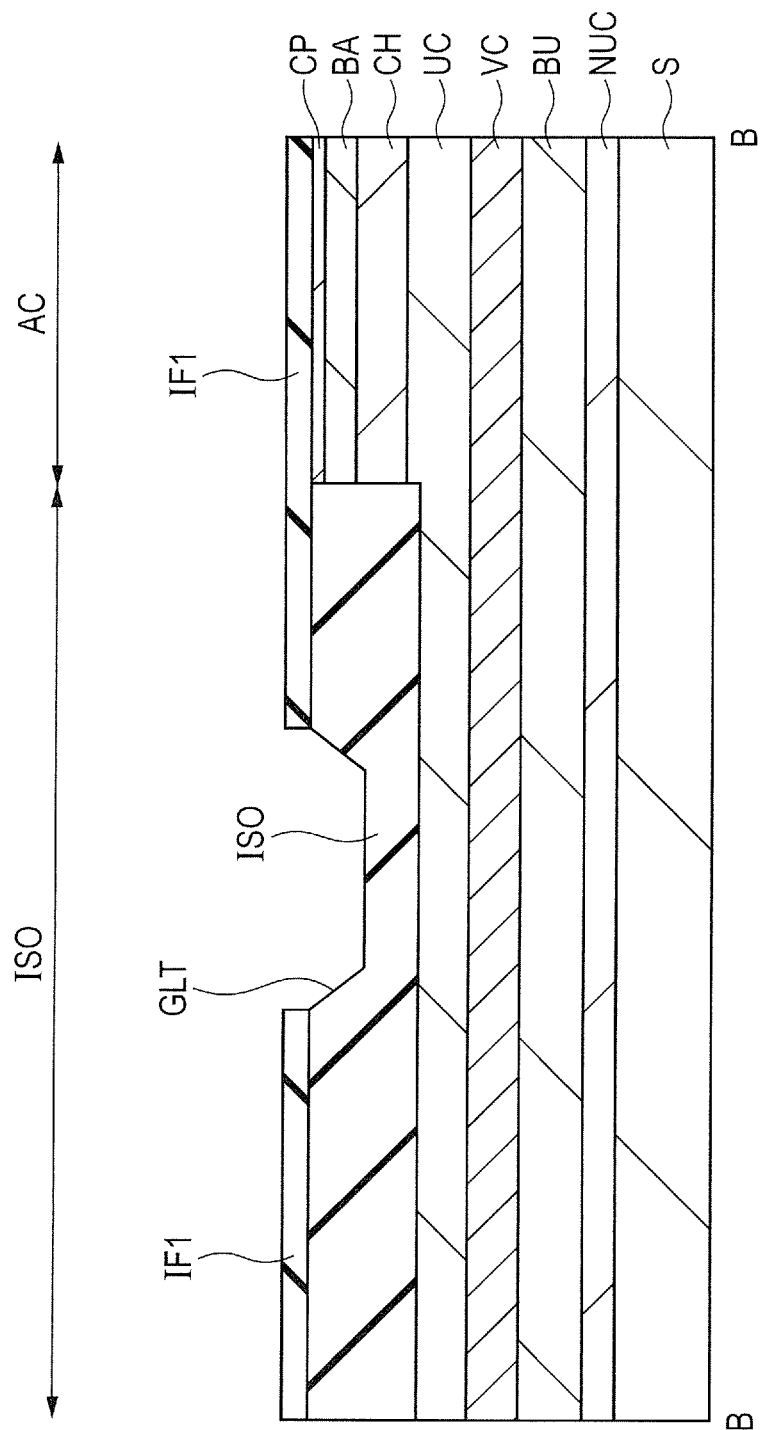
FIG. 10 is a sectional view illustrating the manufacturing process of the semiconductor device of the first embodiment, showing a step following FIG. 7.
Figure 11:
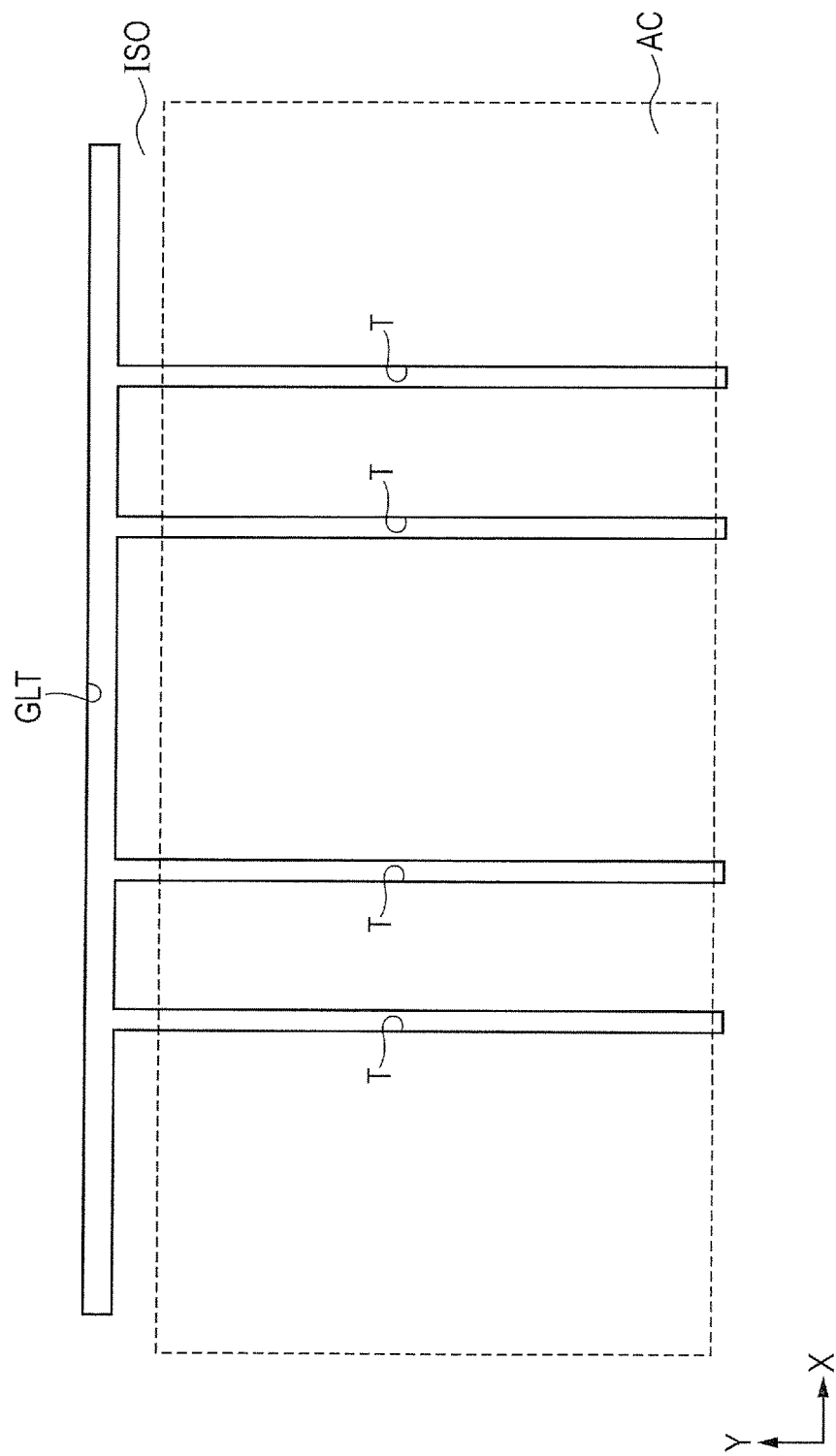
FIG. 11 is a plan view illustrating the manufacturing process of the semiconductor device of the first embodiment.

Subsequently, as illustrated in FIGS. 9 to 11, the insulating film IF1 is patterned using a photolithography technique and an etching technique. For example, an undepicted photoresist film is formed on the insulating film IF1, and the photoresist film in the formation region of the trench T is removed by a photolithography process. In other words, an undepicted photoresist film having an opening in the formation region of the trench T is formed on the insulating film IF1. Subsequently, the insulating film IF1 is etched with the photoresist film as a mask. When the silicon nitride film is used as the insulating film IF1, dry etching is performed using a dry etching gas containing a fluorine-based gas such as $SF_6$, for example. Subsequently, the photoresist film (not shown) is removed by the plasma stripping process or the like. In this way, the insulating film IF1 having the opening in the formation region of the trench T is formed on the cap layer CP.

Subsequently, the cap layer CP, the barrier layer BA, and the channel layer CHI are dry-etched with the insulating film IF1 as a mask to form the trench T that extends to a certain depth of the channel layer CH through the cap layer CP and the barrier layer B. A dry etching gas containing a chlorine-based gas such as $BCl_3$ is used as the etching gas, for example. Through this step, a trench GLT for the gate line GL is also formed in the device isolation region ISO (FIGS. 10 and 11).

Figure 12:
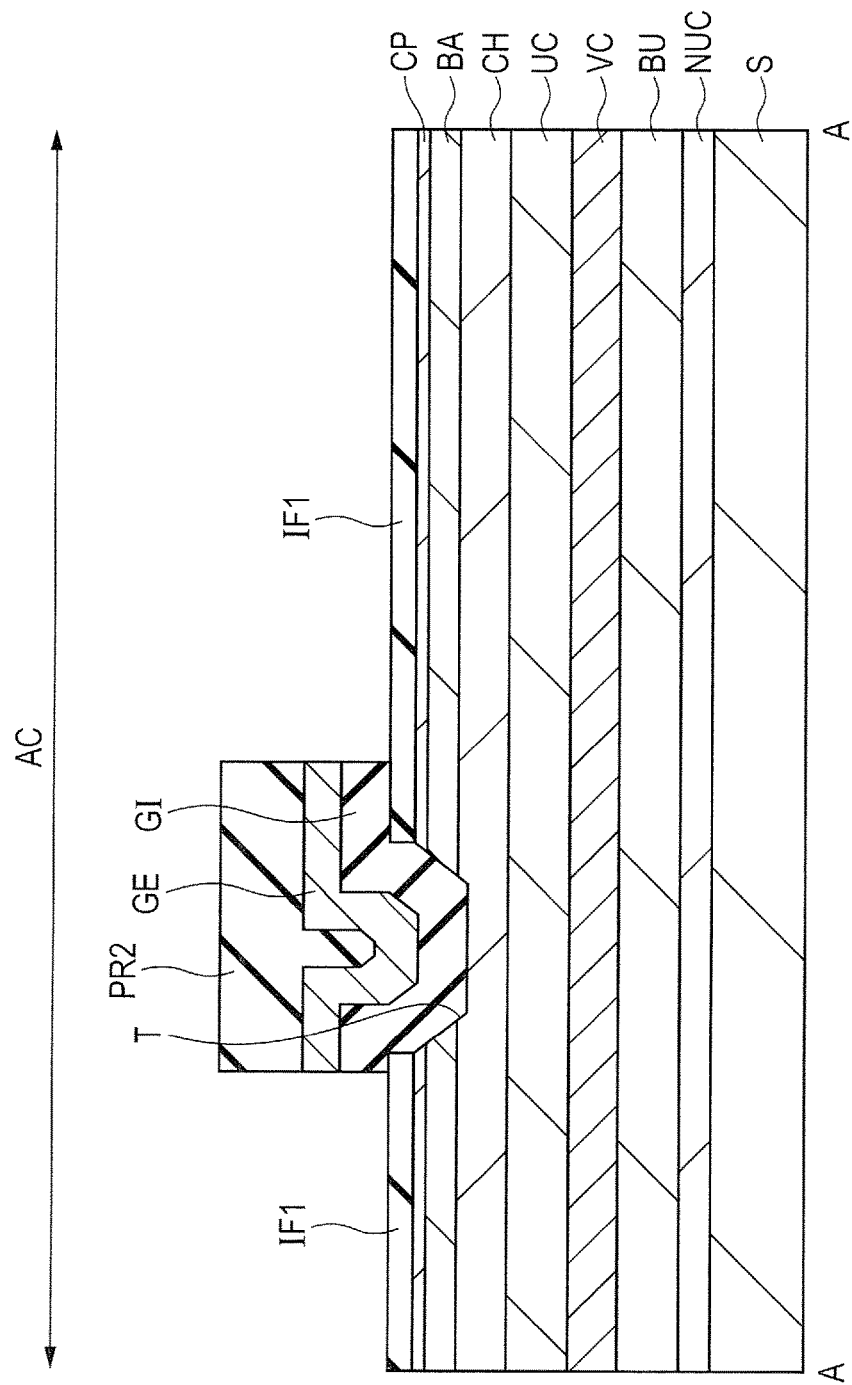
FIG. 12 is a sectional view illustrating the manufacturing process of the semiconductor device of the first embodiment, showing a step following FIG. 9.
Figure 13:
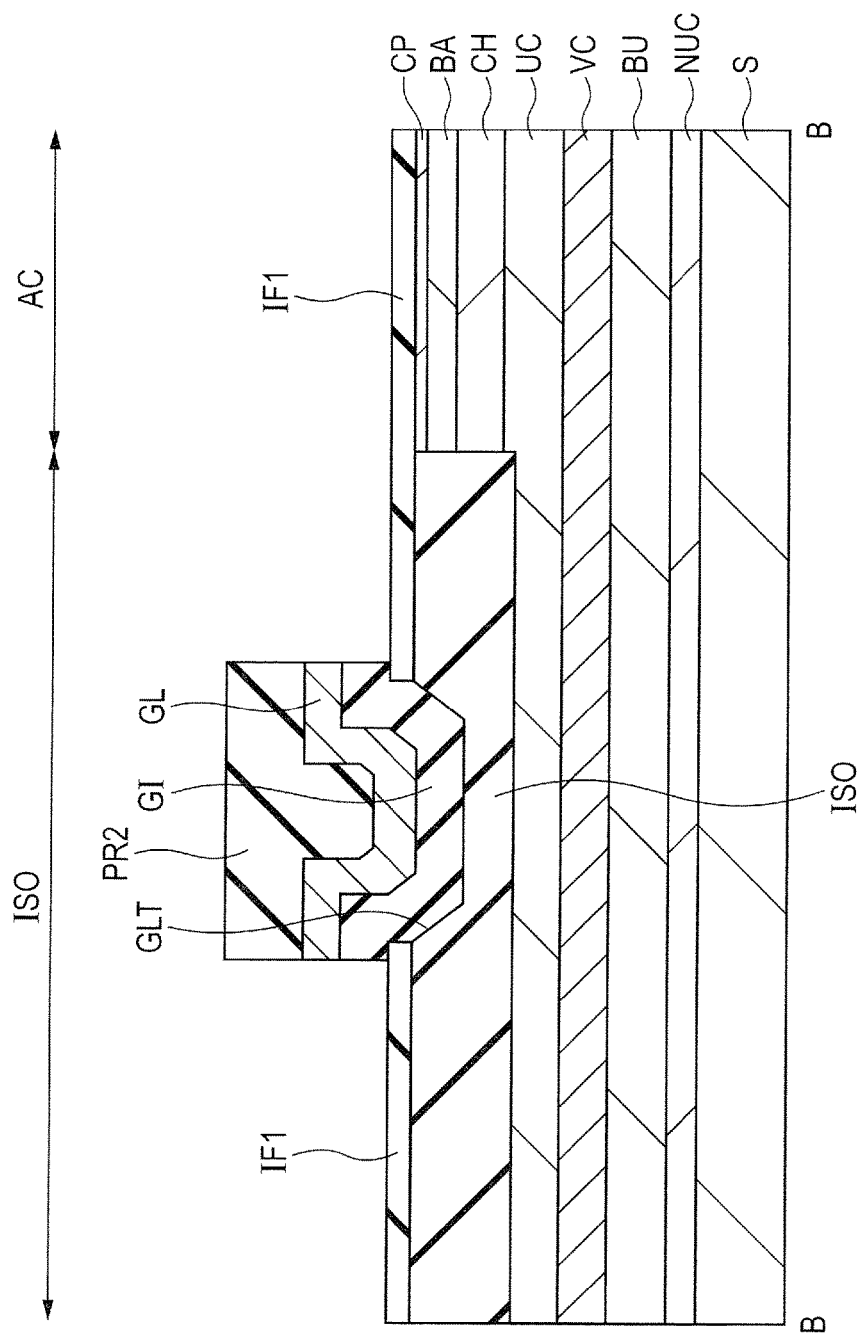
FIG. 13 is a sectional view illustrating the manufacturing process of the semiconductor device of the first embodiment, showing a step following FIG. 10.
Figure 14:
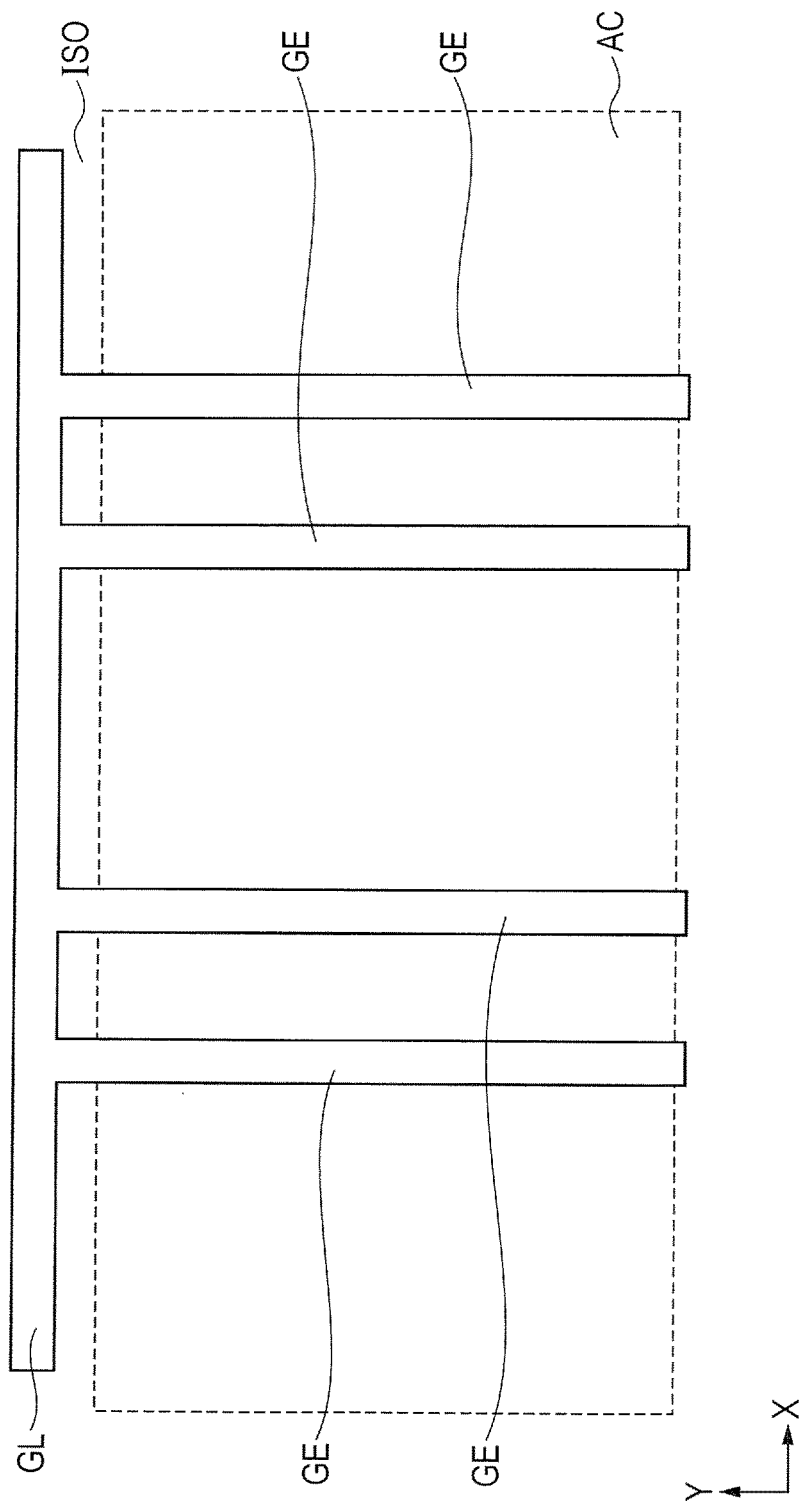
FIG. 14 is a plan view illustrating the manufacturing process of the semiconductor device of the first embodiment.

Subsequently, as illustrated in FIGS. 12 to 14, the gate electrode GE is formed on the insulating film IF1 including the inside of the trench T with the gate insulating film GI in between. For example, an aluminum oxide film is deposited as the gate insulating film GI on the insulating film IF1 including the inside of the trench T in a thickness of about 50 nm using an atomic layer deposition (ALD) process or the like.

The gate insulating film GI may include the aluminum oxide film, a silicon oxide film, and a high-dielectric-constant film having a dielectric constant larger than that of the silicon oxide film. The high-dielectric-constant film may include a silicon nitride (SiN) film and hafnium-based insulating films such as a hafnium oxide ($HfO_2$) film, a hafnium aluminate film, a hafnium oxynitride (HfON) film, a hafnium silicate (HfSiO) film, a hafnium silicon oxynitride (HfSiON) film, and a HfAlO film.

Subsequently, for example, a titanium nitride (TiN) film is deposited as a conductive film on the gate insulating film GI in a thickness of about 200 nm using a sputtering process or the like. Subsequently, a photoresist film PR2 is formed in a gate electrode formation region using a photolithography technique, and the TiN film is etched with the photoresist film PR2 as a mask to form the gate electrode GE. Through this etching, the aluminum oxide film under the TiN film may also be etched. For example, dry etching using a dry etching gas containing a chlorine-based gas such as $Cl_2$ is performed for processing of the TiN film, while dry etching using a dry etching gas containing a chlorine-based gas such as $BCl_3$ is performed for processing of the aluminum oxide film.

Through this etching, the gate electrode GE is patterned into a unidirectionally overhanging shape (toward the right side in FIG. 12, or toward a side closer to the drain electrode DE). Such an overhanging portion is referred to as field plate electrode section. The field plate electrode section is a partial region of the gate electrode GE that extends from an end of the trench T on a side close to the drain electrode DE toward the drain electrode DE.

Figure 15:
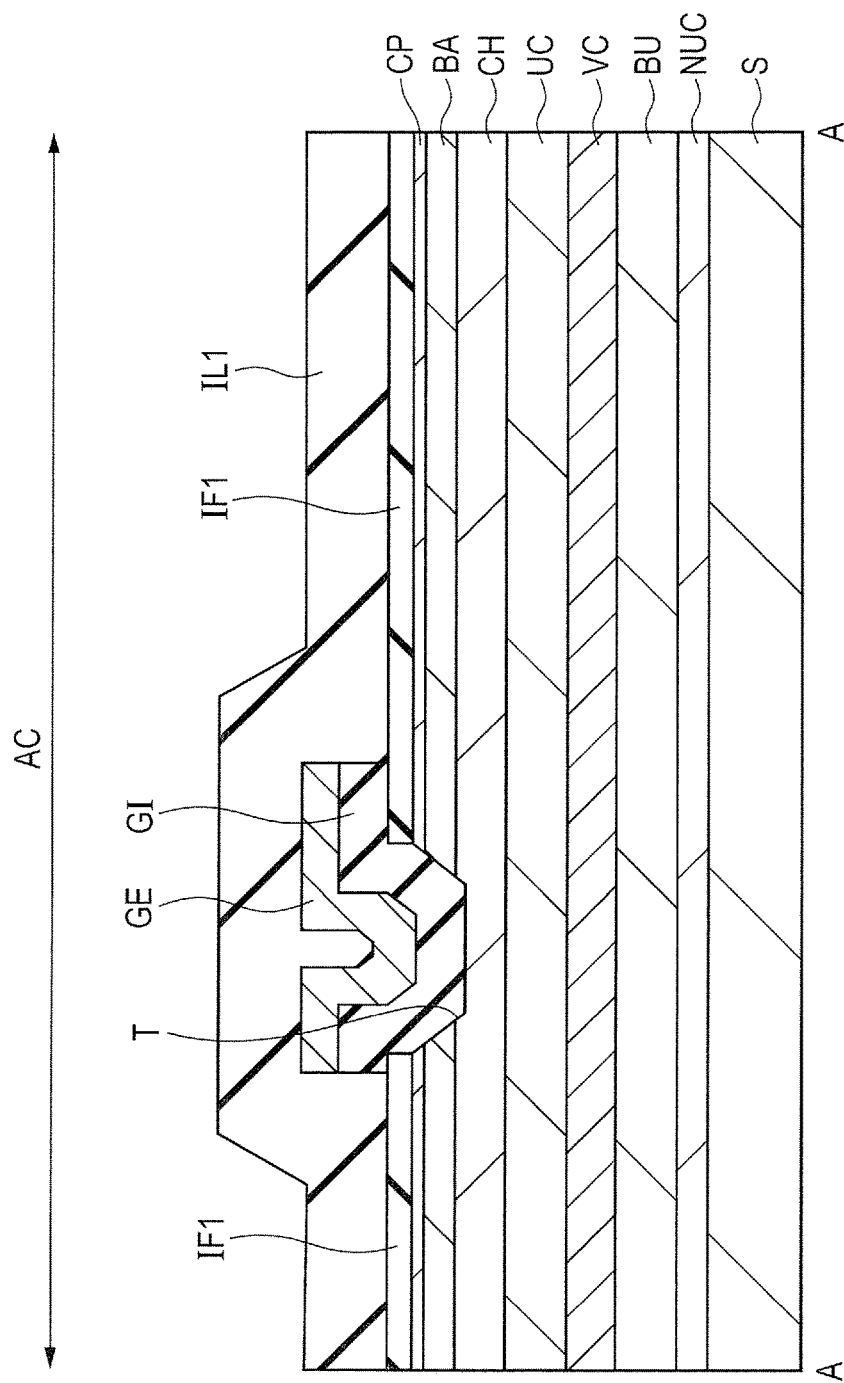
FIG. 15 is a sectional view illustrating the manufacturing process of the semiconductor device of the first embodiment, showing a step following FIG. 12.
Figure 16:
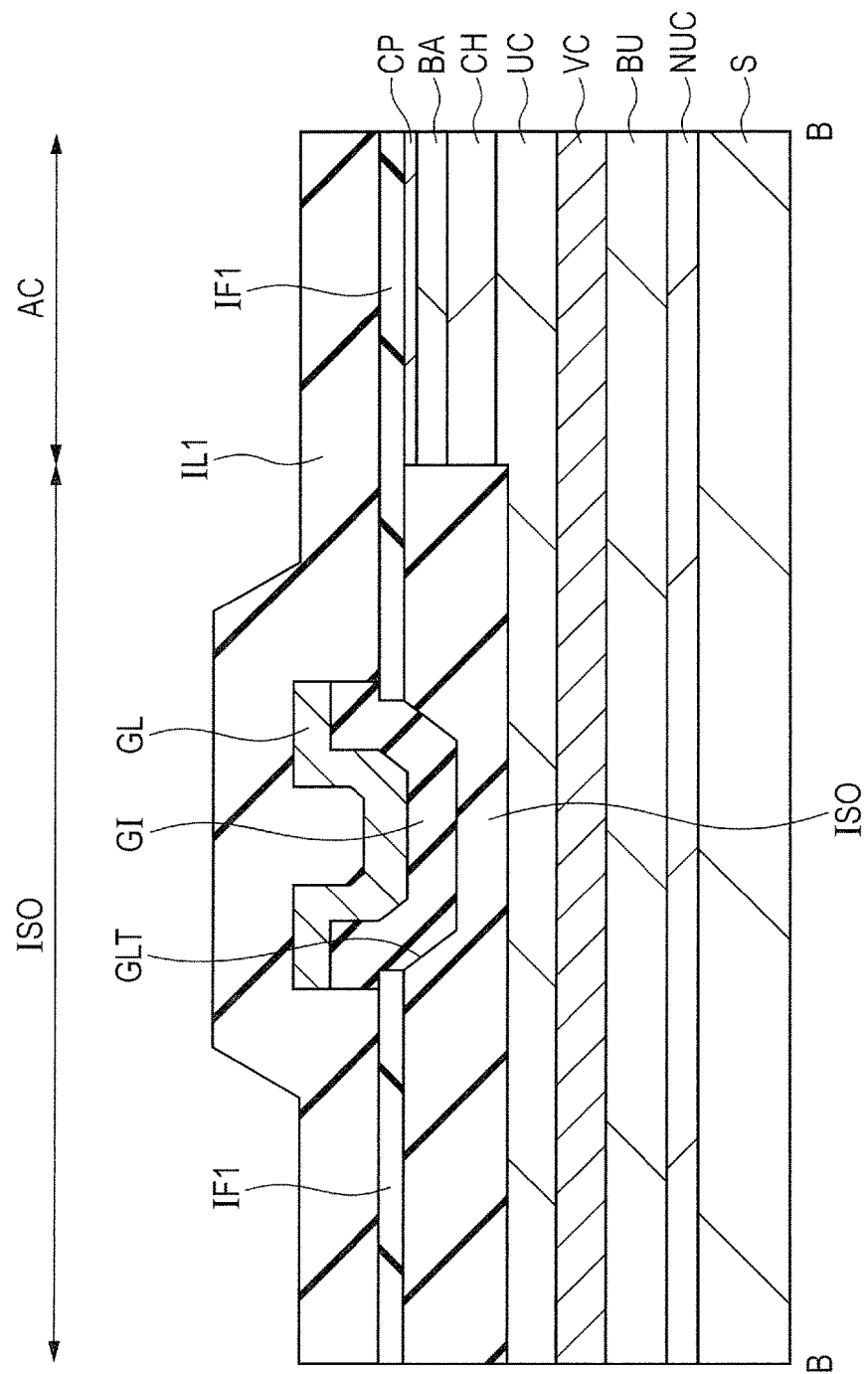
FIG. 16 is a sectional view illustrating the manufacturing process of the semiconductor device of the first embodiment, showing a step following FIG. 13.
Figure 17:
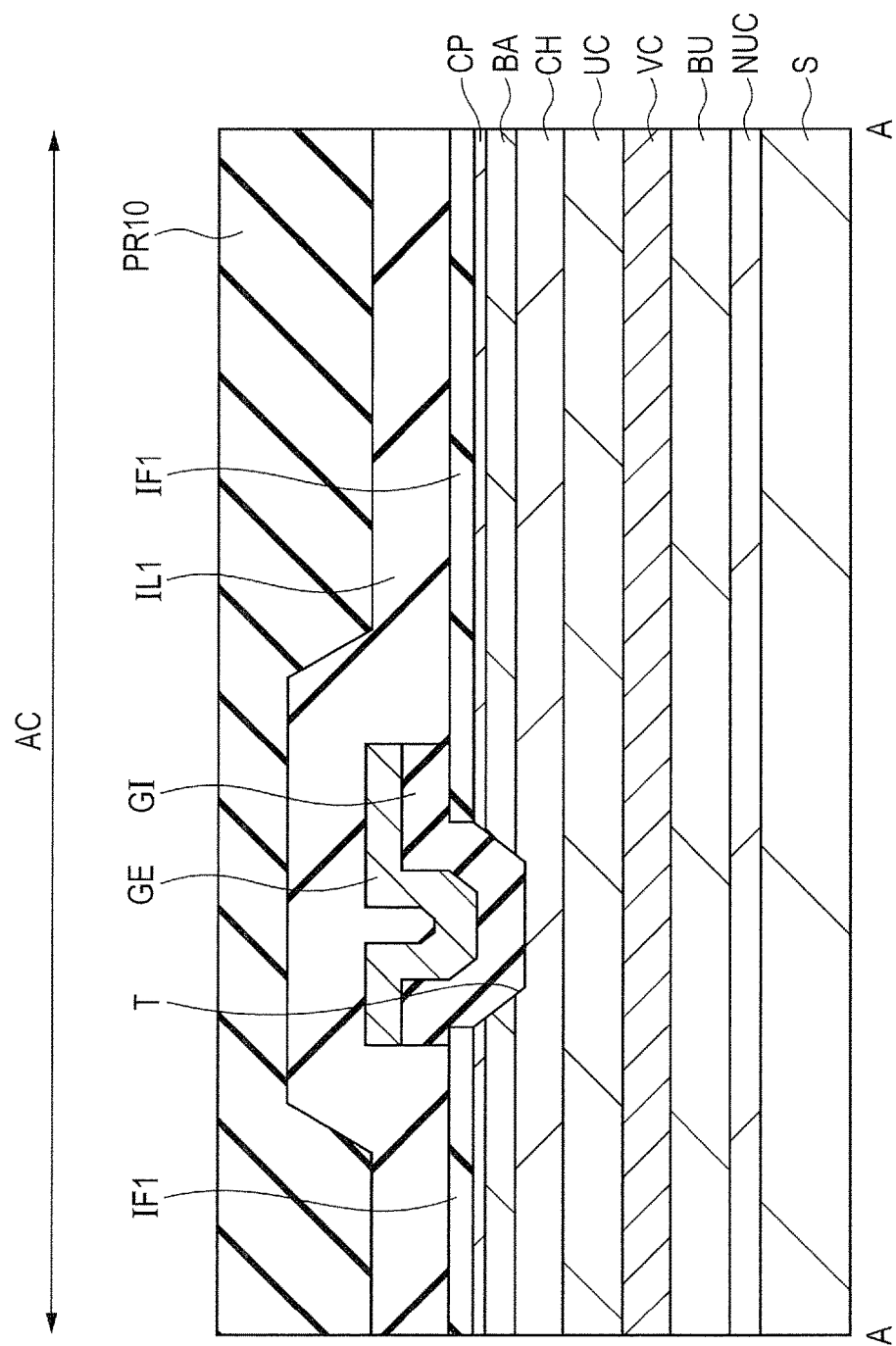
FIG. 17 is a sectional view illustrating the manufacturing process of the semiconductor device of the first embodiment, showing a step following FIG. 15.

Subsequently, as illustrated in FIGS. 15 and 16, for example, a silicon oxide film is deposited about 2000 nm as the interlayer insulating film IL1 on the insulating film IF1 including the surface of the gate electrode GE using a PECVD process or the like.

Subsequently, as illustrated in FIGS. 17 to 20, the through-hole TH is formed through the interlayer insulating film IL1 and the insulating film IF1 using a photolithography technique and an etching technique. The through-hole TH is formed in a source pad formation region. The voltage clamp layer VC is exposed from the bottom of the through-hole TH. The impurity region IR is formed in the voltage clamp layer VC exposed from the bottom of the through-hole TH. Furthermore, after the conductive film CF1 is formed, the conductive film CF1 in a region other than a portion of the through-hole TH and the periphery of the through-hole TH is removed using a photolithography technique and an etching technique.

For example, a photoresist film PR10 having an opening corresponding to a through-hole formation region is formed. Subsequently, the interlayer insulating film IL1, the insulating film IF1, the device isolation region ISO, the channel base layer UC, and the voltage clamp layer VC are each partially etched with the photoresist film PR10 as a mask to form the through-hole TH. In other words, there is formed the through-hole TH that extends to a certain depth of the voltage clamp layer VC through the interlayer insulating film IL1, the insulating film IF1, the device isolation region ISO, and the channel base layer UC.

Figure 18:
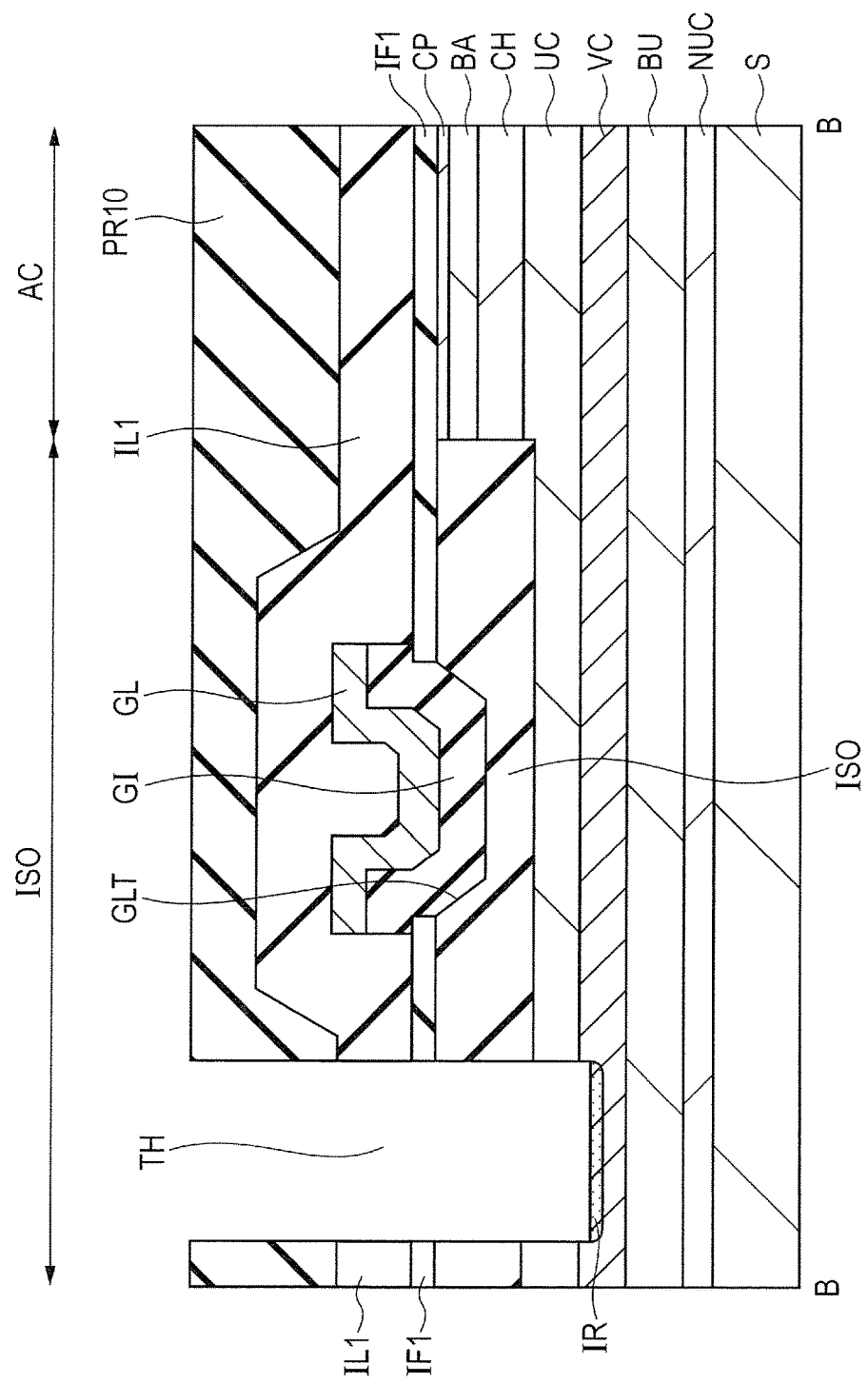
FIG. 18 is a sectional view illustrating the manufacturing process of the semiconductor device of the first embodiment, showing a step following FIG. 16.
Figure 19:
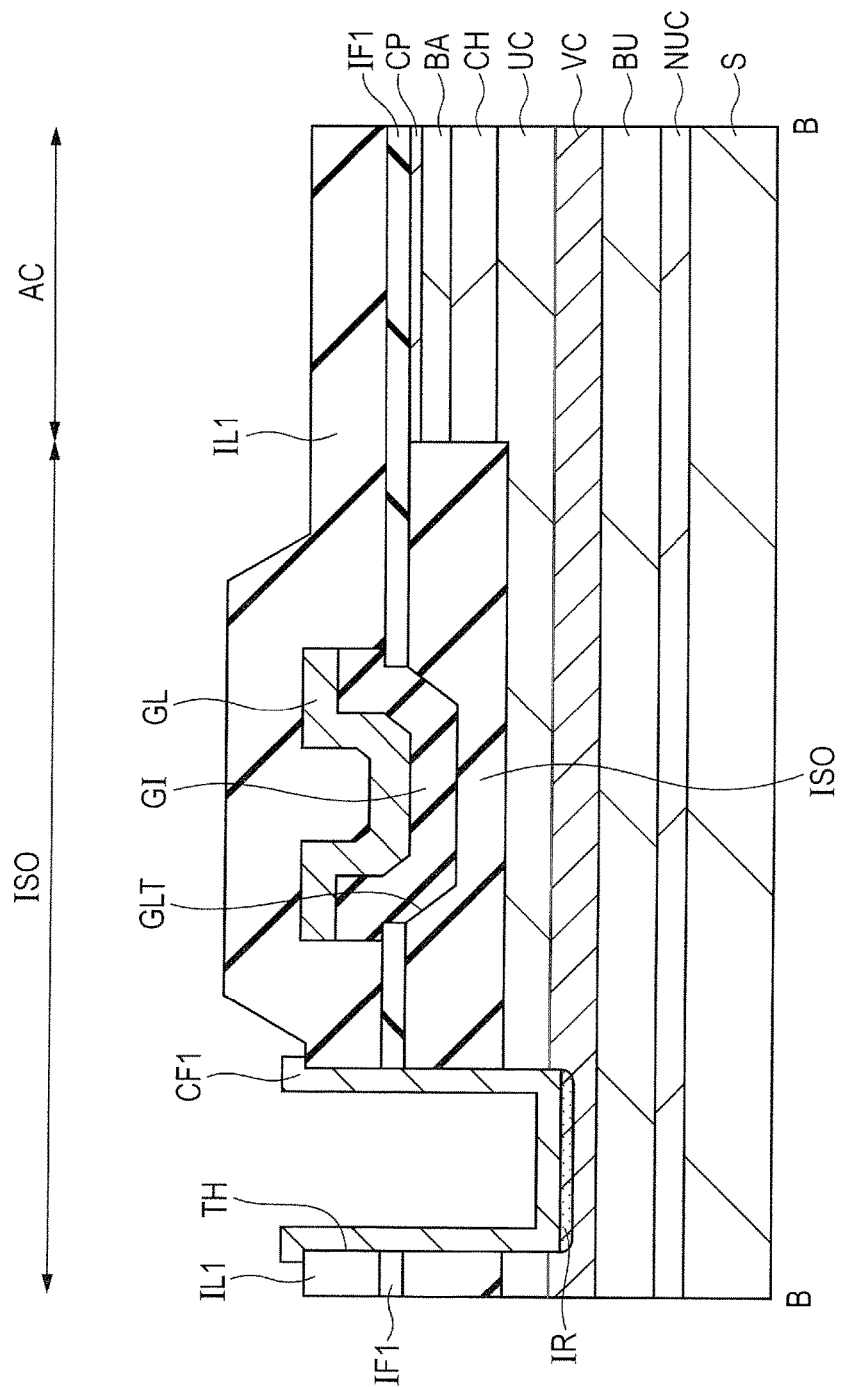
FIG. 19 is a sectional view illustrating the manufacturing process of the semiconductor device of the first embodiment, showing a step following FIG. 18.
Figure 20:
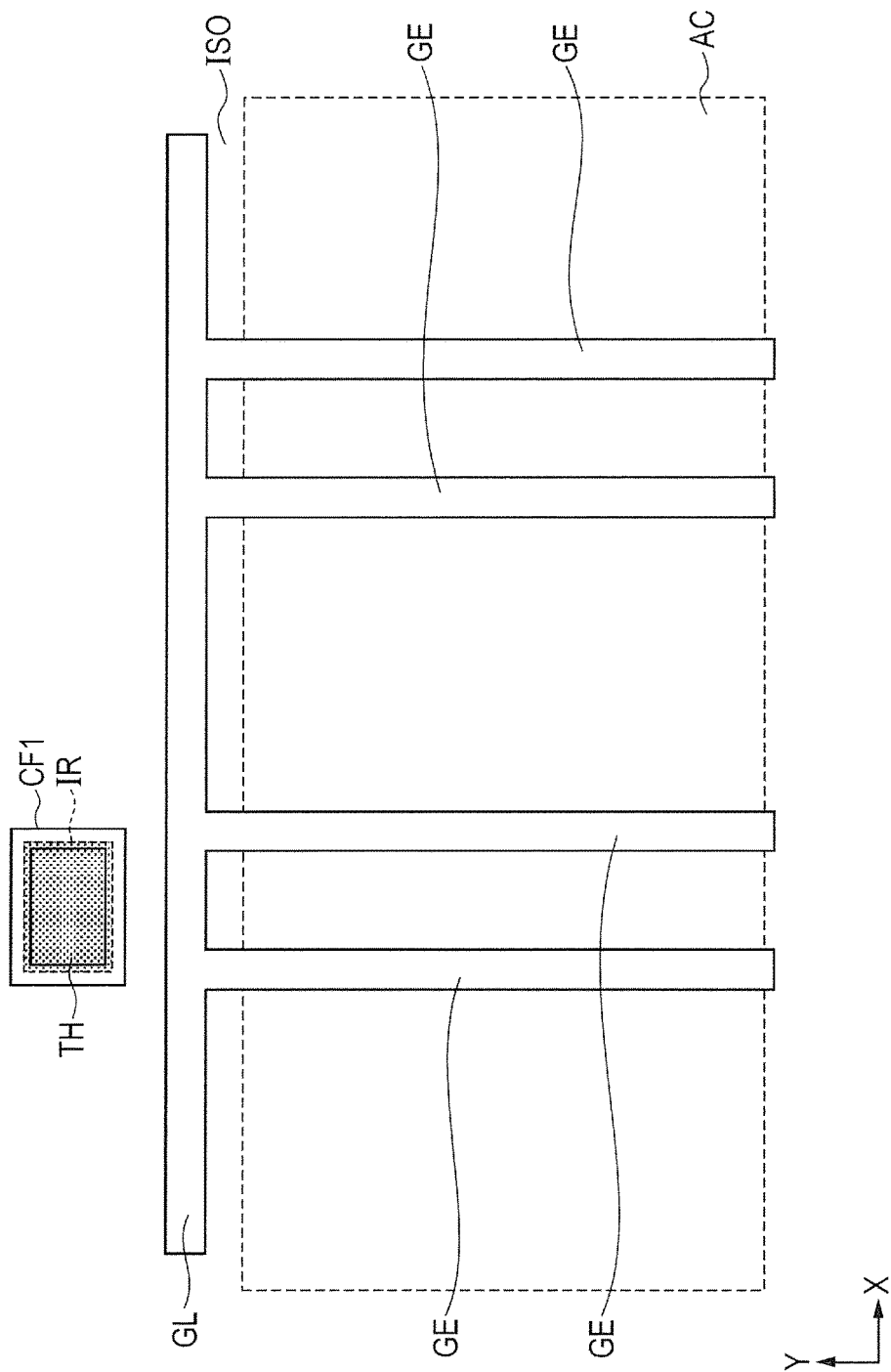
FIG. 20 is a plan view illustrating the manufacturing process of the semiconductor device of the first embodiment.

As described above, the etching is performed such that the bottom of the through-hole TH is located within the voltage clamp layer VC and below the bottom of the device isolation region ISO (FIG. 18).

When a silicon oxide film is used as the interlayer insulating film IL1 while a silicon nitride film is used as the insulating film IF1, such films are first removed by dry etching using a dry etching gas containing a fluorine-based gas such as $SF_6$, for example. Subsequently, the device isolation region ISO, the channel base layer (AlGaN layer) UC, and a certain depth of the voltage clamp layer (p-GaN layer) VC are removed by dry etching using a dry etching gas containing a chlorine-based gas such as $BCl_3$, for example. Through the dry etching, the voltage clamp layer VC is exposed from the bottom of the through-hole TH.

Subsequently, an impurity (in this exemplary case, carbon (C)) having an acceptor level deeper than that of the p-type impurity (in this exemplary case, Mg) contained in the voltage clamp layer VC is ion-implanted with the photoresist film PR10 as a mask. For example, $1\times10^{14}$ (1E14) $cm^{-2}$ of C ions are implanted at an implantation energy of 15 keV. Consequently, the impurity region IR can be formed in the voltage clamp layer VC under the bottom of the through-hole TH. A preferred concentration range of the impurity in the impurity region IR is $1\times10^{18}$ (1E18) $cm^{-3}$ to $2\times10^{19}$ (1E19) $cm^{-3}$. Subsequently, the photoresist film PR10 is removed.

Subsequently, the conductive film CF1 is formed on the interlayer insulating film IL1 including the inside of the through-hole TH. For example, a Ni film is deposited about 50 nm as the conductive film CF1 by a magnetron sputter process. Subsequently, an undepicted photoresist film having an opening slightly larger than the through-hole formation region is formed, and the conductive film CF1 is etched with the photoresist film as a mask. For example, the conductive film CF1 is wet-etched by a solution containing HCl. This results in formation of the conductive film CF1 (also referred to as through-hole electrode or through-hole base electrode) covering the sidewalls and the bottom of the through-hole TH and the interlayer insulating film IL1 in the periphery of the through-hole TH (see FIGS. 19 and 20). Subsequently, the photoresist film is removed.

Figure 21:
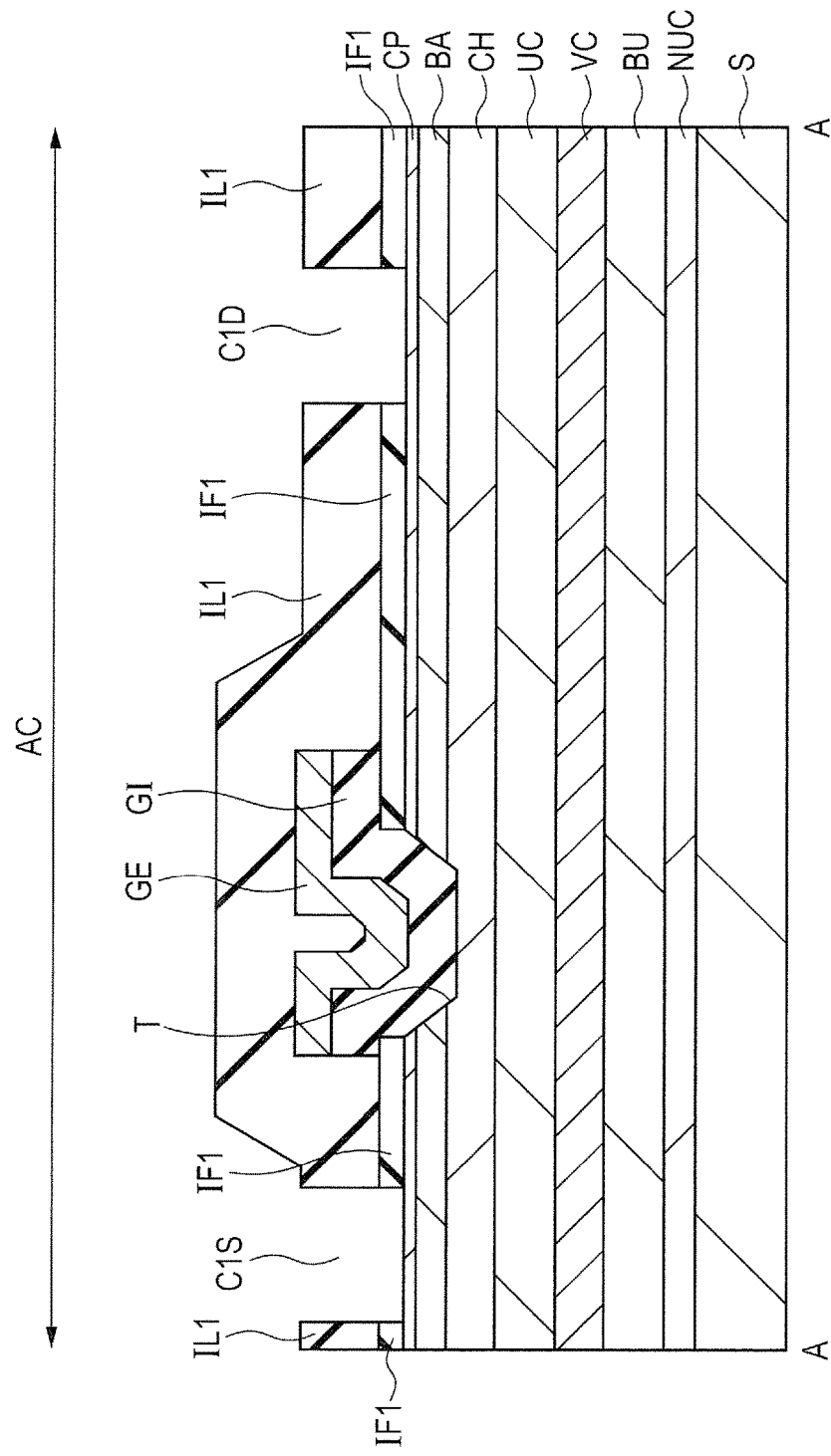
FIG. 21 is a sectional view illustrating the manufacturing process of the semiconductor device of the first embodiment, showing a step following FIG. 17.

Subsequently, as illustrated in FIG. 21, the contact holes C1S and C1D are each formed through the interlayer insulating film IL1 and the insulating film IF1 using a photolithography technique and an etching technique. The contact holes C1S and C1D are formed in the source electrode formation region and the drain electrode formation region, respectively.

For example, an undepicted photoresist film having an opening in each of a source electrode coupling region and a drain electrode coupling region is formed on the interlayer insulating film IL1. Subsequently, the interlayer insulating film IL1 and the insulating film IF1 are etched with the photoresist film as a mask, so that the contact holes C1S and C1D are formed.

When a silicon oxide film is used as the interlayer insulating film IL1 while a silicon nitride film is used as the insulating film IF1, such films are dry-etched using a dry etching gas containing a fluorine-based gas such as $SF_6$, for example. The cap layer CP is exposed from the bottom of each of the contact holes C1S and C1D formed in the above step.

Figure 22:
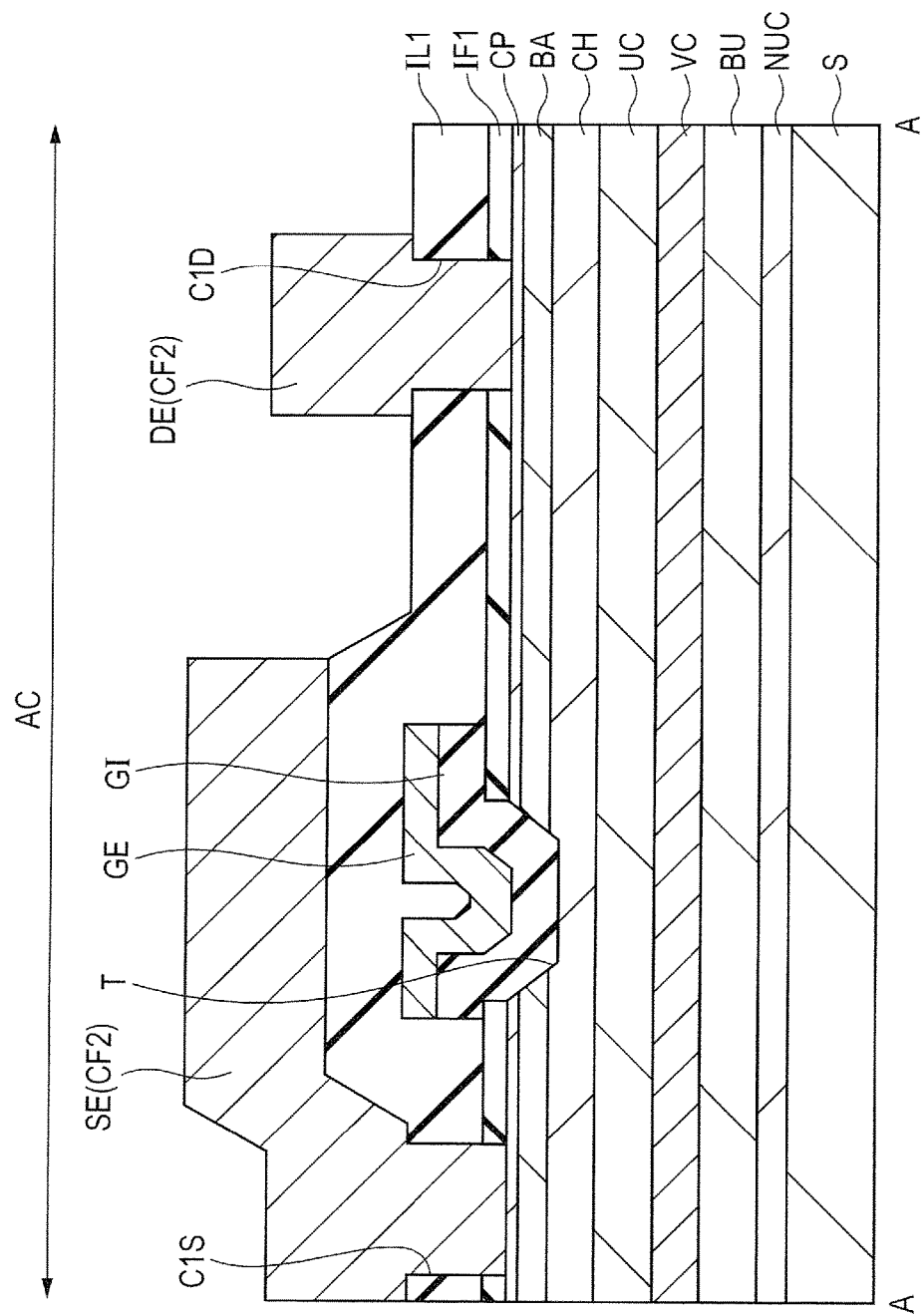
FIG. 22 is a sectional view illustrating the manufacturing process of the semiconductor device of the first embodiment, showing a step following FIG. 21.
Figure 23:
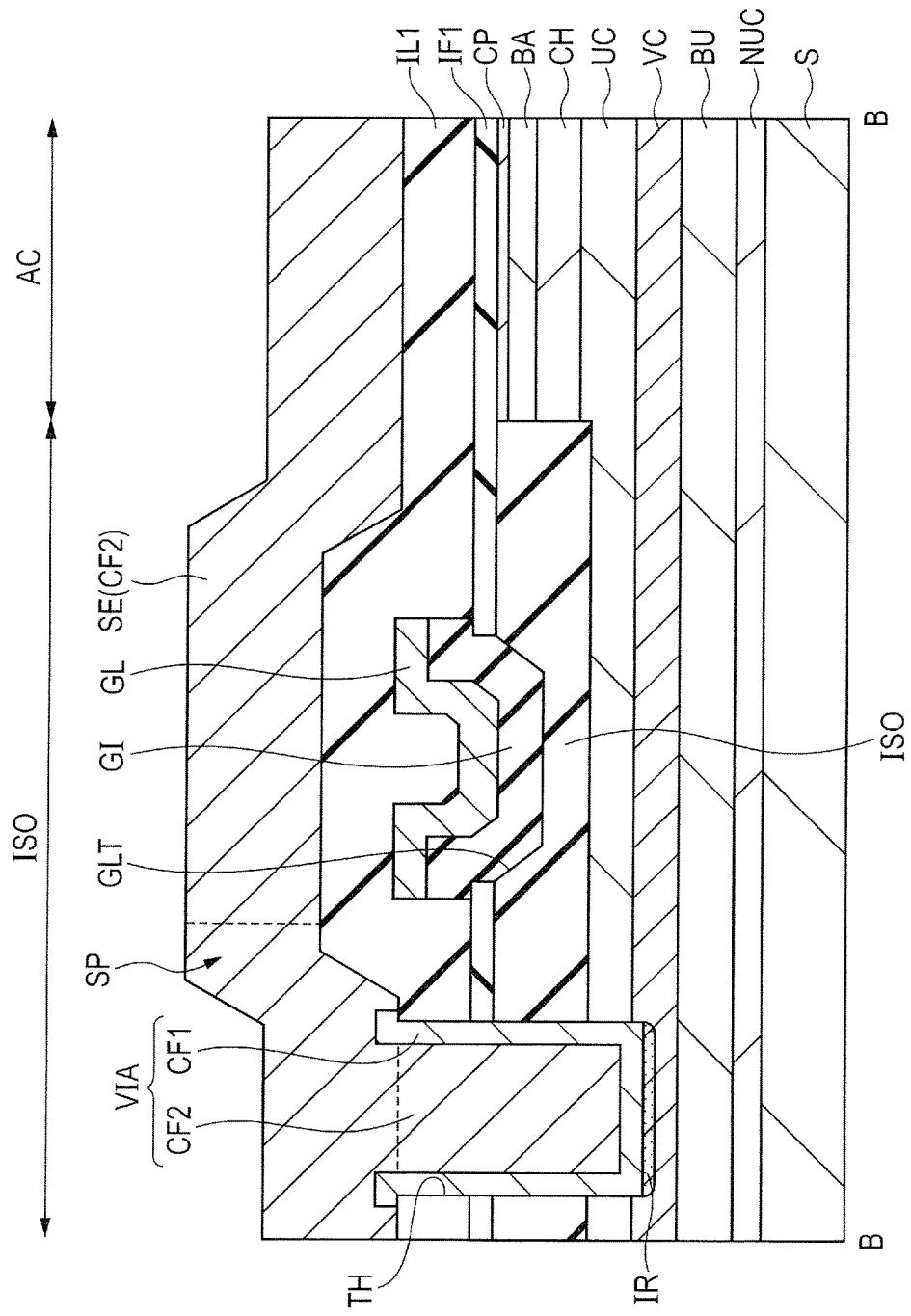
FIG. 23 is a sectional view illustrating the manufacturing process of the semiconductor device of the first embodiment, showing a step following FIG. 19.
Figure 24:
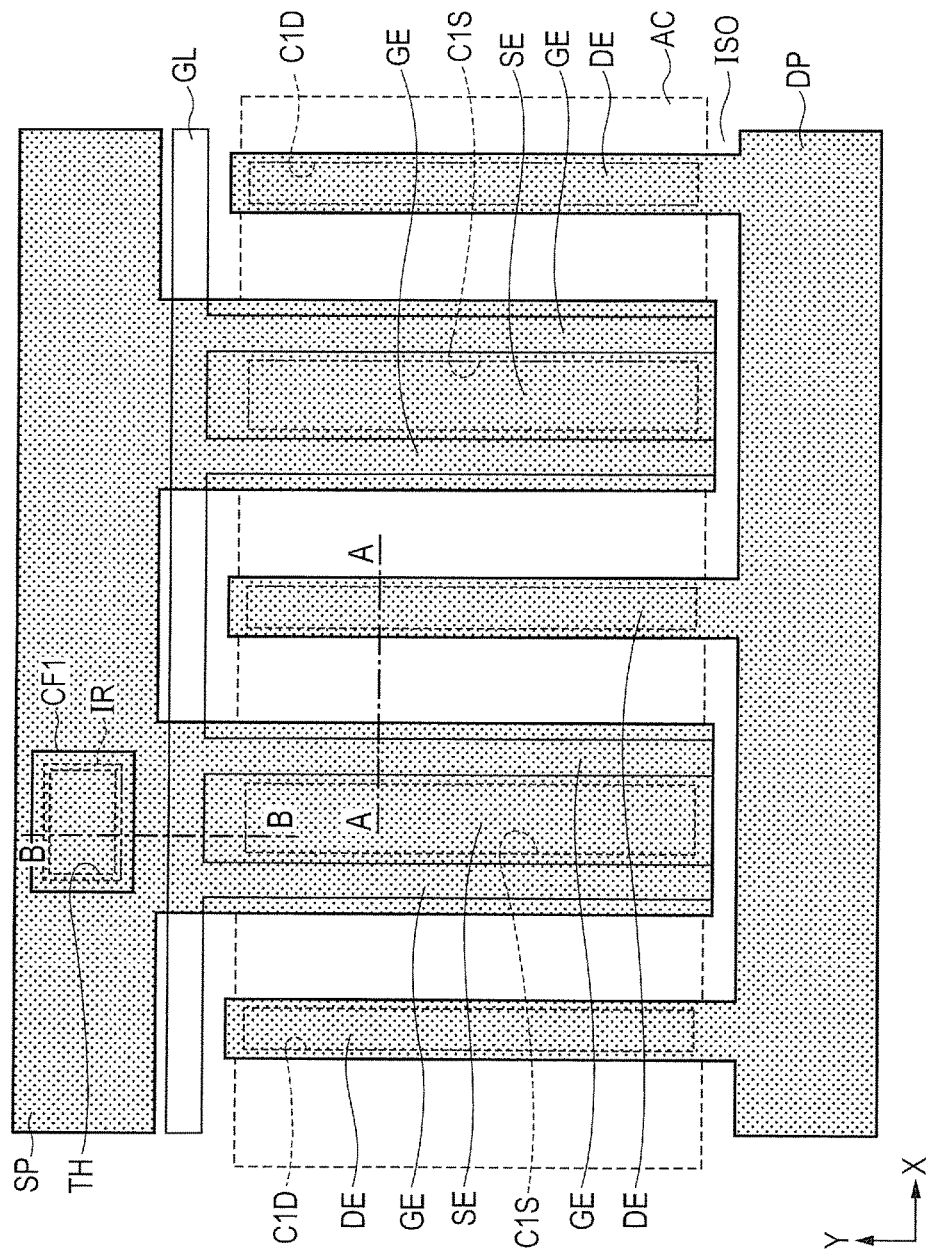
FIG. 24 is a plan view illustrating the manufacturing process of the semiconductor device of the first embodiment.

Subsequently, as illustrated in FIGS. 22 to 24, the source electrode SE and the drain electrode DE are formed on the cap layer CP on the two respective sides of the gate electrode GE. The source pad SP is formed at the end of the source electrode SE, and the drain pad DP is formed at the end of the drain electrode DE. The coupling VIA is formed under the source pad SP (FIG. 23).

For example, the conductive film CF2 is formed on the interlayer insulating film IL1 including the insides of the contact holes C1S and C1D and the inside of the through-hole TH (the surface of the conductive film CF1). For example, an Al film is formed as the conductive film CF2 using a sputtering process. The Al film has a thickness of about 500 to 1000 nm, for example.

Subsequently, an undepicted photoresist film is formed in formation regions of the source electrode SE, the drain electrode DE, the source pad SP, and the drain pad DP using a photolithography technique, and the conductive film CF2 is etched with the photoresist film as a mask. Dry etching is performed using a dry etching gas containing a chlorine-based gas such as $BCl_3$, for example. Through such a step, the coupling VIA including the through-hole TH filled with the conductive films CF1 and CF2 is formed, and the source electrode SE, the drain electrode DE, the source pad SP, and the drain pad DP are also formed. As illustrated in FIG. 24, each of the source electrode SE and the drain electrode DE has a planar shape being a rectangular shape (linable shape) having a long side in the Y direction. As illustrated in FIG. 24, each of the source pad SP and the drain pad DP has a planar shape being a rectangular shape (linable shape) having a long side in the X direction. The source pad SP is disposed so as to couple the plurality of source electrodes SE to one another. The drain pad DP is disposed so as to couple the drain electrodes DE to one another.

The through-hole TH is located under the source pad SP, and the coupling VIA (CF1 and CF2) is located in the through-hole TH. The impurity region IR is located under the coupling VIA, i.e., under the conductive film CF1. The source pad SP is electrically coupled to the voltage clamp layer VC via the coupling VIA and the impurity region IR (FIGS. 23 and 24).

Subsequently, the protective film (also referred to as insulating film, cover film, or surface protective film) PRO is formed on the interlayer insulating film IL1 including the surfaces of the source electrode SE, the drain electrode DE, the source pad SP, and the drain pad DP. For example, a silicon oxynitride (SiON) film is deposited as the protective film PRO on the interlayer insulating film IL1 by a CVD process or the like (see FIGS. 3 and 4).

The semiconductor device of the first embodiment can be formed through the above-described steps. Such steps are merely shown as an example, and the semiconductor device of the first embodiment may be manufactured through other steps.

Thus, in the first embodiment, the voltage clamp layer VC as a conductive layer is provided between the buffer layer BU and the channel layer CH and is coupled to the source electrode SE; hence, variations in characteristics of the semiconductor device can be decreased. Specifically, the voltage clamp layer VC prevents the channel layer CH from being affected by a variation in potential due to a variation in charge amount of a layer (for example, the buffer layer BU) below the voltage clamp layer VC. This makes it possible to decrease variations in characteristics such as threshold potential and on resistance (voltage clamp effect).

In the first embodiment, since a portion of the voltage clamp layer VC under the bottom of the through-hole TH is doped with the impurity having the deep acceptor level so that the portion is formed into the impurity region (also referred to as hopping conduction region) IR, a good contact can be provided between the coupling VIA and the voltage clamp layer VC. In particular, even if the p-type impurity concentration in the voltage clamp layer VC is controlled to be relatively low (for example, about $1 \times 10^{18}$ (1E18) cm$^{-3}$) to increase a drain breakdown voltage, a good contact can be provided between the coupling VIA and the voltage clamp layer VC.

FIGS. 25A to 25C are diagrams illustrating a band structure in the vicinity of the bottom of the through-hole TH and acceptor levels of various elements. In the drawings, ΦM represents a work function of a metal (for example, Ni), Ec represents an energy level of a conduction band, Ev represents an energy level of a valence band, and Ef represents a Fermi level. X represents the electron affinity of GaN.

When an impurity (in this exemplary case, C) having an acceptor level deeper than the p-type impurity (in this exemplary case, Mg) contained in the voltage clamp layer VC does not exist as illustrated in FIG. 25A, holes must surmount a high barrier, which exponentially decreases the probability of surmounting the barrier for holes. In contrast, when an impurity (in this exemplary case, C) having an acceptor level deeper than the p-type impurity (in this exemplary case, Mg) contained in the voltage clamp layer VC exists as illustrated in FIG. 25B, hole surmounts a low barrier in two stages, which exponentially increases the probability of surmounting the barrier for holes. This results in extremely high probability compared with the probability of directly reaching the Mg level.

Specifically, when the impurity (in this exemplary case, C) having the acceptor level deeper than the p-type impurity (in this exemplary case, Mg) contained in the voltage clamp layer VC exists in the vicinity of the bottom of the through-hole TH as illustrated in FIG. 25B, since C has a low barrier height for holes compared with Mg, a hole reaches the impurity level of adjacent C at a high probability compared with the case of directly reaching the impurity level of Mg. Furthermore, the hole reaching the impurity level of C can reach the impurity level of adjacent Mg at a high probability compared with the case of directly reaching the impurity level of Mg from the electrode. Although a hole thus surmounts the barrier in two stages, since the probability of surmounting the barrier in each stage extremely increases, the total probability is extremely higher than the probability of directly reaching the Mg level. Such electric conduction using hopping between discontinuous levels is called hopping conduction h. In this way, implanting an impurity having a deep acceptor level causes hopping conduction h, leading to a reduction in contact resistance.

FIG. 25C illustrates acceptor levels of various elements. FIG. 25C shows that Zn (0.21 to 0.34 eV), Hg (0.41 eV), Cd (0.55 eV), Be (0.7 eV), Li (0.75 eV), or C (0.89 eV) is preferably used as the impurity having the deep acceptor level.

In particular, it is preferred that Mg is used as the p-type impurity contained in the voltage clamp layer VC, and Zn (0.21 to 0.34 eV), Cd (0.55 eV), Be (0.7 eV), or C (0.89 eV) is used as the impurity having an acceptor level deeper than that of Mg. FIG. 25C shows a value of the acceptor level of any of impurity elements other than Ga, which are each introduced into a Ga site of a GaN crystal, and a value of the acceptor level of Ga that is introduced into an N site thereof. In the diagram, Ga (vacancy) indicates a value of the acceptor level when Ga is released from GaN, or when N has a dangling bond.

In the first embodiment, since the coupling VIA in the through-hole TH is disposed within the device isolation region ISO outside of the active region AC allowing electron conduction and below the formation region of the source pad SP, small size and a high degree of integration of the semiconductor element can be achieved. In addition, since a large active region AC allowing electron conduction can be provided, on resistance per area can be reduced.

Second Embodiment

Although the coupling VIA is provided in the device isolation region ISO in the first embodiment, the coupling VIA may be provided in the active region AC. For example, the coupling VIA is provided under the source electrode SE in a second embodiment.

A semiconductor device of the second embodiment is now described in detail with reference to the accompanying drawings.

Description of Structure

Figure 26:
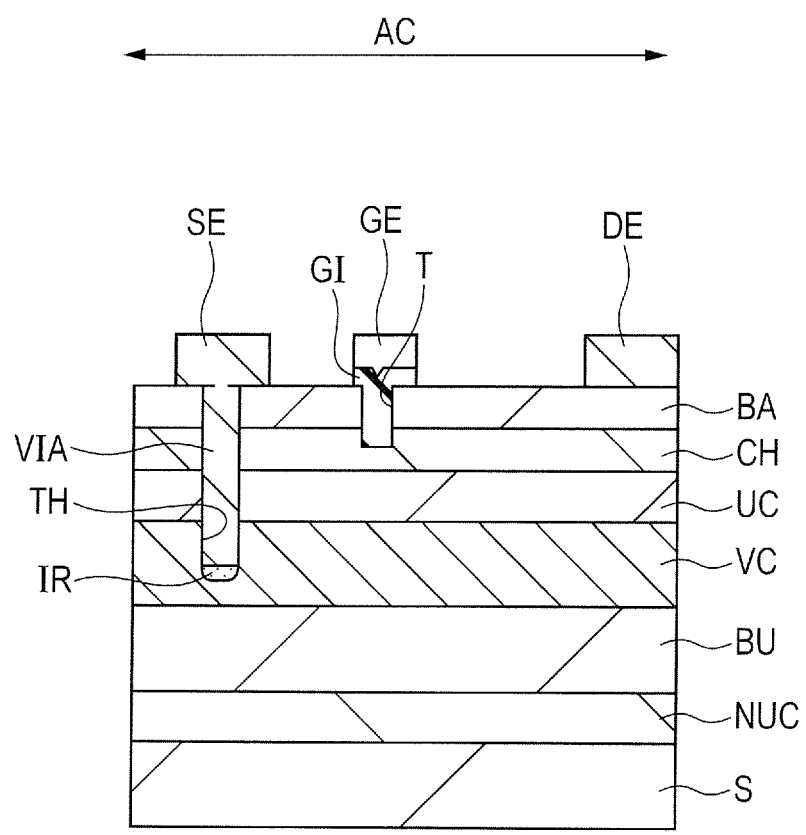
FIG. 26 is a sectional view schematically illustrating a configuration of a semiconductor device of a second embodiment.

FIG. 26 is a sectional view schematically illustrating a configuration of the semiconductor device of the second embodiment. The semiconductor device (semiconductor element) of the second embodiment is a MIS field effect transistor including a nitride semiconductor. The semiconductor device can be used as a power transistor of a high electron mobility transistor (HEMT) type. The semiconductor device of the second embodiment is what is called a recess-gate semiconductor device.

In the semiconductor device of the second embodiment, as with the first embodiment, a nucleation layer NUC, a buffer layer BU, a voltage clamp layer VC, a channel base layer UC, a channel layer (also referred to as electron traveling layer) CH, and a barrier layer BA are provided in this order on a substrate S. The nucleation layer NUC includes a nitride semiconductor layer. The buffer layer BU includes one or more nitride semiconductor layers each including a nitride semiconductor doped with an impurity forming a deep level. In this exemplary case, the buffer layer BU includes a superlattice structure including a plurality of nitride semiconductor layers. The voltage clamp layer VC includes a nitride semiconductor layer including a nitride semiconductor doped with a p-type impurity, and is conductive. The channel base layer UC includes a nitride semiconductor layer having an electron affinity smaller than that of the channel layer CH. The channel layer CH includes a nitride semiconductor layer having an electron affinity larger than that of the channel base layer UC. The barrier layer BA includes a nitride semiconductor layer having an electron affinity that is smaller than that of the channel layer CH and than that of the channel base layer UC. An undepicted insulating film is provided on the barrier layer BA. A cap layer may be provided between the insulating film (protective film) and the barrier layer BA. The cap layer preferably includes a nitride semiconductor layer having an electron affinity larger than that of the barrier layer BA.

As with the first embodiment, the MISFET of the second embodiment includes the channel layer CH, a gate insulating film GI on the channel layer CH, a gate electrode GE on the gate insulating film GI, and a source electrode SE and a drain electrode DE on the barrier layer BA on the two respective sides of the gate electrode GE. The MISFET is provided in an active region AC divided by a device isolation region ISO. The gate electrode GE is provided on the gate insulating film GI within a trench T that extends to a certain depth of the channel layer CH through the barrier layer BA.

In the second embodiment, a coupling (also referred to as via) VIA, which extends through the barrier layer BA, the channel layer CH, and the channel base layer UC to the further underlying voltage clamp layer VC, and the channel base layer UC, is provided under the source electrode SE in the active region AC. The coupling VIA is electrically coupled to the source electrode SE. In the second embodiment, an impurity region IR is provided under the coupling VIA. The impurity region IR contains an impurity (element, dopant) having an acceptor level deeper than that of the p-type impurity contained in the voltage clamp layer VC.

The voltage clamp layer VC is thus provided and coupled to the source electrode SE, thereby variations in characteristics such as threshold potential and on resistance can be decreased as described in detail in the first embodiment. In addition, since the coupling VIA is disposed in the active region AC allowing electron conduction, the voltage can be further effectively clamped.

The impurity region IR is provided under the coupling VIA, thereby a good contact can be provided between, the coupling VIA and the voltage clamp layer VC due to hopping conduction via the impurity having the deep acceptor level in the impurity region IR as described in detail in the first embodiment.

Figure 27:
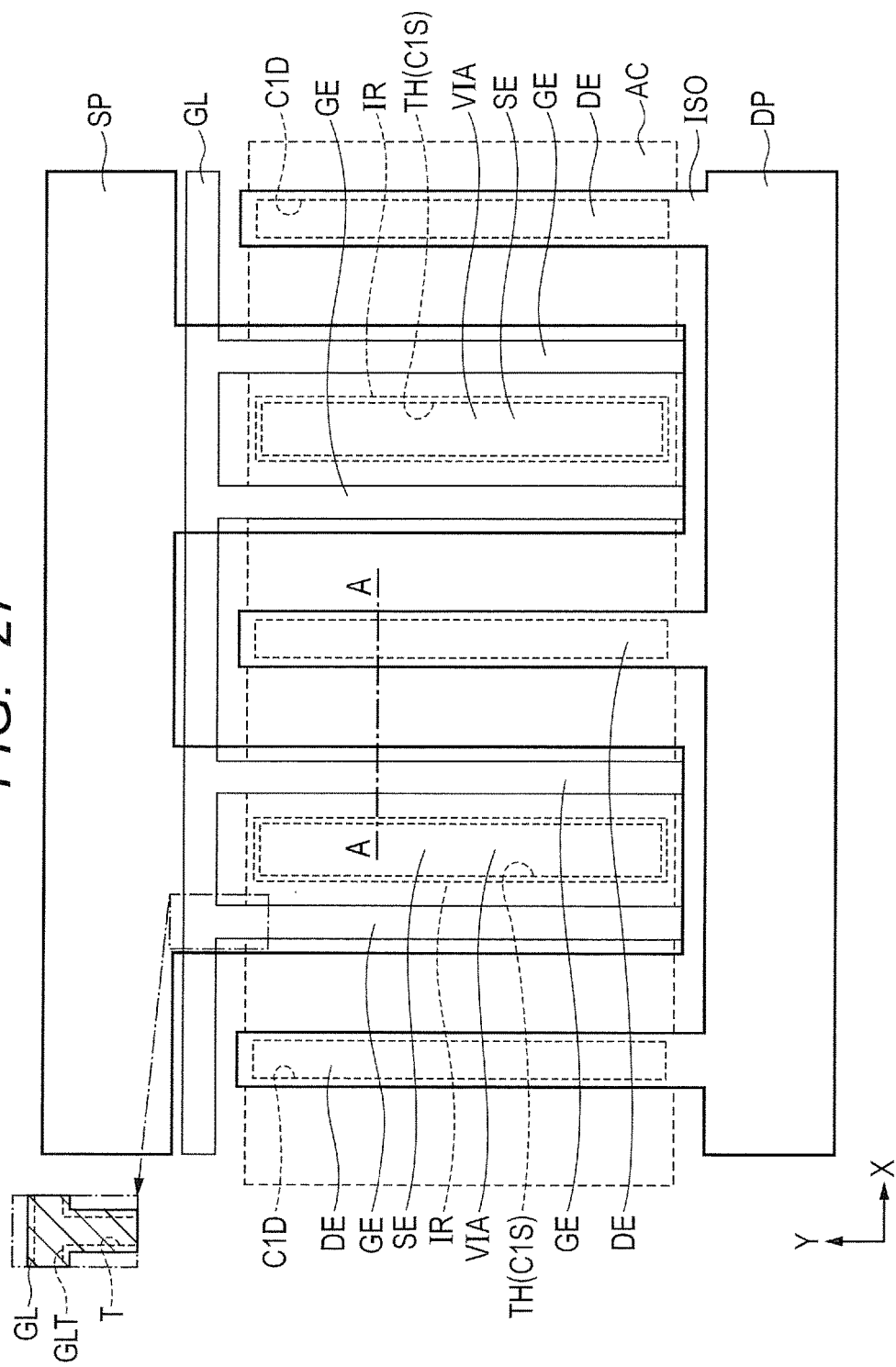
FIG. 27 is a plan view illustrating the configuration of the semiconductor device of the second embodiment.
Figure 28:
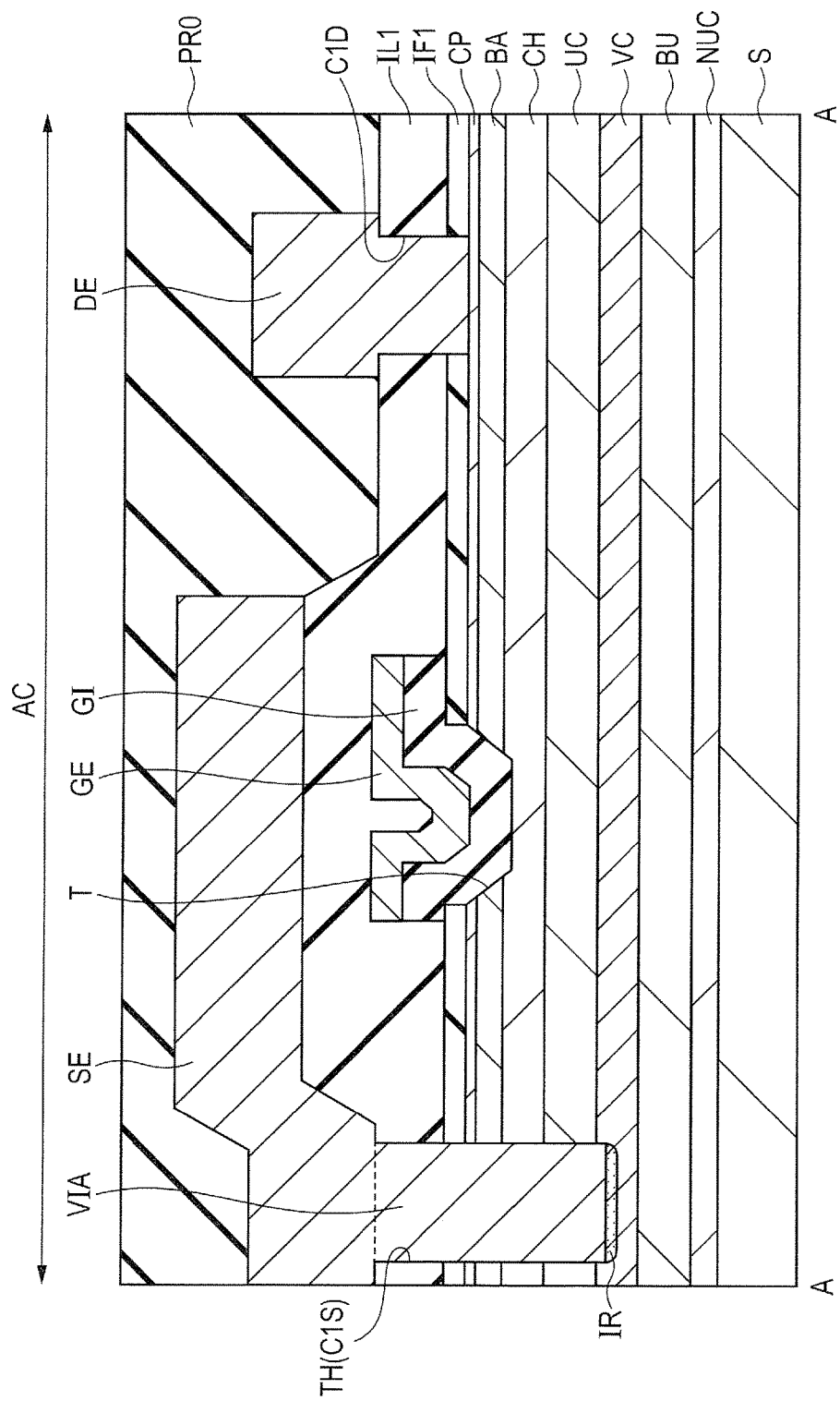
FIG. 28 is a sectional view illustrating the configuration of the semiconductor device of the second embodiment.

The semiconductor device of the second embodiment is described further in detail with reference to FIGS. 27 and 28. FIG. 27 is a plan view illustrating the configuration of the semiconductor device of the second embodiment. FIG. 28 is a sectional view illustrating the configuration of the semiconductor device of the second embodiment. FIG. 28 corresponds to a section along A-A in FIG. 27. The semiconductor device of the second embodiment is similar to that of the first embodiment except for the configuration of the coupling VIA; hence, detailed description of the configurations similar to those in the first embodiment is omitted.

As illustrated in FIG. 27, a plurality of linable drain electrodes DE are disposed in an X direction with a certain interval, and a plurality of linable source electrodes SE are disposed in the X direction with a certain interval. As with the first embodiment, the source electrodes SE and the drain electrodes DE are alternately disposed along the X direction.

As with the first embodiment, a contact hole C1D as a coupling between the drain electrode DE and the cap layer CP is disposed under the drain electrode DE. The coupling VIA that electrically couples the source electrode SE to the voltage clamp layer VC is disposed under the source electrode SE. The coupling VIA is disposed within the through-hole TH, and has a planar shape being a rectangular shape having a long side in the Y direction. An impurity region IR is provided under the coupling VIA. For example, the impurity region IR is an impurity introduction region that contains an impurity having a deep acceptor level implanted into the voltage clamp layer VC exposed from the bottom of the through-hole TH.

The gate electrode GE is disposed between the contact hole C1D under the drain electrode DE and the through-hole TH under the source electrode SE. As with the first embodiment, the gate electrode GE has a rectangular shape having a long side in the Y direction. Two (a pair of) gate electrodes GE are disposed below one source electrode SE. The two gate electrodes GE are disposed on the two respective sides of the through-hole TH under the source electrode SE. In this way, the two gate electrodes GE are disposed for each of the source electrodes SE.

As with the first embodiment, the drain electrodes DE are coupled to one another by a drain pad DP, and the source electrodes SE are coupled to one another by a source pad SP. A protective film (also referred to as insulating film, cover film, or surface protective film) PRO is disposed over the source electrode SE and the drain electrode DE.

The constitutional materials of the substrate S, the nucleation layer NUC, the buffer layer BU, the voltage clamp layer VC, the channel base layer UC, the channel layer (also referred to as electron traveling layer) CH, the barrier layer BA, the cap layer CP, and the insulating film IF1 are the same as those described in the first embodiment.

The constitutional materials of the gate insulating film GI, the gate electrode GE, the interlayer insulating film IL1, and the protective film PRO are the same as those described in the first embodiment.

The constitutional materials of the source electrode SE, the drain electrode DE, the source pad SP, and the drain pad DP are the same as those described in the first embodiment. The constitutional material of the coupling VIA is the same as that of the source electrode SE or the drain electrode DE.

Description of Manufacturing Method

A method of manufacturing the semiconductor device of the second embodiment is now described with reference to FIGS. 29 to 34 while the configuration of the semiconductor device is further clarified. FIGS. 29 to 34 are sectional views illustrating a manufacturing process of the semiconductor device of the second embodiment.

Figure 29:
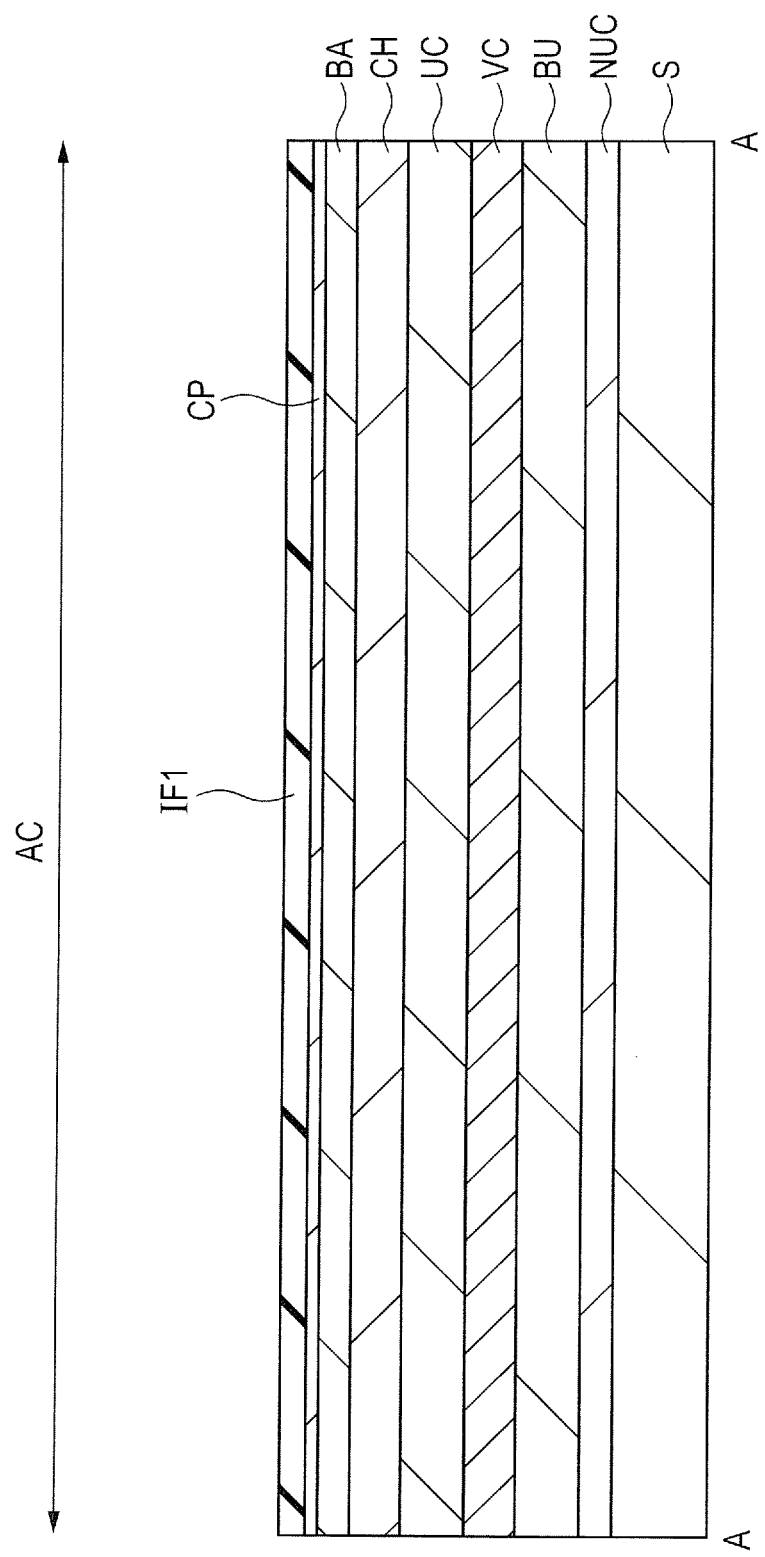
FIG. 29 is a sectional view illustrating a manufacturing process of the semiconductor device of the second embodiment.

As illustrated in FIG. 29, the nucleation layer NUC and the buffer layer BU are sequentially formed on the substrate S. These layers can be formed in the same way as in the first embodiment using the same materials as those described in the first embodiment.

Subsequently, for example, an AlGaN layer (p-AlGaN layer) containing a p-type impurity is heteroepitaxially grown as the voltage clamp layer VC on the buffer layer BU using the metal organic chemical vapor deposition process or the like. For example, magnesium (Mg) is used as the p-type impurity. For example, a gallium nitride layer is deposited about 200 nm while being doped with magnesium (Mg). The Mg concentration in the deposited film is about $5 \times 10^{18}$ (5E18) cm$^{-3}$, for example.

Subsequently, the channel base layer UC, the channel layer CH, the barrier layer BA, the cap layer CP, and the insulating film IF1 are sequentially formed on the voltage clamp layer VC. These layers can be formed in the same way as in the first embodiment using the same materials as those described in the first embodiment. Subsequently, as with the first embodiment, a device isolation region (ISO) is formed.

Figure 30:
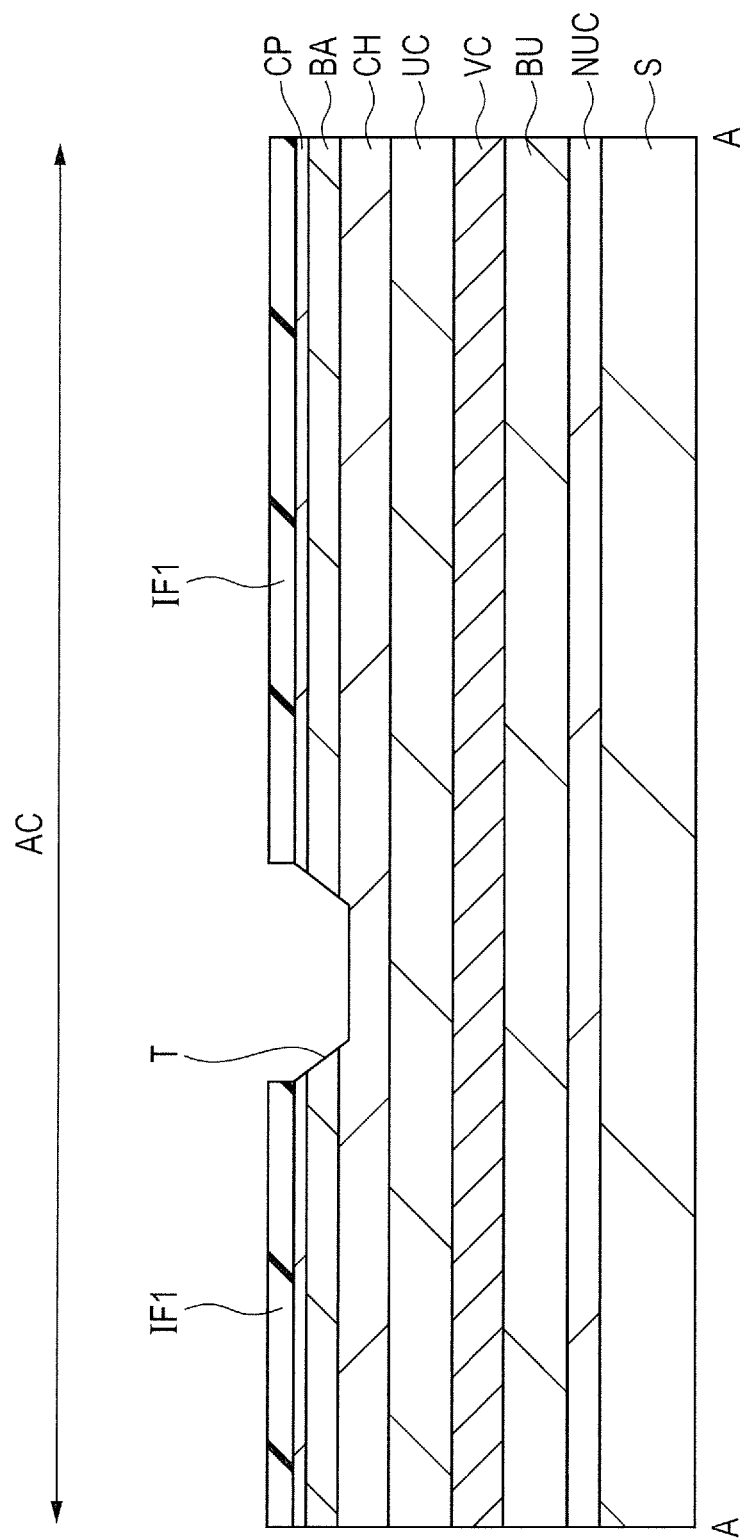
FIG. 30 is a sectional view illustrating the manufacturing process of the semiconductor device of the second embodiment, showing a step following FIG. 29.

Subsequently, as illustrated in FIG. 30, as with the first embodiment, an opening is formed in a trench T formation region of the insulating film IF1, and the cap layer CP, the barrier layer BA, and the channel layer CH are dry-etched with the insulating film IF1 as a mask, thereby the trench T, which extends to a certain depth of the channel layer CH through the cap layer CP and the barrier layer BA, is formed. Through this step, a trench (GLT) for the gate line GL is formed in the device isolation region (ISO).

Figure 31:
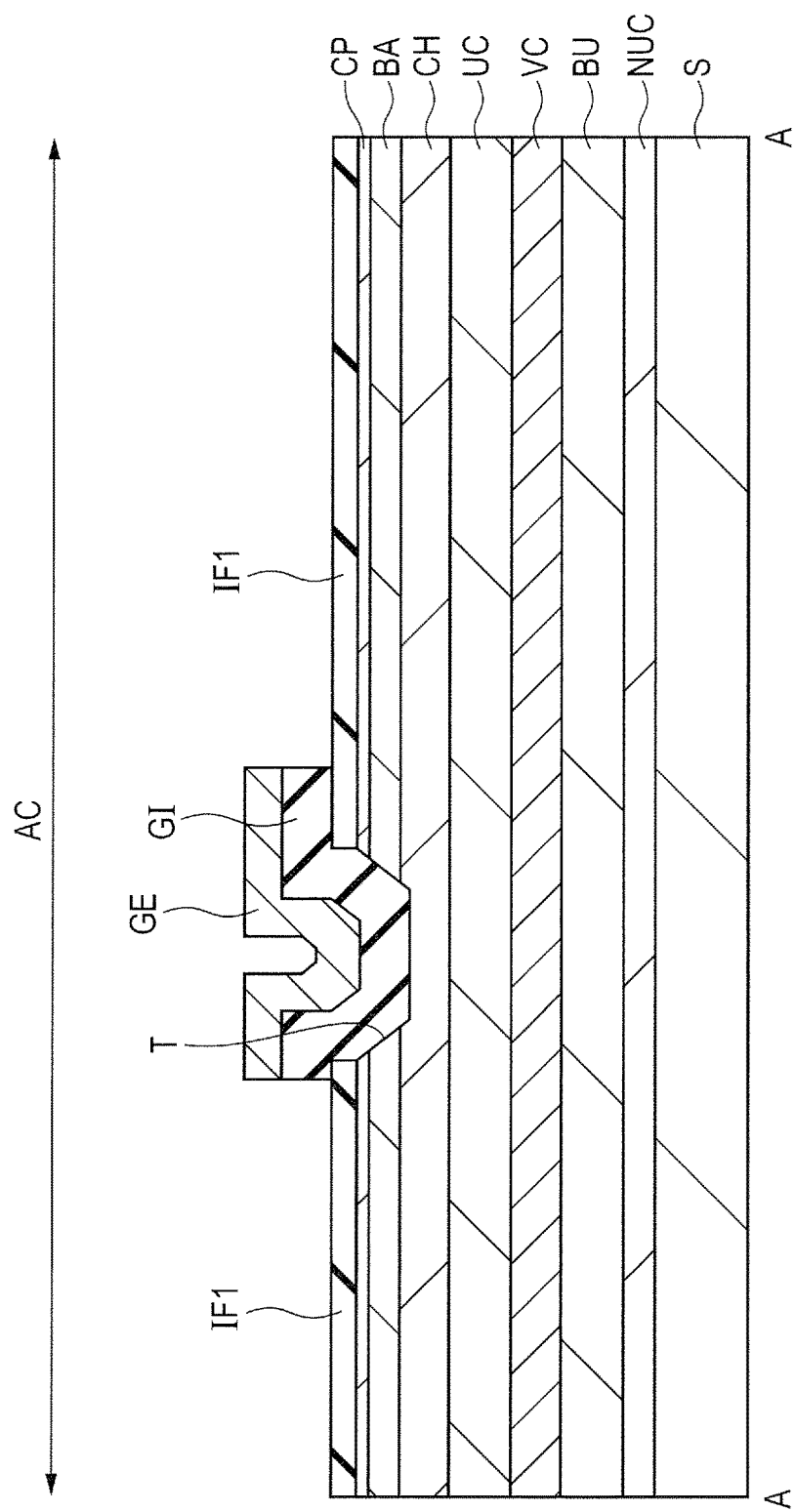
FIG. 31 is a sectional view illustrating the manufacturing process of the semiconductor device of the second embodiment, showing a step following FIG. 30.

Subsequently, as illustrated in FIG. 31, the gate electrode GE is formed on the insulating film IF1 including the inside of the trench T with the gate insulating film GI in between. The gate insulating film GI and the gate electrode GE can be formed in the same way as in the first embodiment using the same materials as those described in the first embodiment.

Figure 32:
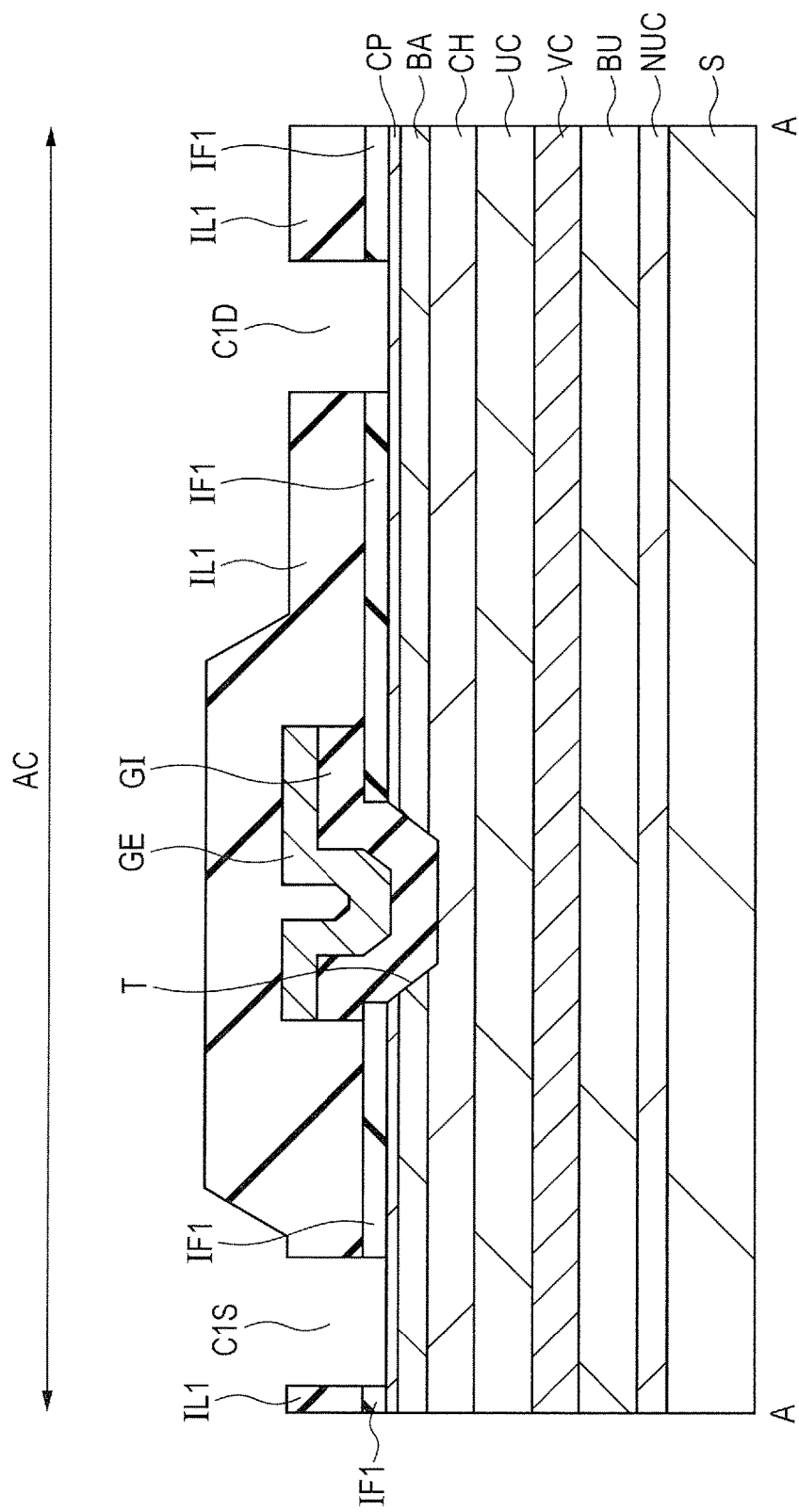
FIG. 32 is a sectional view illustrating the manufacturing process of the semiconductor device of the second embodiment, showing a step following FIG. 31.

Subsequently, as illustrated in FIG. 32, an interlayer insulating film IL1 is formed on the insulating film IF1 including the surface of the gate electrode GE.

Figure 33:
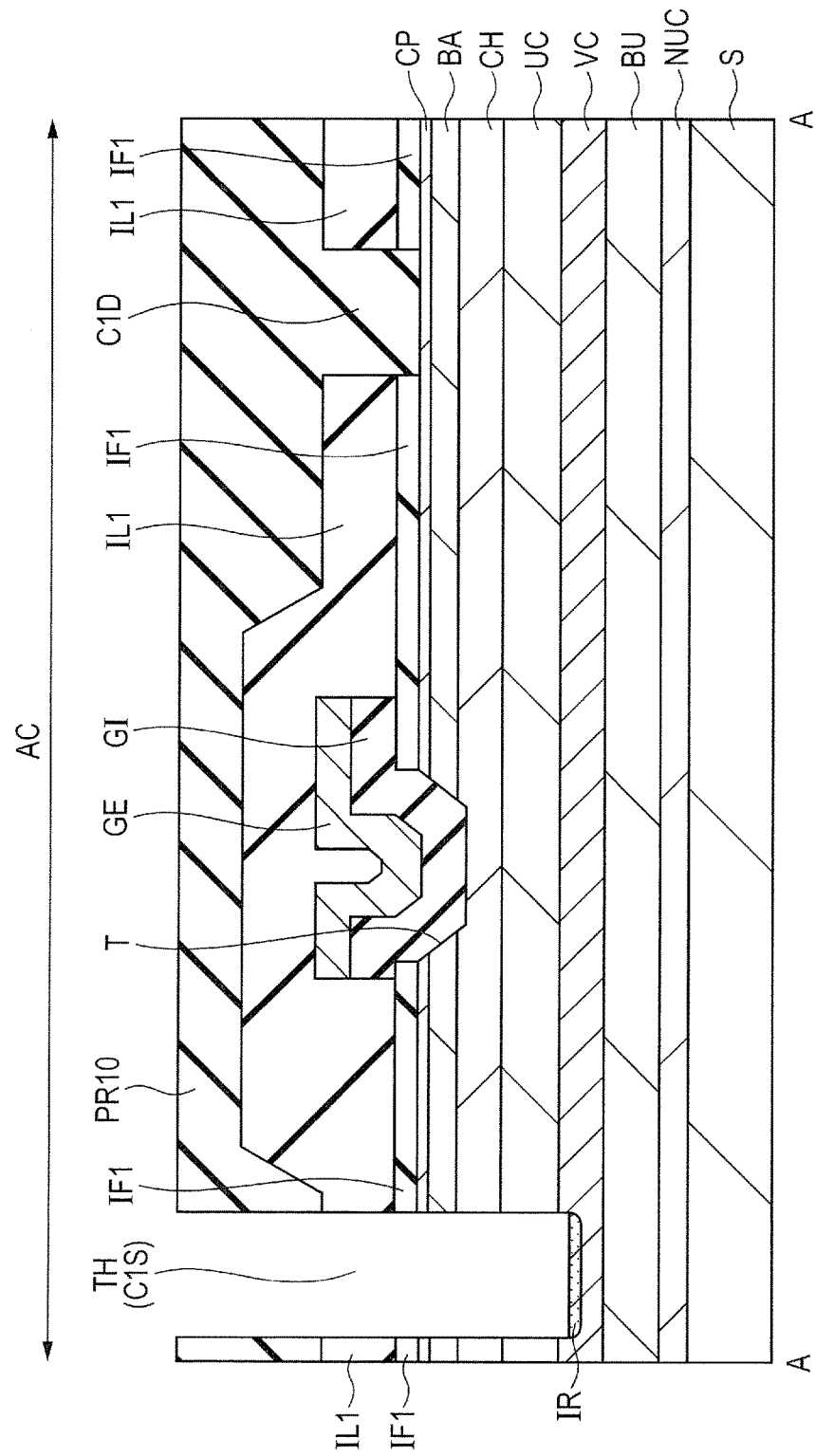
FIG. 33 is a sectional view illustrating the manufacturing process of the semiconductor device of the second embodiment, showing a step following FIG. 32.

Subsequently, a contact hole C1D and a through-hole TH are formed through the interlayer insulating film IL1 and the insulating film IF1 (FIG. 33).

For example, an undepicted first photoresist film, which has an opening in each of a source electrode coupling region and a drain electrode coupling region, is formed on the interlayer insulating film IL1. Subsequently, the interlayer insulating film IL1 and the insulating film IF1 are etched with the first photoresist film as a mask, so that the contact holes C1S and C1D are formed (FIG. 32). Subsequently, the first photoresist film is removed, and then a second photoresist film PR10 having an opening on the contact hole C1S is formed on the interlayer insulating film IL1 including the inside of the contact hole C1D. Subsequently, the cap layer CP, the barrier layer BA, the channel layer CH, the channel base layer UC, and the voltage clamp layer VC are each partially etched with the second photoresist film PR10 as a mask to form the through-hole TH. In other words, there is formed the through-hole TH that extends to a certain depth of the voltage clamp layer VC through the cap layer CP, the barrier layer BA, the channel layer CH, and the channel base layer UC (FIG. 33). The etching is performed such that the bottom of the through-hole TH is located within the voltage clamp layer VC.

When a silicon oxide film is used as the interlayer insulating film IL1 while a silicon nitride film is used as the insulating film IF1, such films are first removed by dry etching using a dry etching gas containing a fluorine-based gas such as $SF_6$, for example. Subsequently, the cap layer (GaN layer) CP, the barrier layer (AlGaN layer) BA, the channel layer (GaN layer) CH, the channel base layer (AlGaN layer) UC, and a certain depth of the voltage clamp layer (p-GaN layer) VC are removed by dry etching using a dry etching gas containing a chlorine-based gas such as $BCl_3$, for example.

The voltage clamp layer VC is exposed from the bottom of the through-hole TH formed in the above step. Subsequently, an impurity (in this exemplary case, Zn) having an acceptor level deeper than that of the p-type impurity (in this exemplary case, Mg) contained in the voltage clamp layer VC is ion-implanted with the second photoresist film PR10 as a mask. For example, $1\times10^{14}$ (1E14) $cm^{-2}$ of Zn ions are implanted at an implantation energy of 15 keV. Consequently, an impurity region IR can be formed in the voltage clamp layer VC under the bottom of the through-hole TH. Although the formation region of the impurity region IR may be part of an area under the bottom of the through-hole TH, the ion implantation is preferably performed over the entire bottom of the through-hole TH in order to decrease the contact resistance.

Subsequently, the second photoresist film PR10 is removed. The cap layer CP is exposed from the bottom of the contact hole C1D formed in the above step, and the impurity region IR is exposed from the bottom of the through-hole TH.

The formation order of the contact hole C1D and the through-hole TH is not limited to the above-described order. For example, after the through-hole TH is formed, the impurity region IR may be formed under the bottom of the through-hole TH prior to the contact hole C1D.

Figure 34:
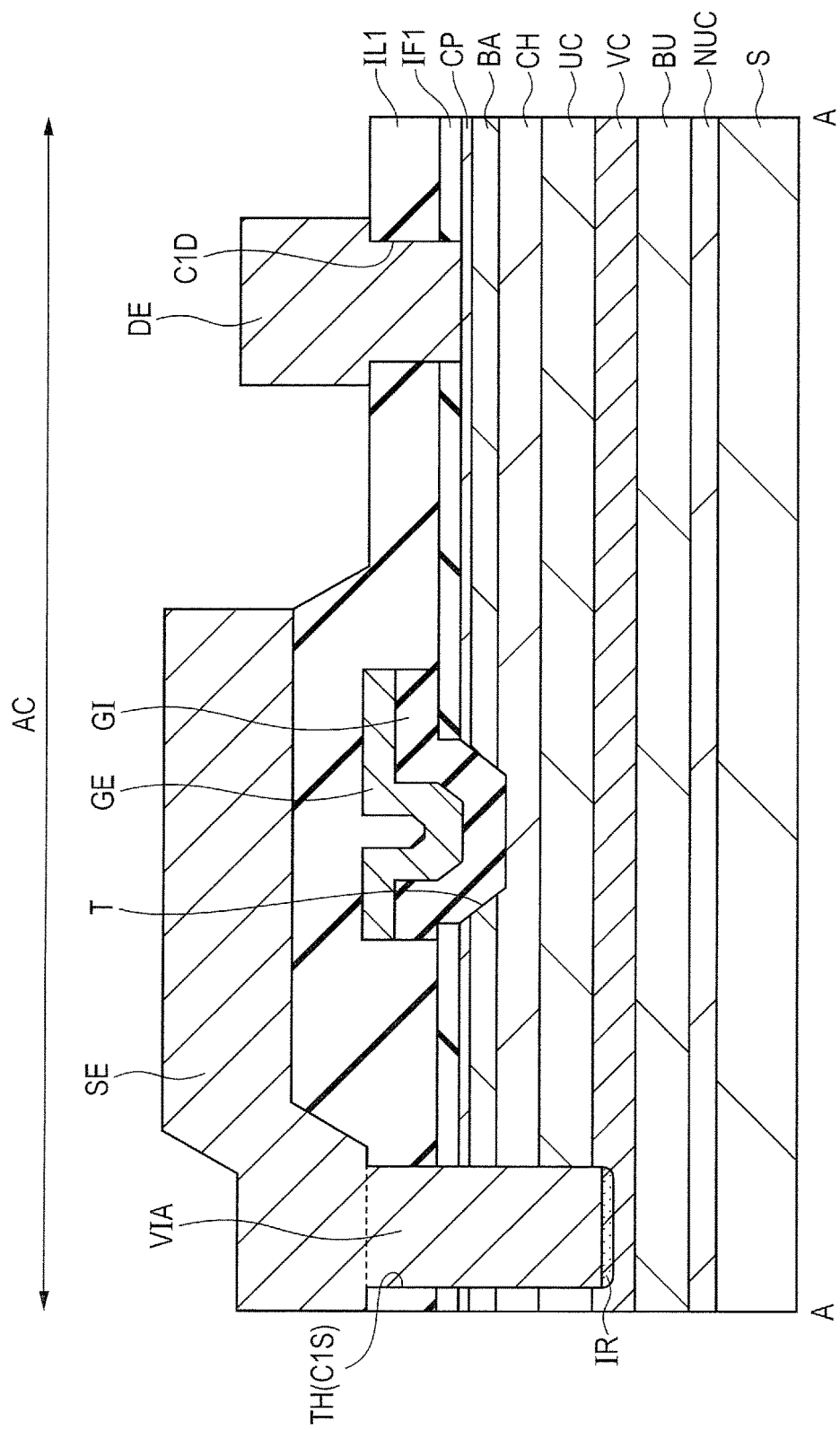
FIG. 34 is a sectional view illustrating the manufacturing process of the semiconductor device of the second embodiment, showing a step following FIG. 33.

Subsequently, as illustrated in FIG. 34, a conductive film is formed on the interlayer insulating film IL1 including the inside of the contact hole C1D and the inside of the through-hole TH, thereby the source electrode SE, the drain electrode DE, the source pad (SP), the drain pad (DP), and the coupling VIA are formed.

For example, the conductive film is formed on the interlayer insulating film IL1 including the insides of the contact holes C1S and C1D and the inside of the through-hole TH (the surface of the conductive film CF1). For example, an Al film is formed as the conductive film using a sputtering process. The Al film has a thickness of about 500 to 1000 nm, for example.

Subsequently, an undepicted photoresist film is formed in formation regions of the source electrode SE, the drain electrode DE, the source pad SP, and the drain pad DP using a photolithography technique, and the conductive film is etched with the photoresist film as a mask. For example, dry etching is performed using a dry etching gas containing a chlorine-based gas such as $BCl_3$. Through such a step, the coupling VIA including the through-hole TH filled with the conductive film is formed, and the source electrode SE, the drain electrode DE, the source pad SP, and the drain pad DP are also formed. The impurity region IR is located under the coupling VIA.

Subsequently, as with the first embodiment, the protective film PRO is formed on the interlayer insulating film IL1 including the surfaces of the source electrode SE, the drain electrode DE, the source pad (SP), and the drain pad (DP) (FIG. 28).

The semiconductor device of the second embodiment can be formed through the above-described steps. Such steps are merely shown as an example, and the semiconductor device of the second embodiment may be manufactured through other steps.

Thus, in the second embodiment, the voltage clamp layer VC as a conductive layer is provided between the buffer layer BU and the channel layer CH, and is coupled to the source electrode SE; hence, variations in characteristics of the semiconductor element can be decreased. Specifically, the voltage clamp layer VC prevents the channel layer CH from being affected by a variation in potential due to a variation in charge amount of a layer (for example, the buffer layer BU) below the voltage clamp layer VC. This makes it possible to decrease variations in characteristics such as threshold potential and on resistance.

In the second embodiment, since a portion of the voltage clamp layer VC under the bottom of the through-hole TH is doped with the impurity having the deep acceptor level so that the portion is formed into the impurity region (also referred to as hopping conduction region) IR, a good contact can be provided between the coupling VIA and the voltage clamp layer VC. In particular, even if the p-type impurity concentration in the voltage clamp layer VC is controlled to be relatively low (for example, about $1\times10^{18}$ (1E18) $cm^{-3}$) to increase a drain breakdown voltage, a good contact can be provided between the coupling VIA and the voltage clamp layer VC.

Furthermore, in the second embodiment, since the coupling VIA is disposed within the active region AC allowing electron conduction, the voltage is further effectively clamped.

Third Embodiment

Although the impurity region IR, in which the impurity having the deep acceptor level has been implanted, is provided as a hopping conduction region under the coupling VIA in the first embodiment, a defect region DR may be provided as the hopping conduction region under the coupling VIA.

A semiconductor device of a third embodiment is now described in detail with reference to the accompanying drawings.

Description of Structure

Figure 35:
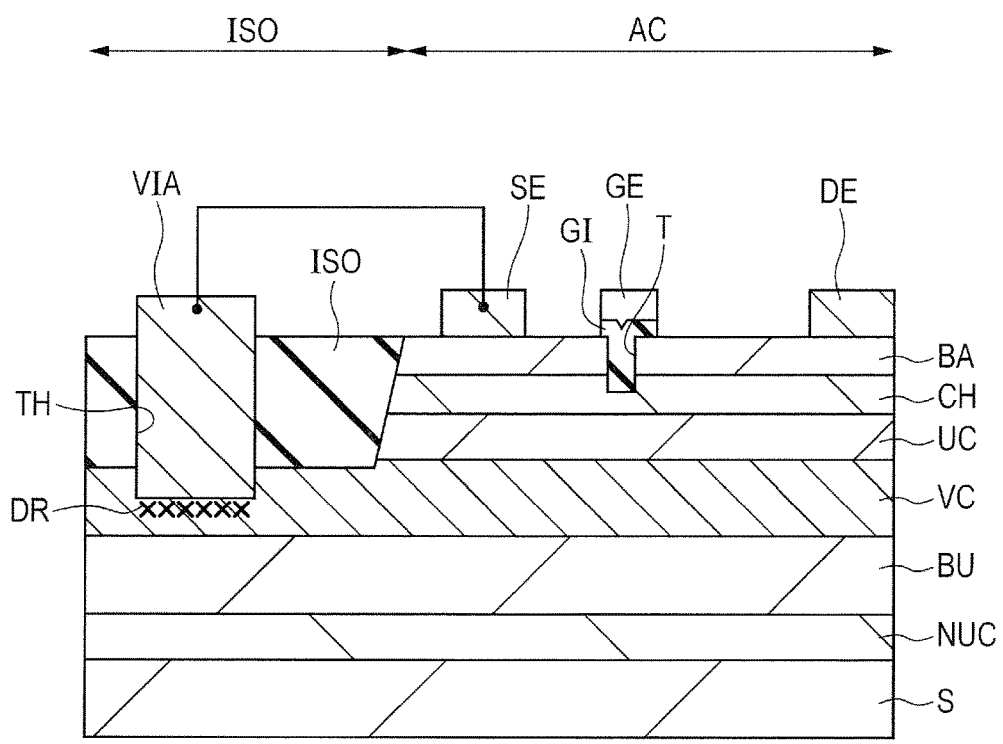
FIG. 35 is a sectional view schematically illustrating a configuration of a semiconductor device of a third embodiment.

FIG. 35 is a sectional view schematically illustrating a configuration of the semiconductor device of the third embodiment. The semiconductor device (semiconductor element) of the third embodiment is a MIS field effect transistor including a nitride semiconductor. The semiconductor device can be used as a power transistor of a high electron mobility transistor (HEMT) type. The semiconductor device of the third embodiment is what is called a recess-gate semiconductor device.

In the semiconductor device of the third embodiment, as with the first embodiment, a nucleation layer NUC, a buffer layer BU, a voltage clamp layer VC, a channel base layer UC, a channel layer (also referred to as electron traveling layer) CH, and a barrier layer BA are provided in this order on a substrate S. The nucleation layer NUC includes a nitride semiconductor layer. The buffer layer BU includes one or more nitride semiconductor layers each including a nitride semiconductor doped with an impurity forming a deep level. In this exemplary case, the buffer layer BU includes a superlattice structure including a plurality of nitride semiconductor layers. The voltage clamp layer VC includes a nitride semiconductor layer including a nitride semiconductor doped with a p-type impurity, and is conductive. The channel base layer UC includes a nitride semiconductor layer having an electron affinity smaller than that of the channel layer CH. The channel layer CH includes a nitride semiconductor layer having an electron affinity larger than that of the channel base layer UC. The barrier layer BA includes a nitride semiconductor layer having an electron affinity that is smaller than that of the channel layer CH and than that of the channel base layer UC. An undepicted insulating film is provided on the barrier layer BA. A cap layer may be provided between the insulating film (protective film) and the barrier layer BA. The cap layer preferably includes a nitride semiconductor layer having an electron affinity larger than that of the barrier layer BA.

As with the first embodiment, the MISFET of the third embodiment includes the channel layer CH, a gate insulating film GI on the channel layer CH, a gate electrode GE on the gate insulating film GI, and a source electrode SE and a drain electrode DE on the barrier layer BA on the two respective sides of the gate electrode GE. The MISFET is provided in an active region AC divided by a device isolation region ISO. The gate electrode GE is provided on the gate insulating film GI within a trench T that extends to a certain depth of the channel layer CH through the barrier layer BA.

In the third embodiment, a coupling (also referred to as via) VIA, which extends through the device isolation region ISO to the underlying voltage clamp layer VC, is provided in the device isolation region ISO, and is electrically coupled to the source electrode SE. In this way, the voltage clamp layer VC is provided and coupled to the source electrode SE, thereby variations in characteristics such as threshold potential and on resistance can be decreased.

The semiconductor device of the third embodiment has the defect region DR in contact with the bottom of the coupling VIA. The defects contained in the defect region DR cause hopping conduction, leading to a reduction in contact resistance between the coupling VIA and the voltage clamp layer VC.

Figure 36:
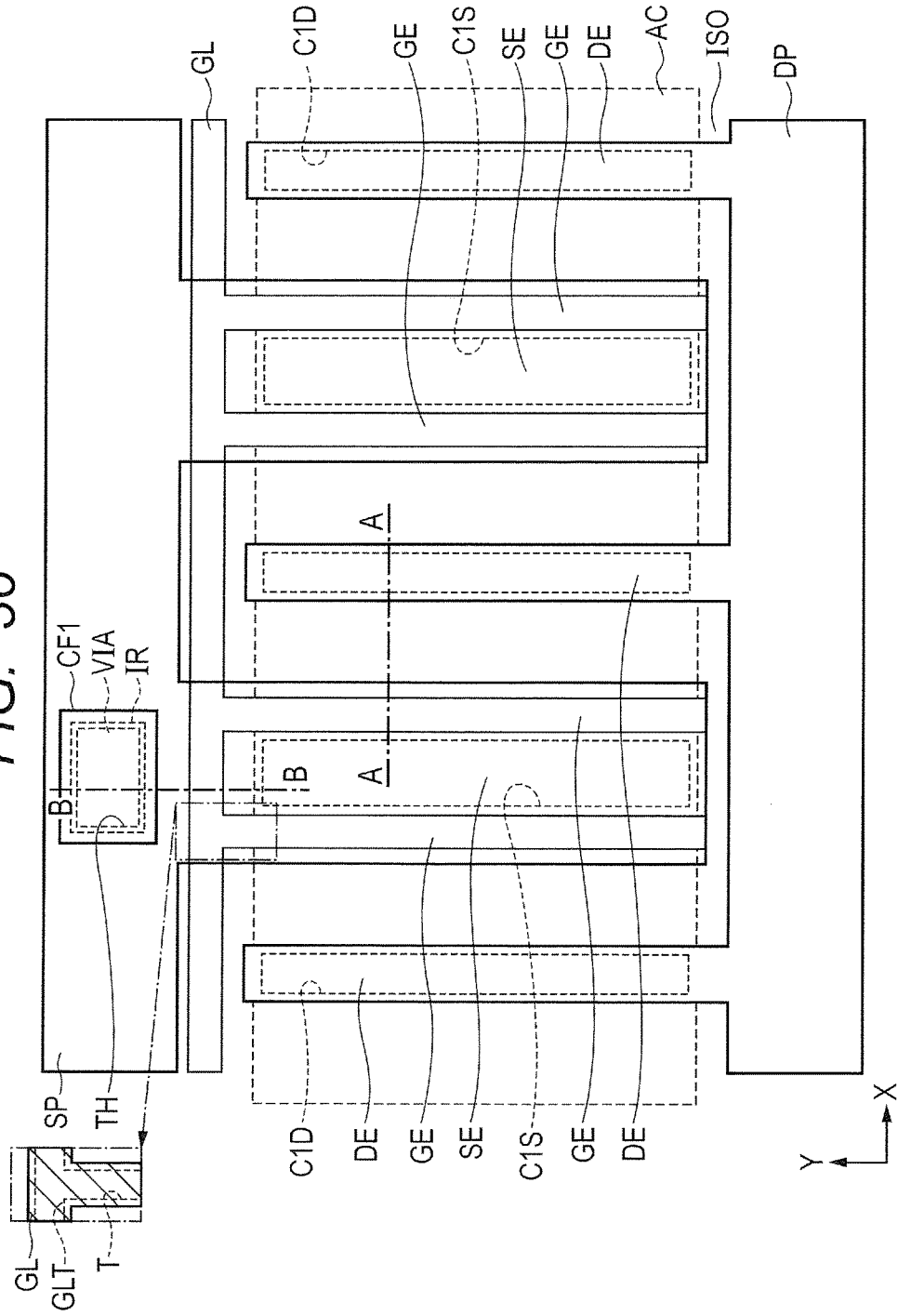
FIG. 36 is a plan view illustrating the configuration of the semiconductor device of the third embodiment.
Figure 37:
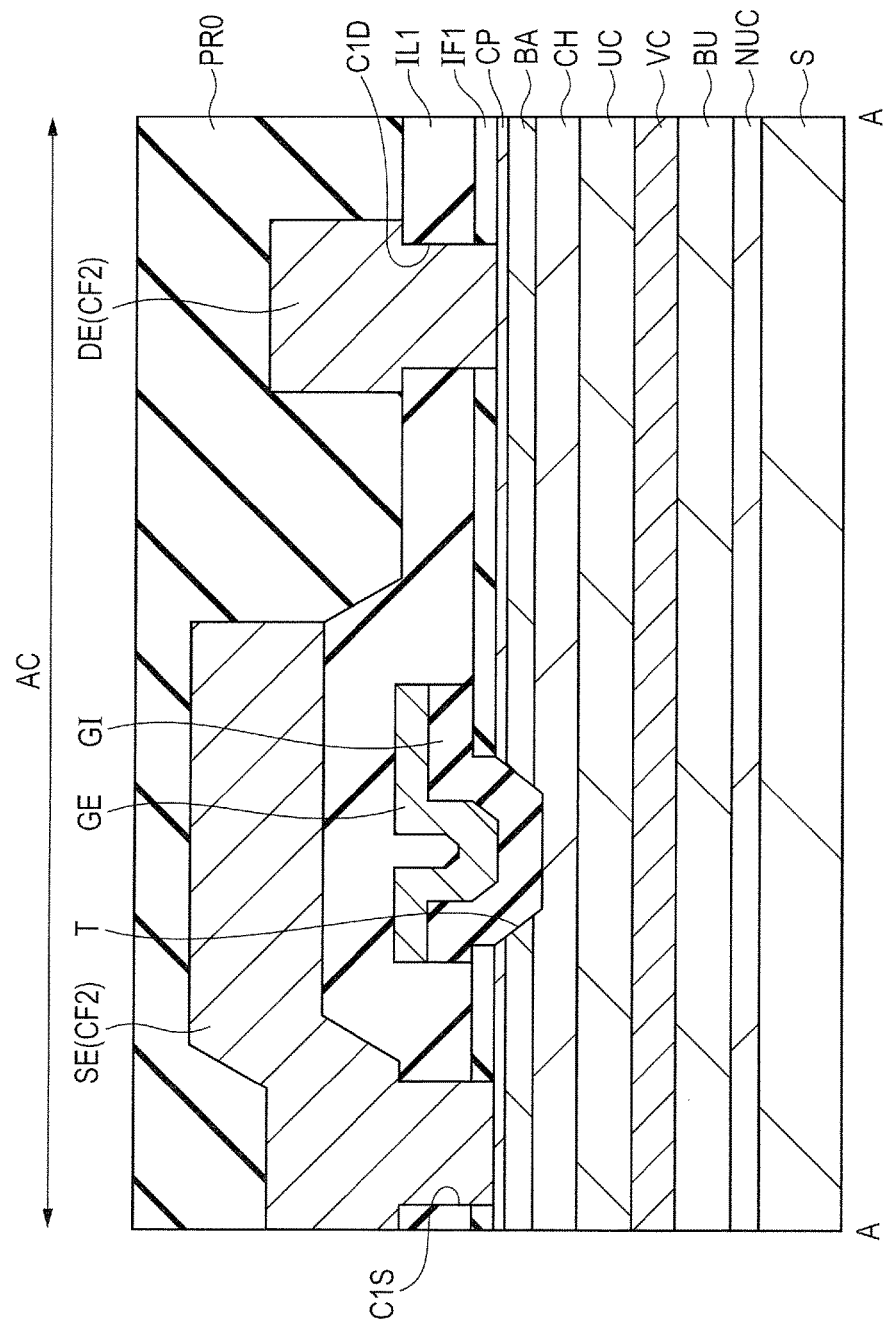
FIG. 37 is a sectional view illustrating the configuration of the semiconductor device of the third embodiment.
Figure 38:
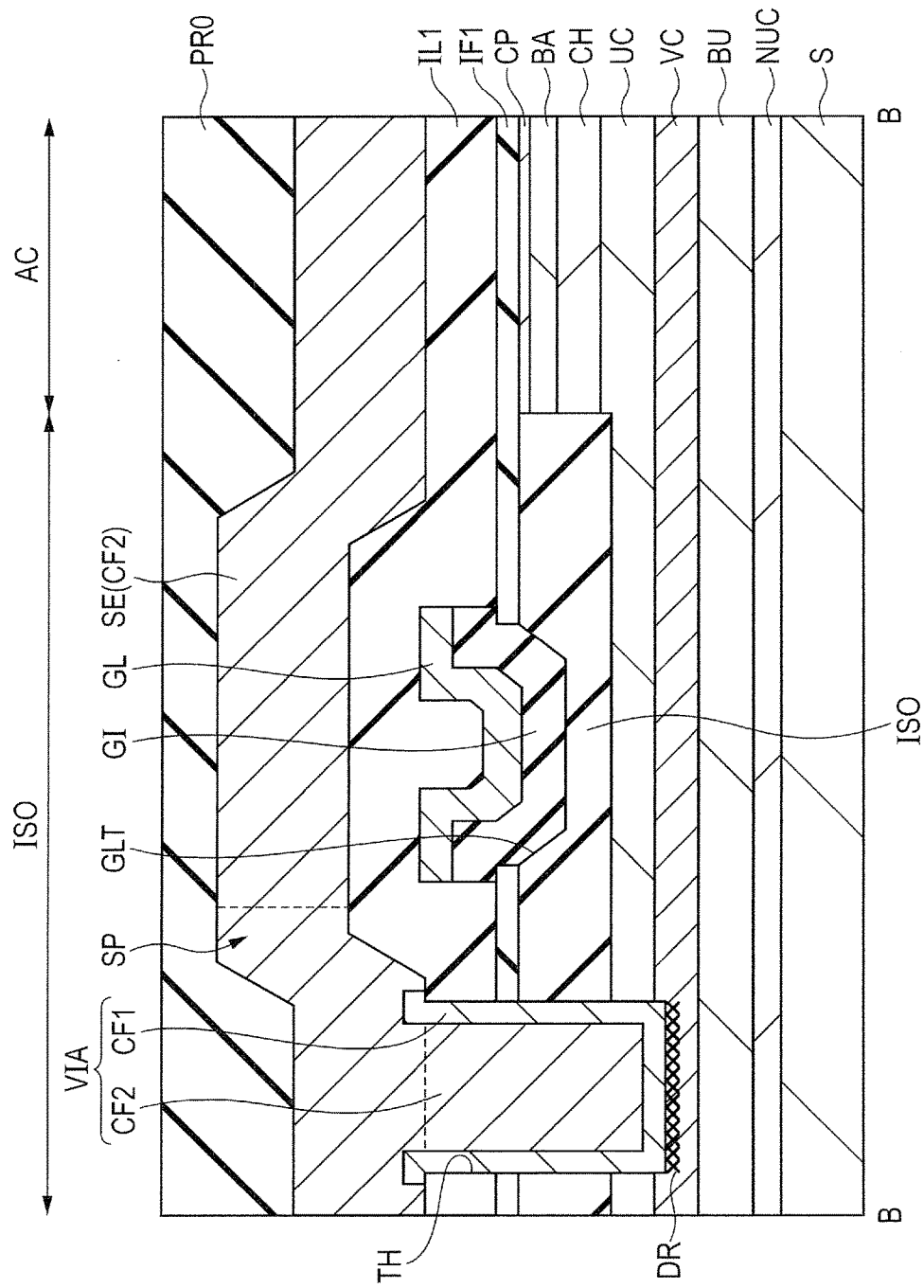
FIG. 38 is a sectional view illustrating the configuration of the semiconductor device of the third embodiment.

The semiconductor device of the third embodiment is described further in detail with reference to FIGS. 36 to 38. FIG. 36 is a plan view illustrating the configuration of the semiconductor device of the third embodiment. FIGS. 37 and 38 are each a sectional view illustrating the configuration of the semiconductor device of the third embodiment. FIG. 37 corresponds to a section along A-A in FIG. 36, and FIG. 38 corresponds to a section along B-B in FIG. 36. The semiconductor device of the third embodiment is similar to that of the first embodiment except for the configuration of the hopping conduction region under the coupling VIA (the defect region DR is provided in place of the impurity region IR); hence, detailed description of the configurations similar to those in the first embodiment is omitted.

The plan view of FIG. 36 shows the same configuration of the semiconductor device as that of the first embodiment except for the configuration of the hopping conduction region (the defect region DR is provided in place of the impurity region IR). Specifically, a plurality of linable drain electrodes DE are disposed in an X direction with a certain interval. A plurality of linable source electrodes SE are disposed in the X direction with a certain interval. The source electrodes SE and the drain electrodes DE are alternately disposed along the X direction.

A contact hole C1D as a coupling between the drain electrode DE and a cap layer CP (the barrier layer BA) is disposed under the drain electrode DE. A contact hole C1S as a coupling between the source electrode SE and the cap layer CP (the barrier layer BA) is disposed under the source electrode SE (FIG. 37).

The gate electrode GE is disposed between the contact hole C1D under the drain electrode DE and the contact hole C1S under the source electrode SE. Two (a pair of) gate electrodes GE are disposed below one source electrode SE. The two gate electrodes GE are disposed on the two respective sides of the contact hole C1S under the source electrode SE. In this way, the two gate electrodes GE are disposed for each of the source electrodes SE.

The drain electrodes DE are coupled to one another by a drain pad (also referred to as terminal section) DP, and the source electrodes SE are coupled to one another by a source pad (also referred to as terminal section) SP. The gate electrodes GE are coupled to one another by a gate line GL.

The gate line GL is coupled to an undepicted gate pad provided on either side (each of the right and left sides in FIG. 36) in the X direction of the gate line GL.

The source electrodes SE, the drain electrodes DE, and the gate electrodes GE are largely disposed on the active region AC enclosed by the device isolation region ISO. The active region AC has a planar shape being a rectangular shape having a long side in the X direction. The drain pad DP, the gate line GL, and the source pad SP are disposed on the device isolation region ISO. The gate line GL is disposed between the active region AC and the source pad SP (FIG. 38).

A through-hole (also referred to as via) TH is disposed under the source pad. SP. The through-hole TH is filled with conductive films (CF1, CF2) to form the coupling VIA. The coupling VIA is electrically coupled to the voltage clamp layer VC. Hence, the source electrode SE is electrically coupled to the voltage clamp layer VC via the source pad SP and the coupling VIA. The defect region DR is disposed under the coupling VIA. To put it differently, the defect region DR is disposed in the vicinity of the boundary between the coupling VIA and the voltage clamp layer VC. In other words, the coupling VIA is electrically coupled to the voltage clamp layer VC via the defect region DR.

The defect region DR is part of the voltage clamp layer VC, and, for example, can be formed by providing crystal defects due to etching damage on the surface of the voltage clamp layer VC exposed from the bottom of the through-hole TH. A region into which such defects are introduced acts as the defect region DR.

A protective film (also referred to as insulating film, cover film, or surface protective film) PRO is disposed over the source electrode SE and the drain electrode DE.

The constitutional materials of the substrate S, the nucleation layer NUC, the buffer layer BU, the voltage clamp layer VC, the channel base layer UC, the channel layer (also referred to as electron traveling layer) CH, the barrier layer BA, the cap layer CP, and the insulating film IF1 are the same as those described in the first embodiment.

The constitutional materials of the gate insulating film GI, the gate electrode GE, the interlayer insulating film IL1, and the protective film PRO are the same as those described in the first embodiment.

The constitutional materials of the source electrode SE, the drain electrode DE, the source pad SP, the drain pad DP, and the coupling VIA are the same as those described in the first embodiment.

Description of Manufacturing Method

Figure 39:
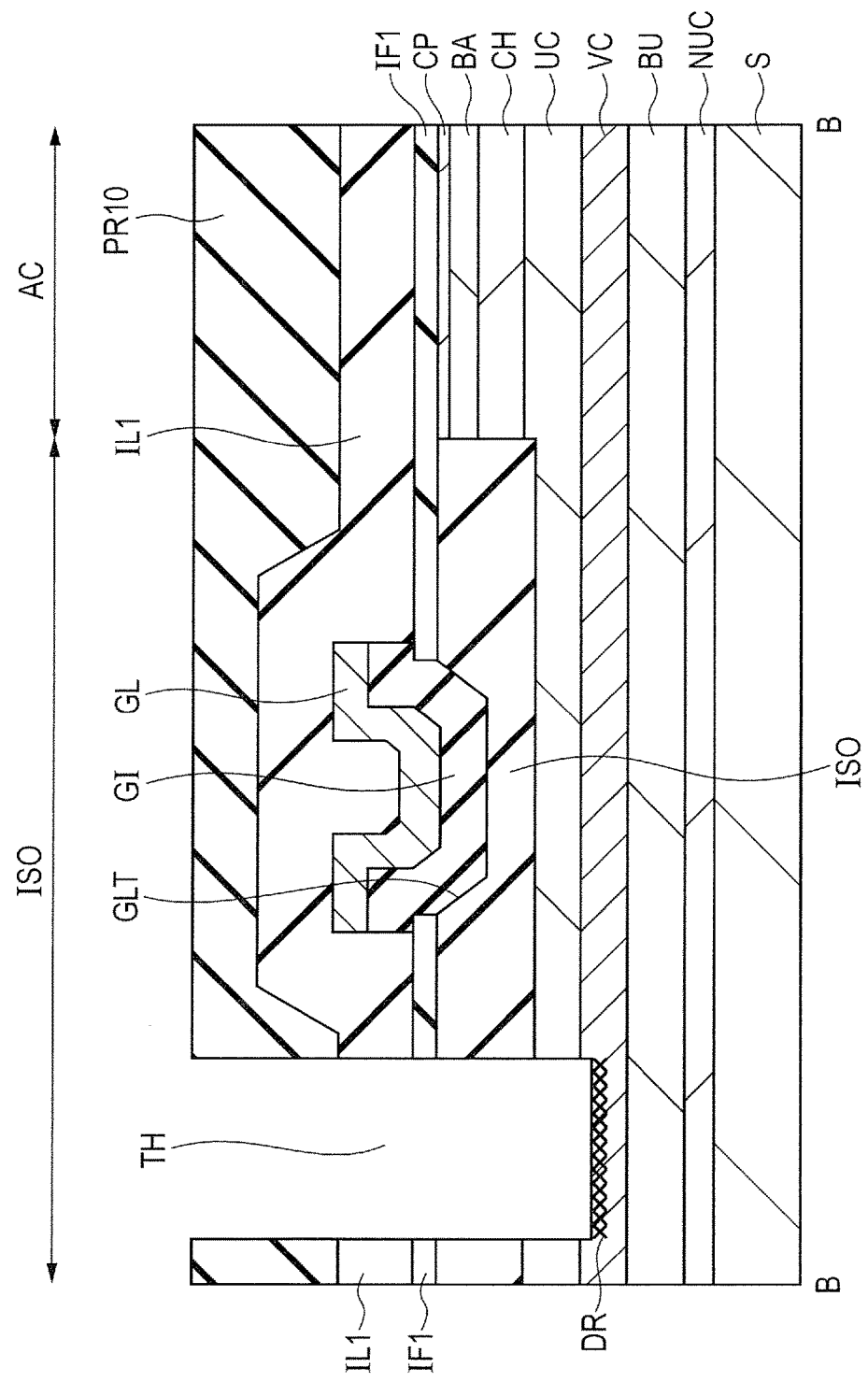
FIG. 39 is a sectional view illustrating a manufacturing process of the semiconductor device of the third embodiment.
Figure 40:
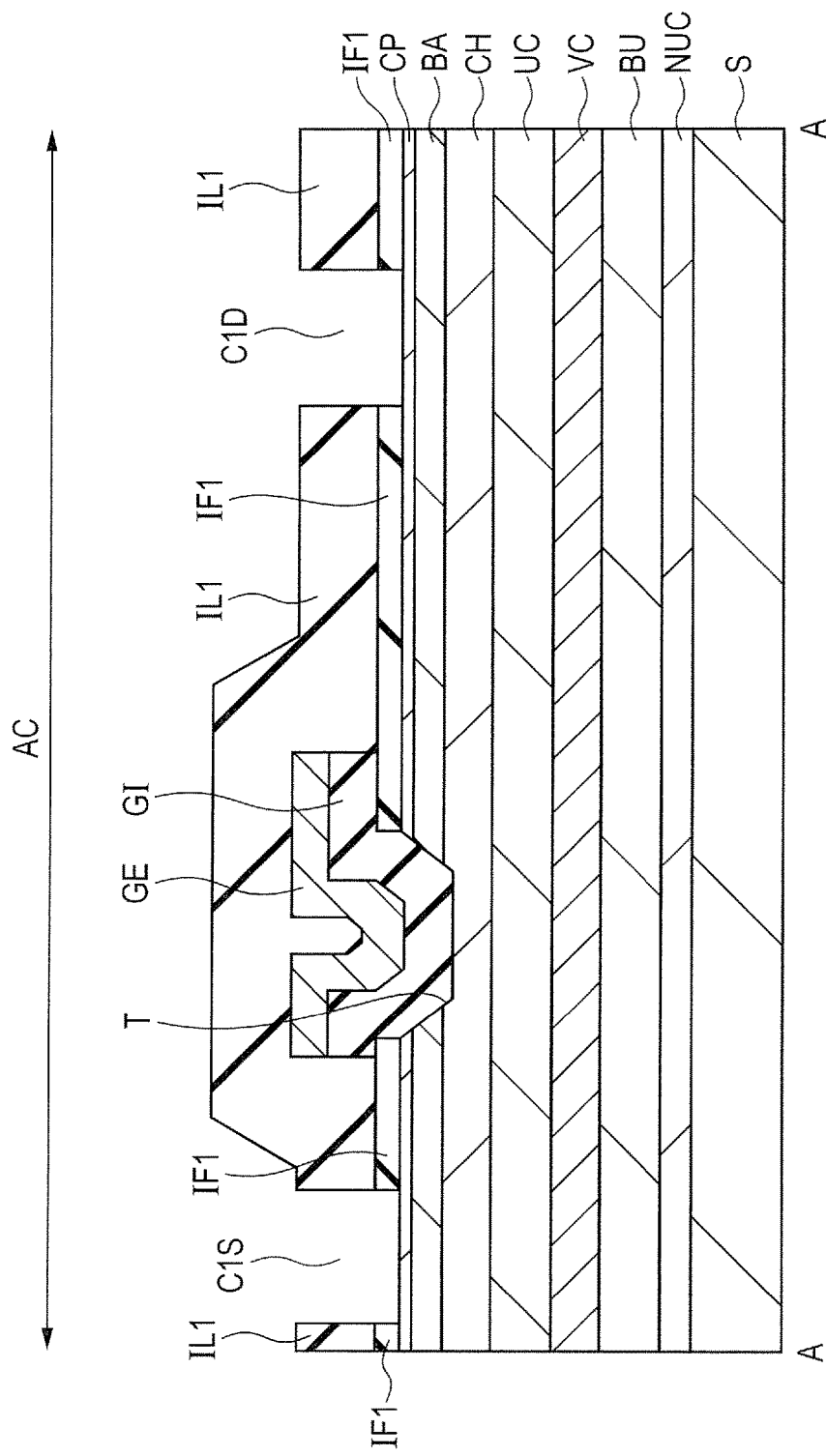
FIG. 40 is a sectional view illustrating a manufacturing process of the semiconductor device of the third embodiment.

A method of manufacturing the semiconductor device of the third embodiment is now described with reference to FIGS. 39 and 40 while the configuration of the semiconductor device is further clarified. FIGS. 39 and 40 are sectional views illustrating a manufacturing process of the semiconductor device of the third embodiment.

As with the first embodiment, the nucleation layer NUC and the buffer layer BU are sequentially formed on the substrate S. Furthermore, for example, an AlGaN layer (p-AlGaN layer) containing a p-type impurity is heteroepitaxially grown as the voltage clamp layer VC on the buffer layer BU using the metal organic chemical vapor deposition process or the like. For example, magnesium (Mg) is used as the p-type impurity. For example, a gallium nitride layer is deposited about 200 nm while being doped with magnesium (Mg). The Mg concentration in the deposited film is about $5 \times 10^{18}$ (5E18) $cm^{-3}$, for example. Subsequently, as with the first embodiment, the channel base layer UC, the channel layer CH, the barrier layer BA, the cap layer CP, and the insulating film IF1 are sequentially formed on the voltage clamp layer VC, and a device isolation region (ISO) is formed thereon. Subsequently, as with the first embodiment, the trench T and the like are formed, and the gate electrode GE is formed on the insulating film IF1 including the inside of the trench T with the gate insulating film GI in between. Subsequently, as with the first embodiment, the interlayer insulating film IL1 is formed (see FIGS. 5 to 16).

Subsequently, as illustrated in FIG. 39, the through-hole TH is formed, and the defect region DR is formed in the voltage clamp layer VC exposed from the bottom of the through-hole TH. A conductive film (CF1) is formed on the sidewalls and the bottom of the through-hole TH (see FIG. 38).

A photoresist film PR10 having an opening in a through-hole formation region is formed on the interlayer insulating film IL1. Subsequently, the interlayer insulating film IL1, the insulating film IF1, the device isolation region ISO, the channel base layer UC, and the voltage clamp layer VC are each partially etched with the photoresist film PR10 as a mask to form the through-hole TH (FIG. 39). In other words, there is formed the through-hole TH that extends to a certain depth of the voltage clamp layer VC through the interlayer insulating film IL1, the insulating film IF1, the device isolation region ISO, and the channel base layer UC.

As described above, the etching is performed such that the bottom of the through-hole TH is located within the voltage clamp layer VC and below the bottom of the device isolation region ISO.

When a silicon oxide film is used as the interlayer insulating film IL1 while a silicon nitride film is used as the insulating film IF1, such films are first removed by dry etching using a dry etching gas containing a fluorine-based gas such as $SF_6$, for example. Subsequently, the device isolation region ISO, the channel base layer (AlGaN layer) UC, and a certain depth of the voltage clamp layer (p-GaN layer) VC are removed by dry etching using a dry etching gas containing a chlorine-based gas such as $BCl_3$, for example. The etching condition is adjusted, thereby crystal defects can be introduced into a surface portion of the voltage clamp layer VC exposed from the bottom of the through-hole T. The crystal defects mean disorder of crystal arrangement and/or disorder of crystal bonding, and include existence of an atom other than crystal lattice atoms, a bond other than crystal lattice bonds, dislocation, and a vacancy. More crystal defects exist in the vicinity of the bottom of the through-hole TH than in other regions such as a portion of the voltage clamp layer VC below the gate electrode GE. The hopping conduction described in the first embodiment also occurs via such crystal defects. Such crystal defects can be introduced into the surface portion of the voltage clamp layer VC by adjusting the etching condition, for example, performing dry etching at high energy or bias. Alternatively, the crystal defects can be introduced into the surface portion of the voltage clamp layer VC by applying physical shock by an inert gas such as Ar to the bottom of the through-hole TH through dry etching using the inert gas.

Subsequently, the photoresist film PR10 is removed, and the conductive film CF1 is formed on the interlayer insulating film IL1 including the inside of the through-hole TH. For example, a Ni film is deposited as the conductive film CF1 about 50 nm by a magnetron sputter process. Subsequently, an undepicted photoresist film having an opening slightly larger than the through-hole formation region is formed, and the conductive film CF1 is etched with the photoresist film as a mask. For example, the conductive film CF1 is wet-etched by a solution containing HCl. This results in formation of the conductive film CF1 (also referred to as through-hole electrode or through-hole base electrode) covering the sidewalls and the bottom of the through-hole TH and the interlayer insulating film IL1 in the periphery of the through-hole TH (see FIG. 38). Subsequently, the photoresist film is removed.

Subsequently, as illustrated in FIG. 40, as with the first embodiment, the contact holes C1S and C1D are formed in the interlayer insulating film IL1. The cap layer CP is exposed from the bottom of each of the contact holes C1S and C1D formed in the above step, and the conductive film CF1 is exposed from the bottom of the through-hole TH.

Subsequently, as with the first embodiment, the conductive film CF2 is formed and patterned, thereby the source electrode SE and the drain electrode DE are formed on the cap layer CP on the two respective sides of the gate electrode GE. The source pad SP is formed at the end of the source electrode SE, and the drain pad DP is formed at the end of the drain electrode DE. The through-hole TH is located under the source pad SP, and the defect region DR is located under the through-hole TH. The source pad SP is electrically coupled to the voltage clamp layer VC via the coupling VIA and the defect region DR.

Subsequently, the protective film (also referred to as insulating film, cover film, or surface protective film) PRO is formed on the interlayer insulating film IL1 including the surfaces of the source electrode SE, the drain electrode DE, the source pad SP, and the drain pad DP. For example, a silicon oxynitride (SiON) film is formed as the protective film PRO on the interlayer insulating film IL1 including the surfaces of the source electrode SE, the drain electrode DE, the source pad SP, and the drain pad DP (see FIGS. 36 to 38).

The semiconductor device of the third embodiment can be formed through the above-described steps. Such steps are merely shown as an example, and the semiconductor device of the third embodiment may be manufactured through other steps.

Thus, in the third embodiment, the voltage clamp layer VC as a conductive layer is provided between the buffer layer BU and the channel layer CH, and is coupled to the source electrode SE; hence, variations in characteristics of the semiconductor element can be decreased.

In the third embodiment, since the detect region (also referred to as hopping conduction region) DR is formed under the bottom of the through-hole TH, a good contact can be provided between the coupling VIA and the voltage clamp layer VC. In particular, even if the p-type impurity concentration in the voltage clamp layer VC is controlled to be relatively low (for example, about $1\times10^{18}$ (1E18) $cm^{-3}$) to increase a drain breakdown voltage, a good contact can be provided between the coupling VIA and the voltage clamp layer VC.

In the third embodiment, since the coupling VIA in the through-hole TH is disposed within the device isolation region ISO outside of the active region AC allowing electron conduction and under the formation region of the source pad SP, small size and a high degree of integration of the semiconductor element can be achieved. In addition, since a large active region AC allowing electron conduction can be provided, on resistance per area can be reduced.

Fourth Embodiment

Although the coupling VIA is provided in the device isolation region ISO in the third embodiment, the coupling VIA may be provided in the active region AC. For example, the coupling VIA is provided under the source electrode SE in a fourth embodiment.

A semiconductor device of the fourth embodiment is now described in detail with reference to the accompanying drawings.

Description of Structure

Figure 41:
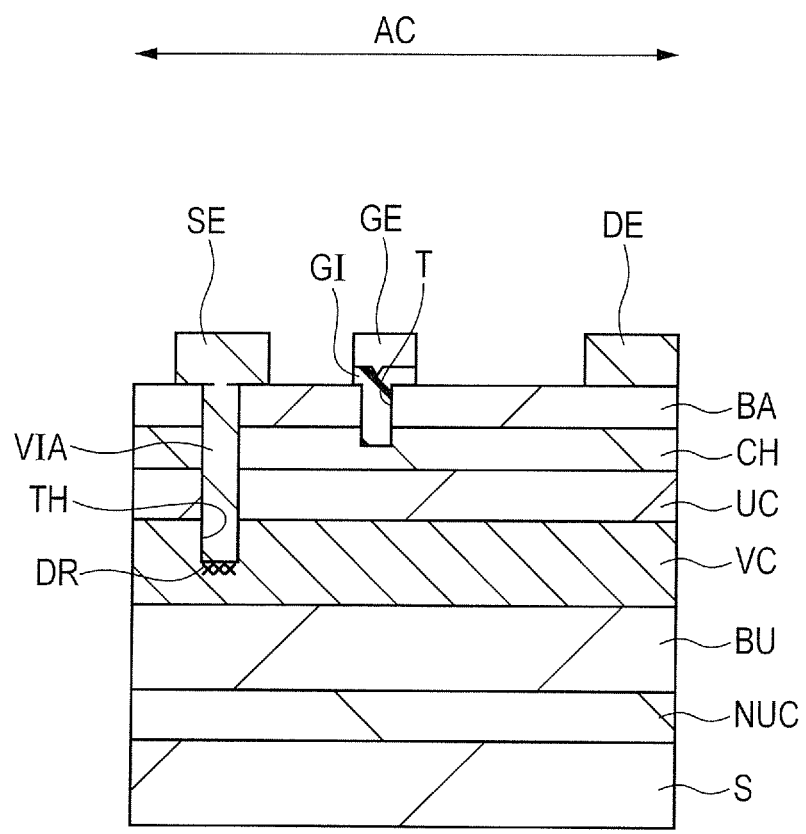
FIG. 41 is a sectional view schematically illustrating a configuration of a semiconductor device of a fourth embodiment.

FIG. 41 is a sectional view schematically illustrating a configuration of the semiconductor device of the fourth embodiment. The semiconductor device of the fourth embodiment has a configuration similar to that of the semiconductor device of the third embodiment except for a formation position of the coupling VIA, and is similar to the semiconductor device of the second embodiment except for the configuration of the hopping conduction region under the coupling VIA (the defect region. DR is provided in place of the impurity region IR).

As illustrated in FIG. 41, in the fourth embodiment, a coupling (also referred to as via) VIA, which extends through the barrier layer BA, the channel layer CH, and the channel base layer UC to the further underlying voltage clamp layer VC, is provided under the source electrode SE in the active region AC. The coupling VIA is electrically coupled to the source electrode SE. In the fourth embodiment, the defect region DR is provided under the coupling VIA.

The voltage clamp layer VC is thus provided and coupled to the source electrode SE, thereby variations in characteristics such as threshold potential and on resistance can be decreased as described in detail in the first embodiment. In addition, since the coupling VIA is disposed in the active region AC allowing electron conduction, the voltage can be further effectively clamped.

The defect region DR is provided under the coupling VIA, thereby a good contact can be provided between the coupling VIA and the voltage clamp layer VC due to hopping conduction as described in detail in the first and second embodiments.

Figure 42:
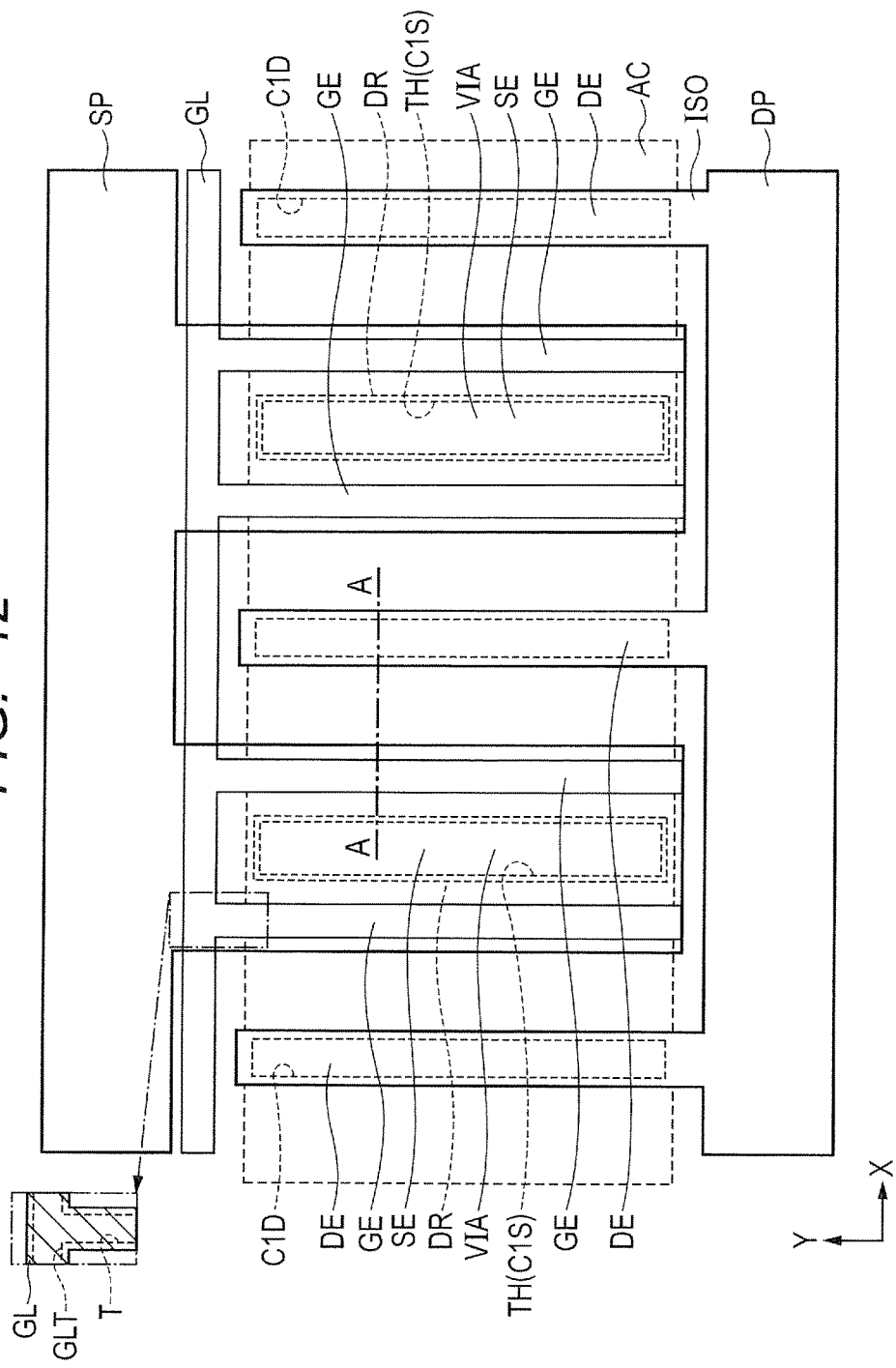
FIG. 42 is a plan view illustrating the configuration of the semiconductor device of the fourth embodiment.
Figure 43:
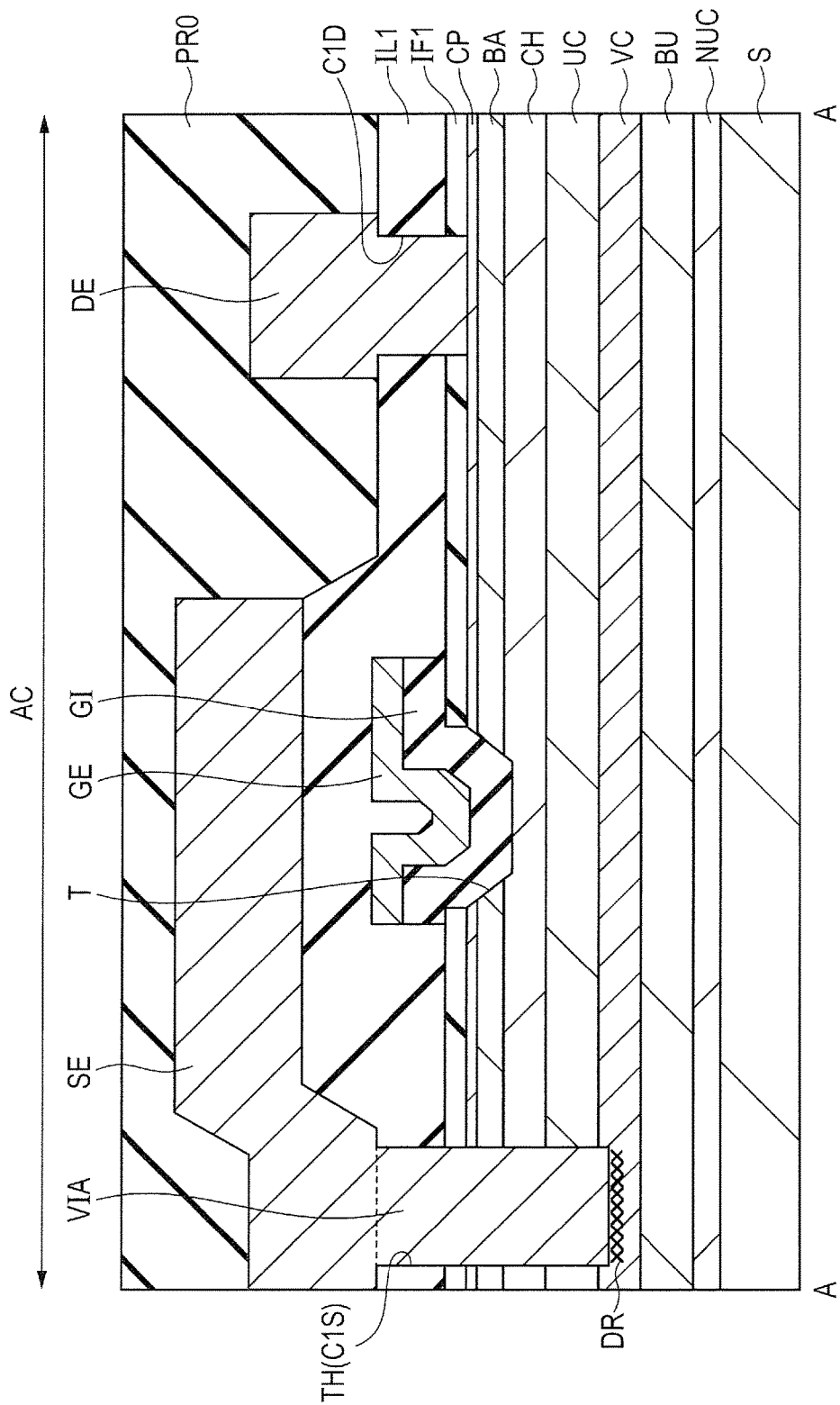
FIG. 43 is a sectional view illustrating the configuration of the semiconductor device of the fourth embodiment.

The semiconductor device of the fourth embodiment is described further in detail with reference to FIGS. 42 and 43. FIG. 42 is a plan view illustrating the configuration of the semiconductor device of the fourth embodiment. FIG. 43 is a sectional view illustrating the configuration of the semiconductor device of the fourth embodiment, and corresponds to a section along A-A in FIG. 42. The semiconductor device of the fourth embodiment is similar to that of the second embodiment except for the configuration of the hopping conduction region (the defect region DR is provided in place of the impurity region IR).

As illustrated in FIGS. 42 and 43, a through-hole TH is disposed under the source electrode SE. The through-hole TH is filled with a conductive film to form the coupling VIA. The coupling VIA is electrically coupled to the voltage clamp layer VC. Hence, the source electrode SE is electrically coupled to the voltage clamp layer VC via the coupling VIA. The defect region DR is disposed under the coupling VIA. To put it differently, the defect region DR is disposed in the vicinity of the boundary between the coupling VIA and the voltage clamp layer VC. In other words, the coupling VIA is coupled to the voltage clamp layer VC via the defect region DR.

The defect region DR is part of the voltage clamp layer VC, and, for example, can be formed by applying etching damage to the surface of the voltage clamp layer VC exposed from the bottom of the through-hole TH as described in the third embodiment.

Description of Manufacturing Method

Figure 44:
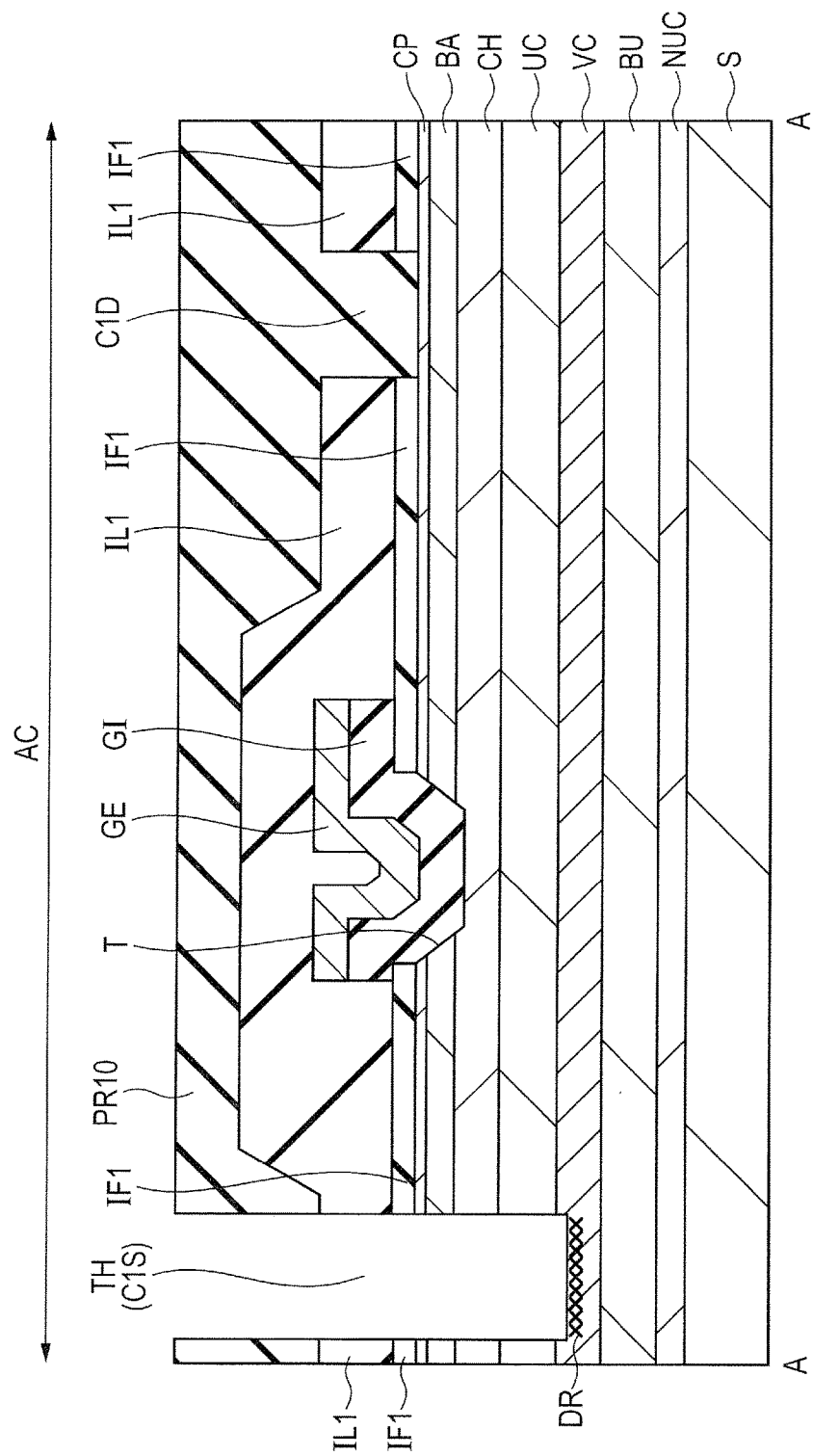
FIG. 44 is a sectional view illustrating a manufacturing process of the semiconductor device of the fourth embodiment.

A method of manufacturing the semiconductor device of the fourth embodiment is now described with reference to FIG. 44 while the configuration of the semiconductor device is further clarified. FIG. 44 is a sectional view illustrating a manufacturing process of the semiconductor device of the fourth embodiment.

First, as with the second embodiment, the gate electrode GE and the components thereon up to the interlayer insulating film IL1 are formed (FIGS. 29 to 32). The steps of forming the components are the same as those in the second embodiment. Subsequently, as with the second embodiment, the contact holes C1S and C1D in the interlayer insulating film IL1 are formed (FIG. 32).

Subsequently, as illustrated in FIG. 44, the through-hole TH is formed, and the defect region DR is formed in the voltage clamp layer VC exposed from the bottom of the through-hole TH.

A photoresist film PR10 having an opening in a through-hole formation region is formed on the interlayer insulating film IL1 including the inside of the contact hole C1D. Subsequently, as with the second embodiment, the cap layer CP, the barrier layer BA, the channel layer CH, the channel base layer UC, and the voltage clamp layer VC are each partially etched with the photoresist film PR10 as a mask to form the through-hole TH. In other words, there is formed the through-hole TH that extends to a certain depth of the voltage clamp layer VC through the cap layer CP, the barrier layer BA, the channel layer CH, and the channel base layer UC.

When a silicon oxide film is used as the interlayer insulating film IL1 while a silicon nitride film is used as the insulating film IF1, such films are first removed by dry etching using a dry etching gas containing a fluorine-based gas such as $SF_6$, for example. Subsequently, the cap layer CP, the barrier layer BA, the channel layer CH, and the channel base layer UC, and part of the voltage clamp layer VC are removed by dry etching using a dry etching gas containing a chlorine-based gas such as $BCl_3$, for example. As described in the third embodiment, the etching condition is adjusted, thereby crystal defects can be introduced into a surface portion of the voltage clamp layer VC exposed from the bottom of the through-hole T.

Subsequently, the photoresist film PR10 is removed. The cap layer CP is exposed from the bottom of the contact hole C1D formed in the above step, and the defect region DR is exposed from the bottom of the through-hole TH.

Subsequently, as with the second embodiment, the coupling VIA, the source electrode SE, the drain electrode DE, the source pad SP and the drain pad DP, and the protective film PRO are formed (FIGS. 42 and 43).

The semiconductor device of the fourth embodiment can be formed through the above-described steps. Such steps are merely shown as an example, and the semiconductor device of the fourth embodiment may be manufactured through other steps.

Thus, in the fourth embodiment, the voltage clamp layer VC as a conductive layer is provided between the buffer layer BU and the channel layer CH, and is coupled to the source electrode SE; hence, variations in characteristics of the semiconductor element can be decreased.

In the fourth embodiment, since the detect region (also referred to as hopping conduction region) DR is formed under the through-hole TH, a good contact can be provided between the coupling VIA and the voltage clamp layer VC. In particular, even if the p-type impurity concentration in the voltage clamp layer VC is controlled to be relatively low (for example, about $1\times10^{18}$ (1E18) $cm^{-3}$) to increase a drain breakdown voltage, a good contact can be provided between the coupling VIA and the voltage clamp layer VC.

In the fourth embodiment, since the coupling VIA is disposed within the active region AC allowing electron conduction, the voltage can be further effectively clamped.

Fifth Embodiment

Although the impurity region IR, in which the impurity having the deep acceptor level has been implanted, is provided only under the bottom of the coupling VIA in the first embodiment, the impurity region (also referred to as impurity layer) IR may be provided in the entire area of the surface portion of the voltage clamp layer VC.

A semiconductor device of a fifth embodiment is now described in detail with reference to the accompanying drawings.

Description of Structure

Figure 45:
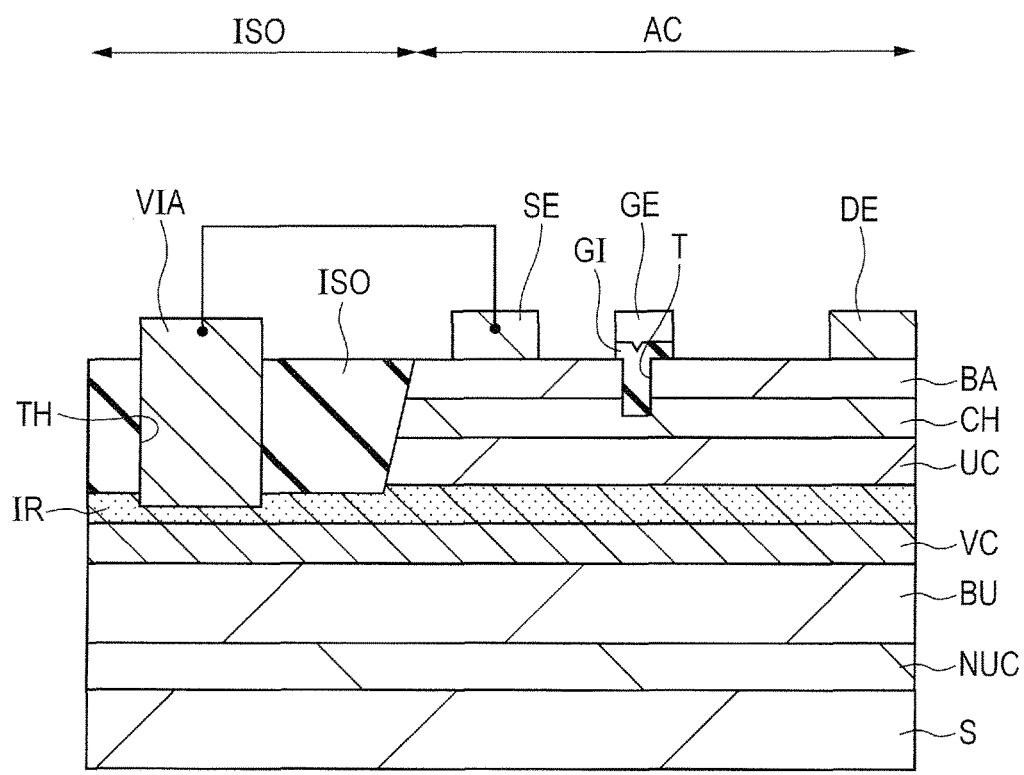
FIG. 45 is a sectional view schematically illustrating a configuration of a semiconductor device of a fifth embodiment.

FIG. 45 is a sectional view schematically illustrating a configuration of the semiconductor device of the fifth embodiment.

In the semiconductor device of the fifth embodiment, a nucleation layer NUC, a buffer layer BU, a voltage clamp layer VC, an impurity region IR, a channel base layer UC, a channel layer (also referred to as electron traveling layer) CH, and a barrier layer BA are provided in this order on a substrate S. The impurity region IR corresponds to a surface portion of the voltage clamp layer VC, in which an impurity having a deep acceptor level is introduced. The voltage clamp layer (first layer) VC and the impurity region (second layer) IR may be regarded as individual layers. Alternatively, the impurity region IR may be regarded as part of the voltage clamp layer VC. The semiconductor device of the fifth embodiment is similar to that of the first embodiment except for the configuration of the impurity region IR.

In the fifth embodiment, as with the first embodiment, a good contact can also be provided between the coupling VIA and the voltage clamp layer VC due to hopping conduction via the impurity having the deep acceptor level in the impurity region IR in contact with the bottom of the coupling VIA.

Figure 46:
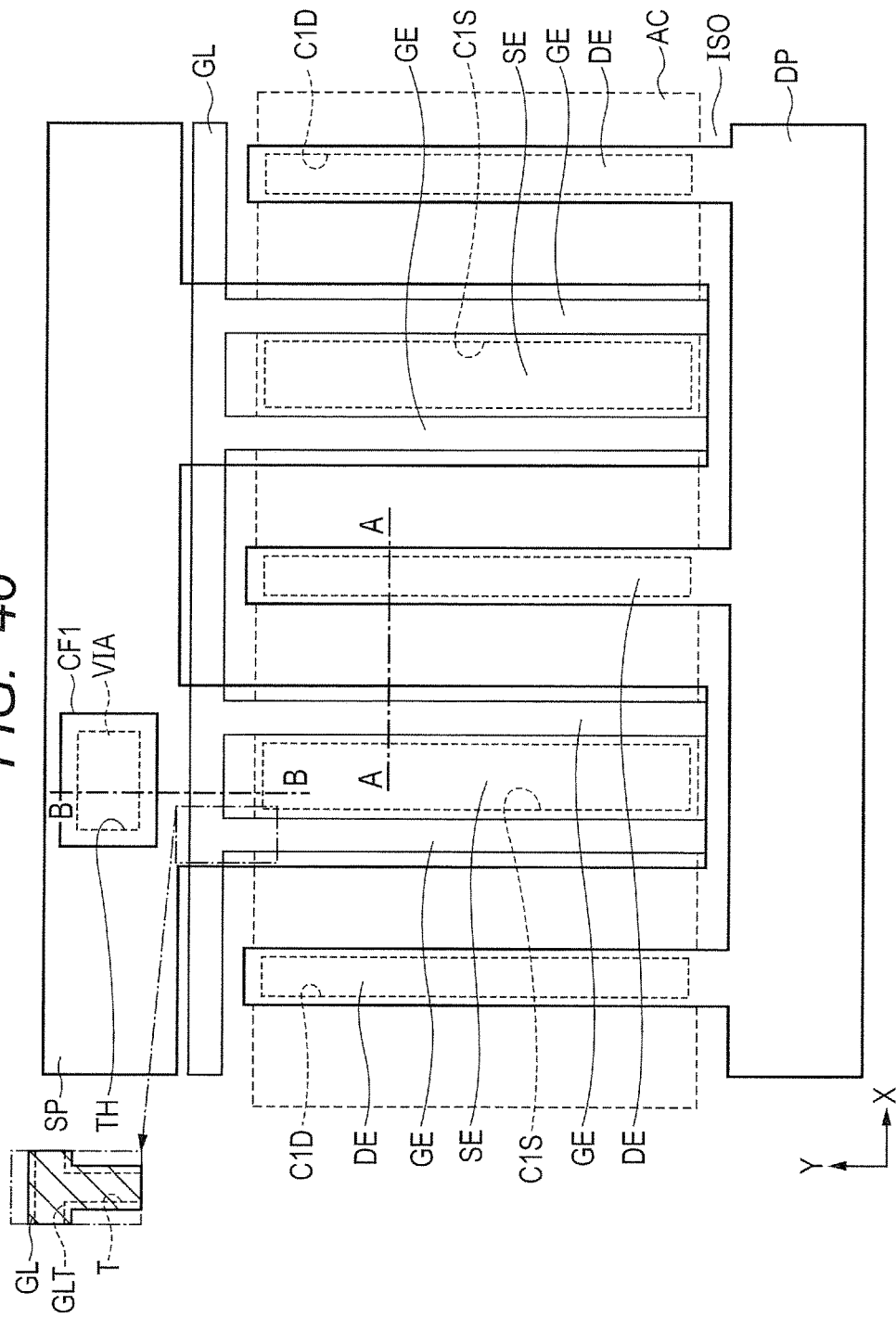
FIG. 46 is a plan view illustrating the configuration of the semiconductor device of the fifth embodiment.
Figure 47:
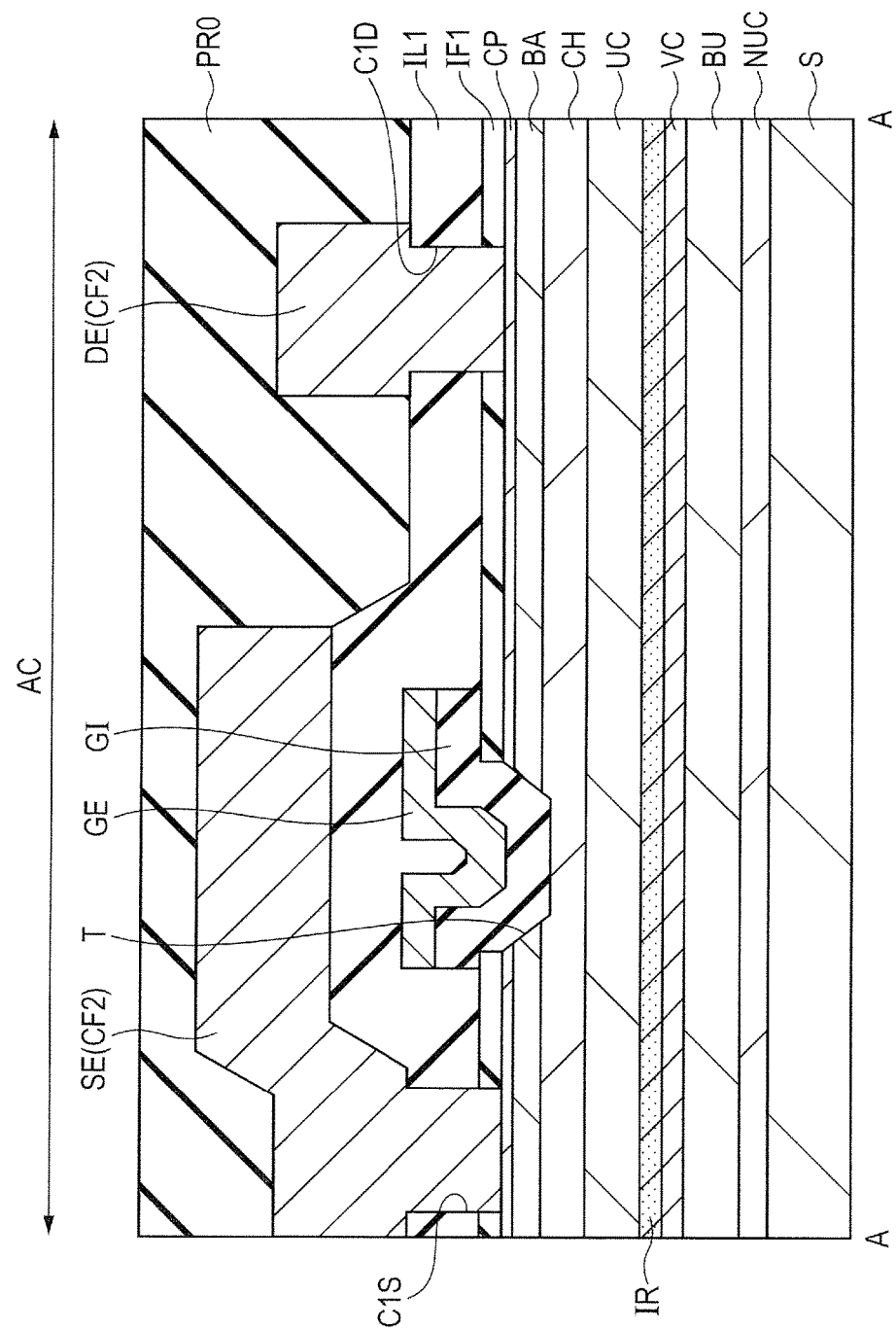
FIG. 47 is a sectional view illustrating the configuration of the semiconductor device of the fifth embodiment.
Figure 48:
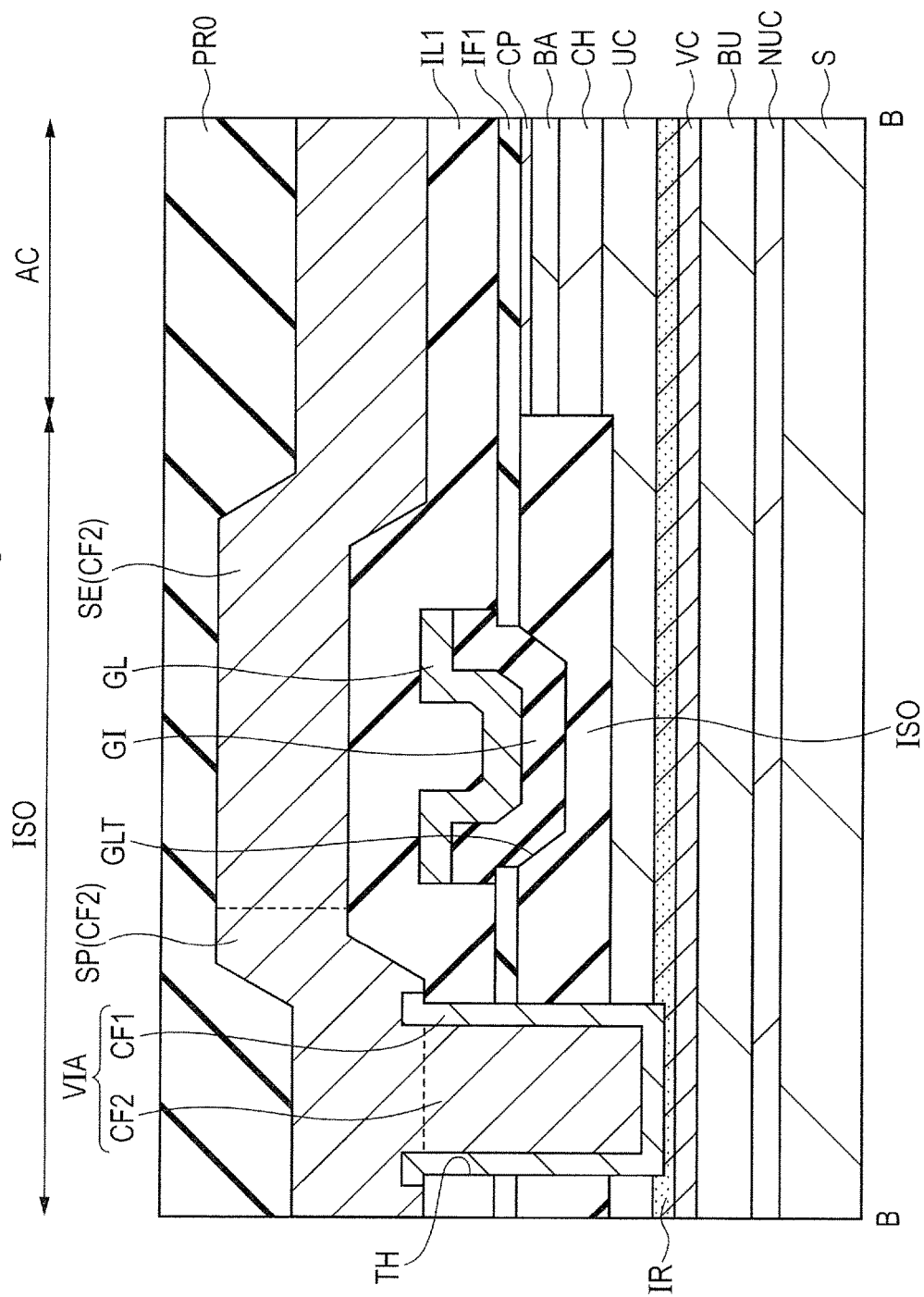
FIG. 48 is a sectional view illustrating the configuration of the semiconductor device of the fifth embodiment.

The semiconductor device of the fifth embodiment is described further in detail with reference to FIGS. 46 to 48. FIG. 46 is a plan view illustrating the configuration of the semiconductor device of the fifth embodiment. FIGS. 47 and 48 are each a sectional view illustrating the configuration of the semiconductor device of the fifth embodiment. FIG. 47 corresponds to a section along A-A in FIG. 46, and FIG. 48 corresponds to a section along B-B in FIG. 46. The semiconductor device of the fifth embodiment is similar to that of the first embodiment except for the configuration of the impurity region IR under the coupling VIA; hence, detailed description of the configurations similar to those in the first embodiment is omitted.

The plan view of FIG. 46 shows a configuration of the semiconductor device similar to that of the semiconductor device of the first embodiment (FIG. 2) except for the formation region of the impurity region IR. Specifically, a plurality of linable drain electrodes DE are disposed in an X direction with a certain interval. A plurality of linable source electrodes SE are disposed in the X direction with a certain interval. The source electrodes SE and the drain electrodes DE are alternately disposed along the X direction.

A contact hole C1D as a coupling between the drain electrode DE and a cap layer CP (the barrier layer BA) is disposed under the drain electrode DE. A contact hole C1S as a coupling between the source electrode SE and the cap layer CP (the barrier layer BA) is disposed under the source electrode SE (FIG. 47).

A gate electrode GE is disposed between the contact hole C1D under the drain electrode DE and the contact hole C1S under the source electrode SE. Two (a pair of) gate electrodes GE are disposed below one source electrode SE. The two gate electrodes GE are disposed on the two respective sides of the contact hole C1S under the source electrode SE. In this way, the two gate electrodes GE are disposed for each of the source electrodes SE.

The drain electrodes DE are coupled to one another by a drain pad (also referred to as terminal section) DP, and the source electrodes SE are coupled to one another by a source pad (also referred to as terminal section) SP. The gate electrodes GE are coupled to one another by a gate line GL. The gate line GL is coupled to an undepicted gate pad provided on either side (each of the right and left sides in FIG. 46) in the X direction of the gate line GL.

The source electrodes SE, the drain electrodes DE, and the gate electrodes GE are largely disposed on the active region AC enclosed by the device isolation region ISO. The active region AC has a planar shape being a rectangular shape having a long side in the X direction. The drain pad DP, the gate line GL, and the source pad. SP are disposed on the device isolation region ISO. The gate line GL is disposed between the active region AC and the source pad SP (FIG. 48).

A through-hole (also referred to as via) TH is disposed under the source pad SP. The through-hole TH is filled with conductive films (CF1, CF2) to form the coupling VIA. The coupling VIA is electrically coupled to the voltage clamp layer VC. Hence, the source electrode SE is electrically coupled to the voltage clamp layer VC via the source pad SP and the coupling VIA. The impurity region IR is disposed under the coupling VIA. To put it differently, the impurity region IR is disposed in the vicinity of the boundary between the coupling VIA and the voltage clamp layer VC. In other words, the coupling VIA is electrically coupled to the voltage clamp layer VC via the impurity region IR.

For example, the impurity region IR is provided over the entire area of the surface portion of the voltage clamp layer VC. For example, the impurity region IR can be formed of a nitride semiconductor layer that has been heteroepitaxially grown while being doped with an impurity having a deep acceptor level.

A protective film (also referred to as insulating film, cover film, or surface protective film) PRO is disposed over the source electrode SE and the drain electrode DE.

The constitutional materials of the substrate S, the nucleation layer NUC, the buffer layer BU, the voltage clamp layer VC, the channel base layer UC, the channel layer (also referred to as electron traveling layer) CH, the barrier layer BA, the cap layer CP, and the insulating film IF1 are the same as those described in the first embodiment.

The constitutional materials of the gate insulating film GI, the gate electrode GE, the interlayer insulating film IL1, and the protective film PRO are the same as those described in the first embodiment.

The constitutional materials of the source electrode SE, the drain electrode DE, the source pad. SP, the drain pad DP, and the coupling VIA are the same as those described in the first embodiment.

Description of Manufacturing Method

A method of manufacturing the semiconductor device of the fifth embodiment is now described with reference to FIGS. 49 to 55 while the configuration of the semiconductor device is further clarified. FIGS. 49 to 55 are sectional views illustrating a manufacturing process of the semiconductor device of the fifth embodiment.

Figure 49:
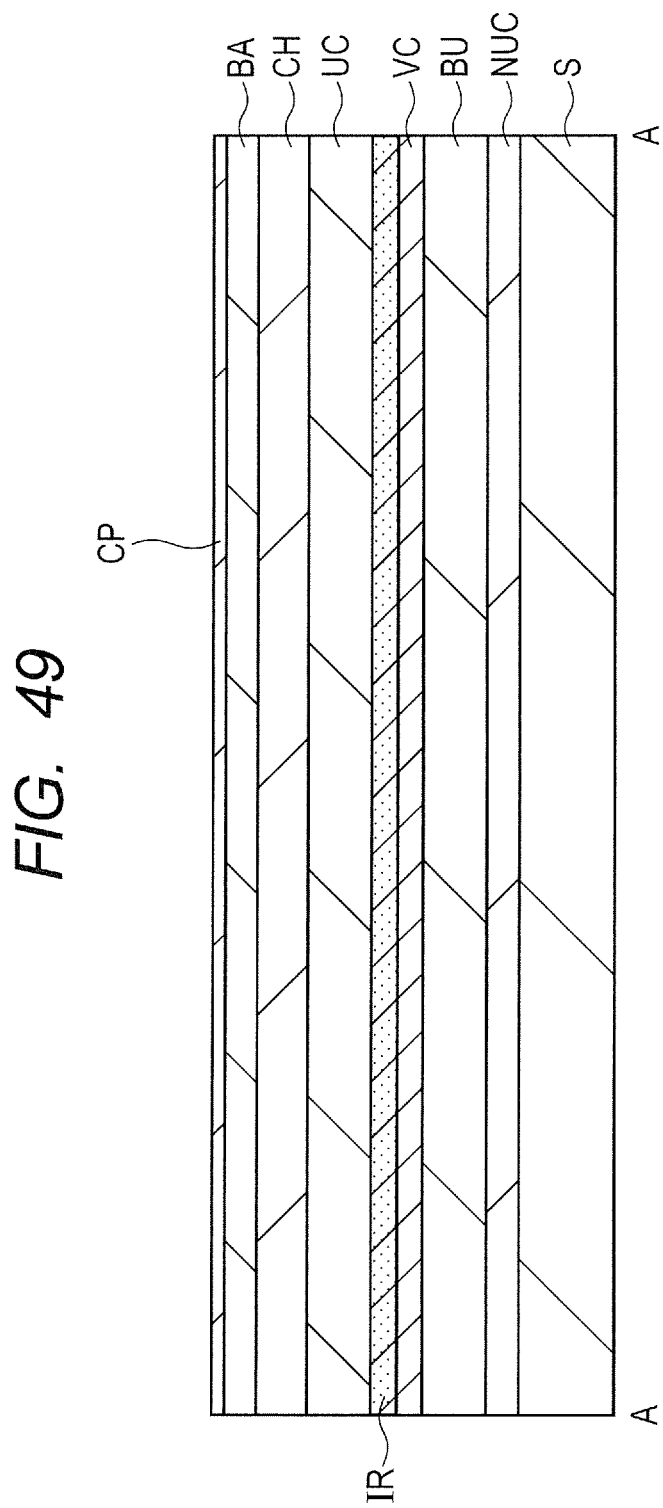
FIG. 49 is a sectional view illustrating a manufacturing process of the semiconductor device of the fifth embodiment.

As with the first embodiment, the nucleation layer NUC and the buffer layer BU are sequentially formed on the substrate S (FIG. 49). Furthermore, for example, an AlGaN layer (p-AlGaN layer) containing a p-type impurity is heteroepitaxially grown as the voltage clamp layer VC on the buffer layer BU using the metal organic chemical vapor deposition process or the like. For example, magnesium (Mg) is used as the p-type impurity. For example, a gallium nitride layer is deposited about 200 nm while being doped with magnesium (Mg). During the magnesium (Mg) doping, the gallium nitride layer is deposited while being doped with an impurity (in this exemplary case, carbon (C)) having an acceptor level deeper than that of the p-type impurity. Consequently, the impurity region IR is formed on the voltage clamp layer VC. To put it differently, the impurity region IR is formed in the surface portion of the voltage clamp layer VC. The Mg concentration in the deposited film is about $5\times10^{18}$ (5E18) $cm^{-3}$, for example. The concentration of the impurity (in this exemplary case, carbon (C)) having the deep acceptor level in the impurity region IR is about $1\times10^{19}$ (1E19) $cm^{-3}$, for example. The thickness of the impurity region IR is 100 nm or less.

Subsequently, as with the first embodiment, the channel base layer UC, the channel layer CH, the barrier layer BA, and the cap layer CP are sequentially formed on the impurity region IR.

Figure 50:
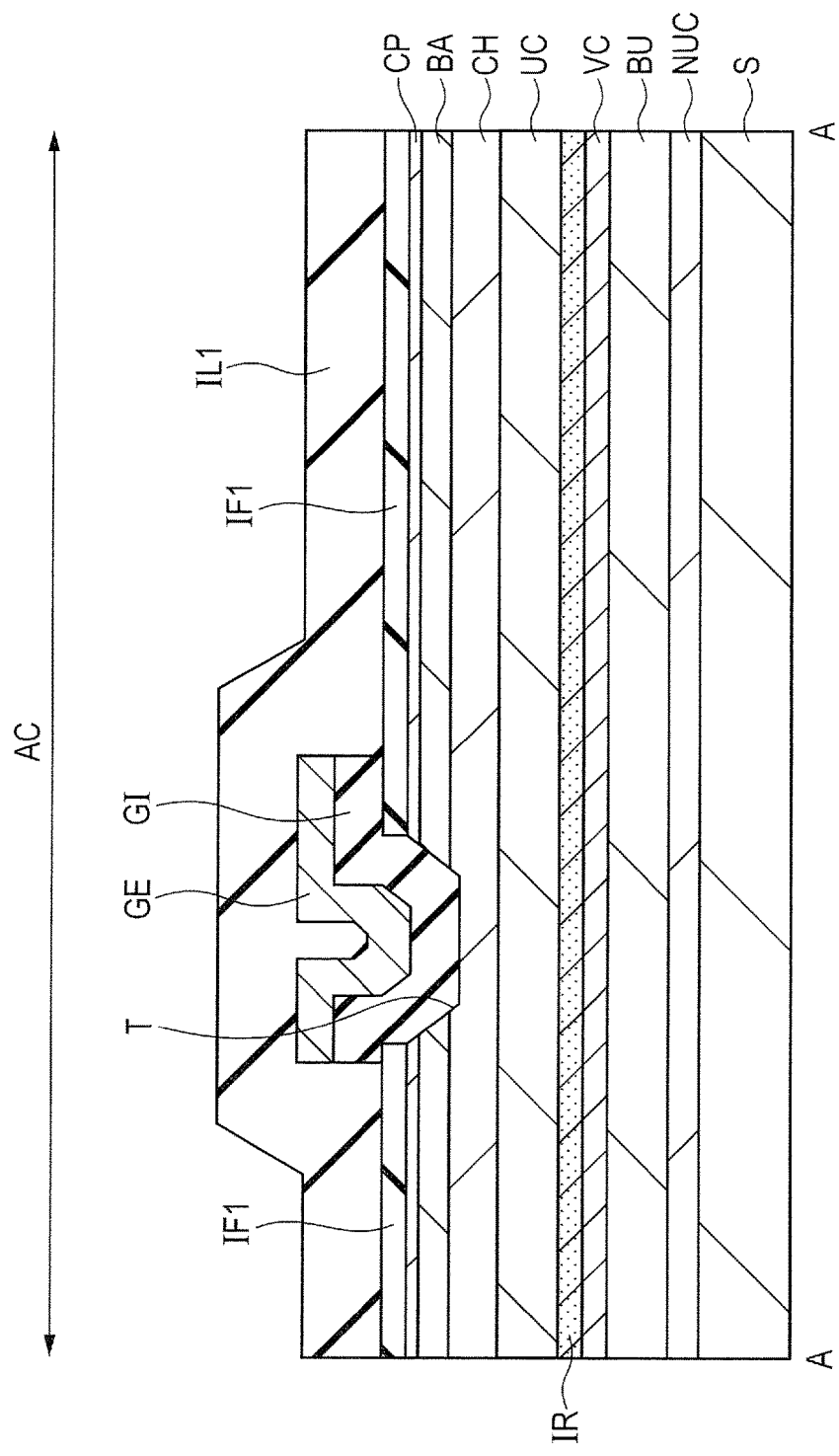
FIG. 50 is a sectional view illustrating the manufacturing process of the semiconductor device of the fifth embodiment, showing a step following FIG. 49.
Figure 51:
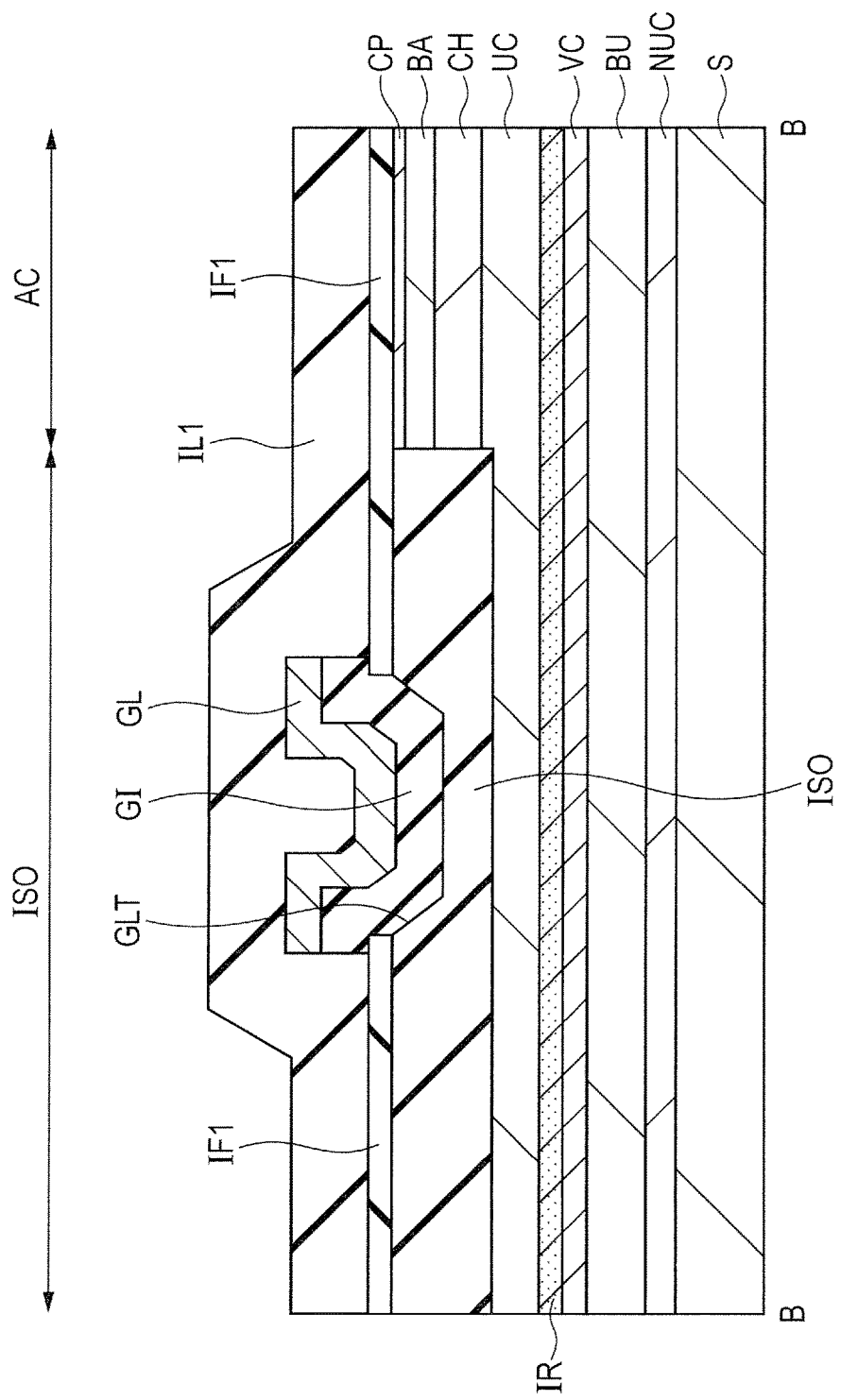
FIG. 51 is a sectional view illustrating a manufacturing process of the semiconductor device of the fifth embodiment.

Subsequently, as with the first embodiment, the insulating film IF1 is formed on the cap layer CP, and then a device isolation region (ISO) is formed. Subsequently, a trench T and the like are formed, and the gate electrode GE is formed on the insulating film IF1 including the inside of the trench T with the gate insulating film GI in between. Subsequently, as with the first embodiment, the interlayer insulating film IL1 is formed (FIGS. 50 and 51).

Figure 52:
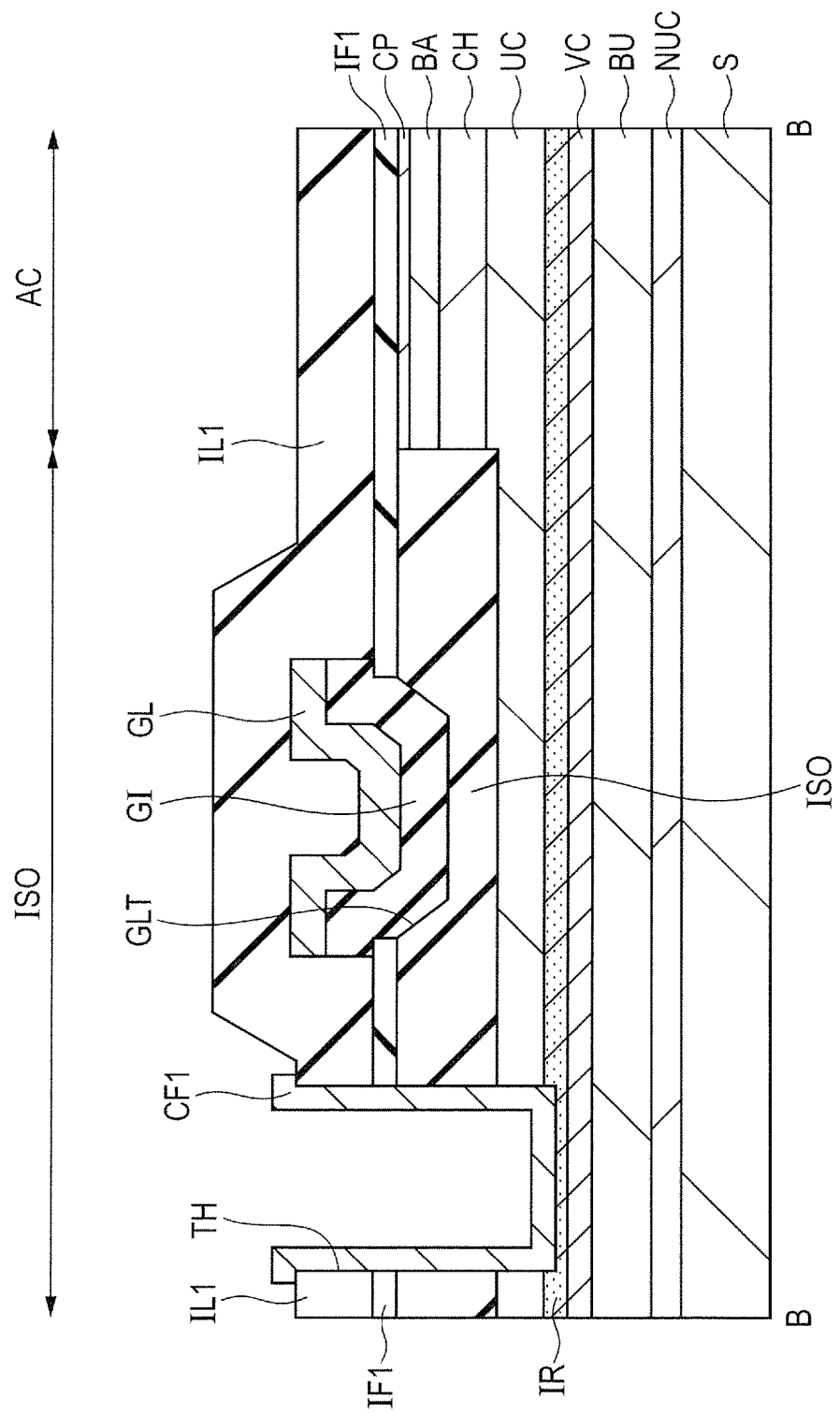
FIG. 52 is a sectional view illustrating the manufacturing process of the semiconductor device of the fifth embodiment, showing a step following FIG. 50.

Subsequently, as illustrated in FIG. 52, the through-hole TH is formed using a photolithography technique and an etching technique. The through-hole TH extends to the underlying impurity region IR. The through-hole TH is provided in a source pad formation region.

For example, an undepicted, first photoresist film having an opening in a through-hole formation region is formed on the interlayer insulating film IL1. Subsequently, the interlayer insulating film IL1, the insulating film IF1, the device isolation region ISO, the channel base layer UC, and the impurity region IR are each partially etched with the first photoresist film as a mask to form the through-hole TH. In other words, there is formed the through-hole TH that extends to a certain depth of the impurity region IR through the interlayer insulating film IL1, the insulating film IF1, the device isolation region ISO, and the channel base layer UC.

As described above, the etching is performed such that the bottom of the through-hole TH is located within the impurity region IR and below the bottom of the device isolation region ISO.

When a silicon oxide film is used as the interlayer insulating film IL1 while a silicon nitride film is used as the insulating film IF1, such films are first removed by dry etching using a dry etching gas containing a fluorine-based gas such as $SF_6$, for example. Subsequently, the device isolation region ISO, the channel base layer (AlGaN layer) UC, and a certain depth of the impurity region (AlGaN layer containing C) IR are removed by dry etching using a dry etching gas containing a chlorine-based gas such as $BCl_3$, for example.

Subsequently, the photoresist film is removed, and the conductive film CF1 is formed on the interlayer insulating film IL1 including the inside of the through-hole TH. For example, a Ni film is deposited as the conductive film CF1 about 50 nm by a magnetron sputter process. Subsequently, an undepicted photoresist film having an opening slightly larger than the through-hole formation region is formed, and the conductive film CF1 is etched with the photoresist film as a mask. For example, the conductive film CF1 is wet-etched by a solution containing HCl. This results in formation of the conductive film CF1 (also referred to as through-hole electrode or through-hole base electrode) covering the sidewalls and the bottom of the through-hole TH and the interlayer insulating film IL1 in the periphery of the through-hole TH. Subsequently, the photoresist film is removed.

Figure 53:
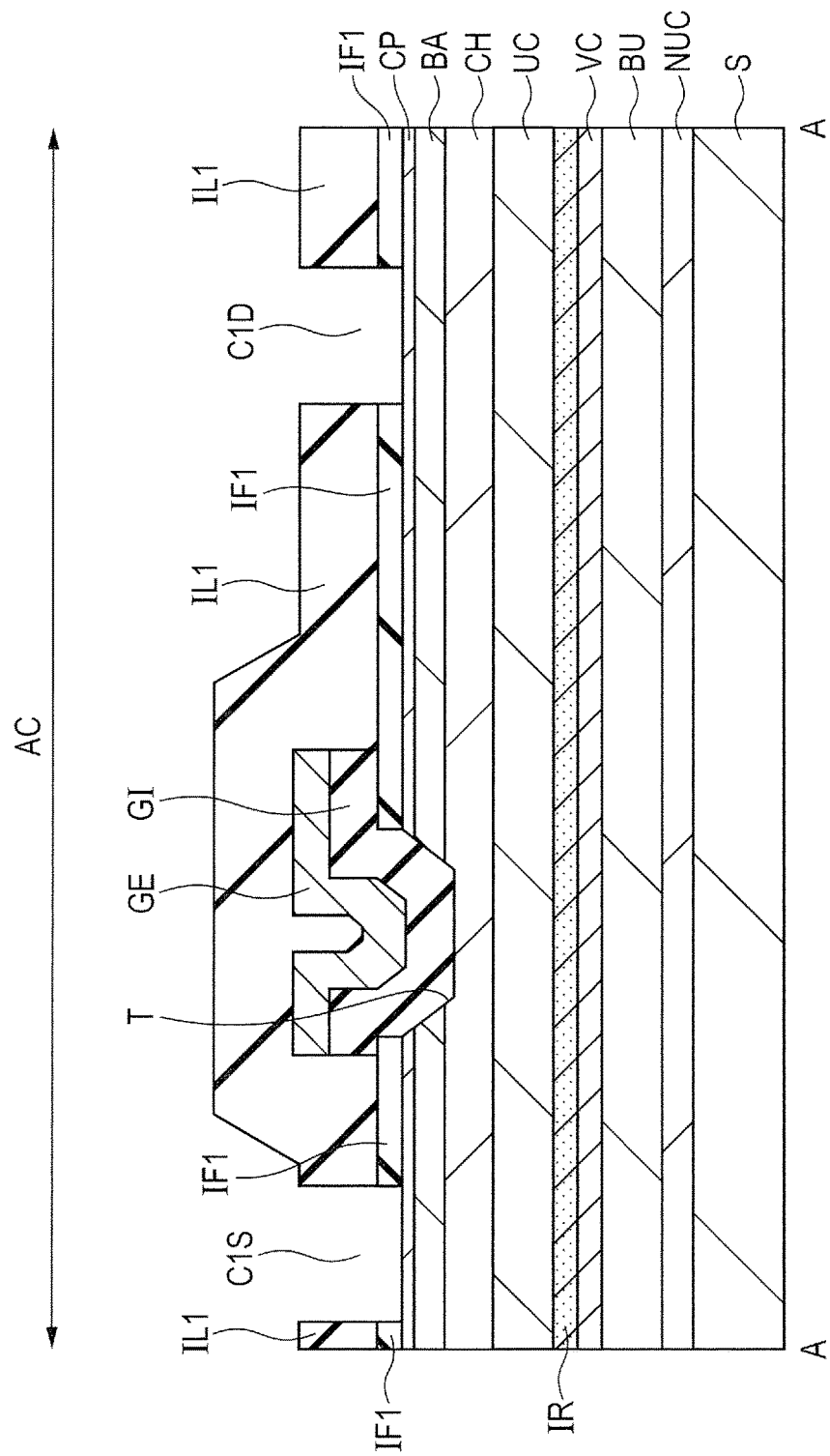
FIG. 53 is a sectional view illustrating the manufacturing process of the semiconductor device of the fifth embodiment, showing a step following FIG. 50.

Subsequently, as illustrated in FIG. 53, the contact holes C1S and C1D are formed in the interlayer insulating film IL1 and the insulating film IF1 using a photolithography technique and an etching technique.

For example, an undepicted second photoresist film having an opening in each of a source electrode coupling region and a drain electrode coupling region is formed on the interlayer insulating film IL1. Subsequently, the interlayer insulating film IL1 and the insulating film IF1 are etched with the second photoresist film as a mask, so that the contact holes C1S and C1D are formed. The cap layer CP is exposed from the bottom of each of the contact holes C1S and C1D formed in the above step, and the conductive film CF1 is exposed from the bottom of the through-hole TH.

The formation order of the contact hole C1D and the through-hole TH is not limited to the above-described order.

Figure 54:
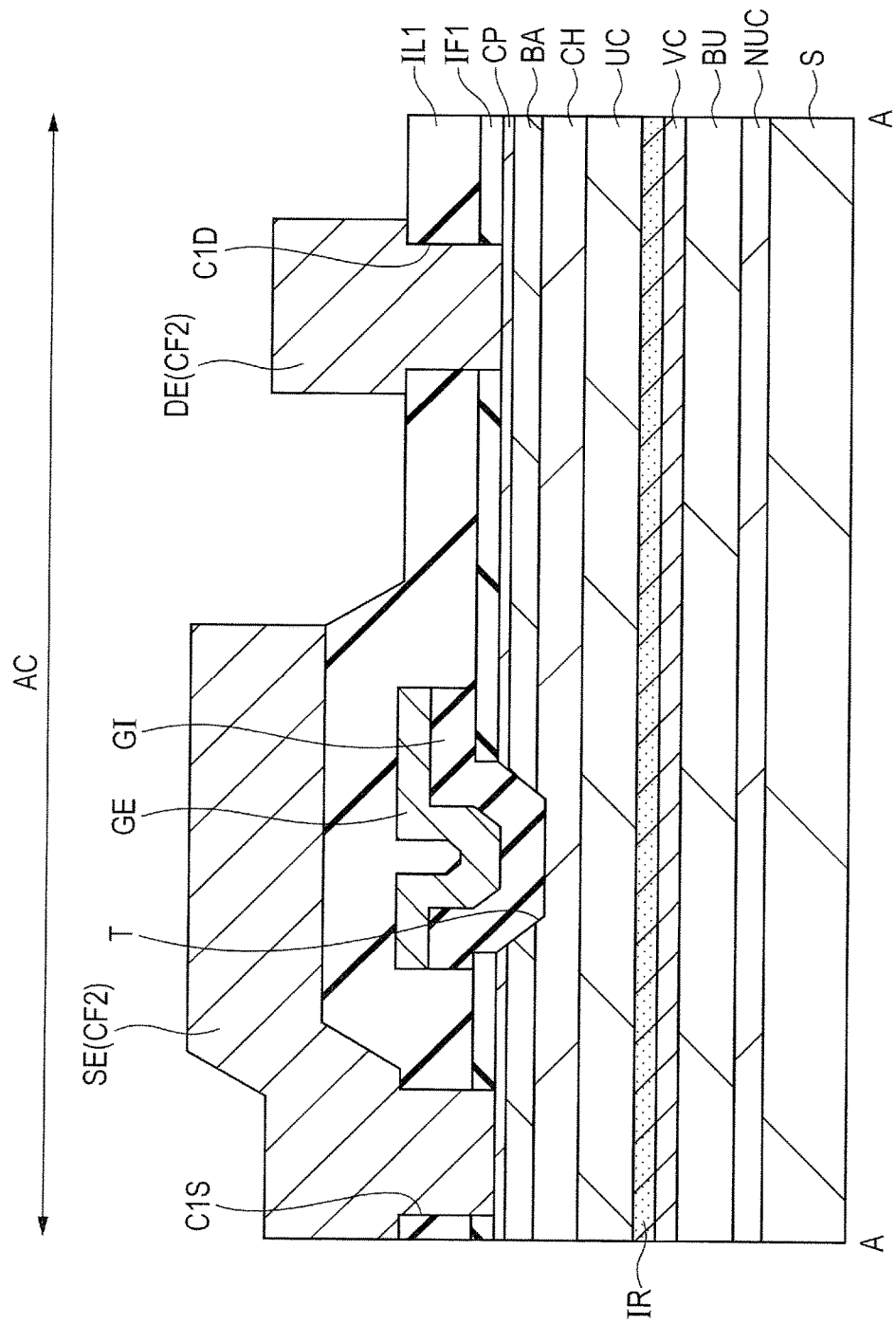
FIG. 54 is a sectional view illustrating the manufacturing process of the semiconductor device of the fifth embodiment, showing a step following FIG. 53.
Figure 55:
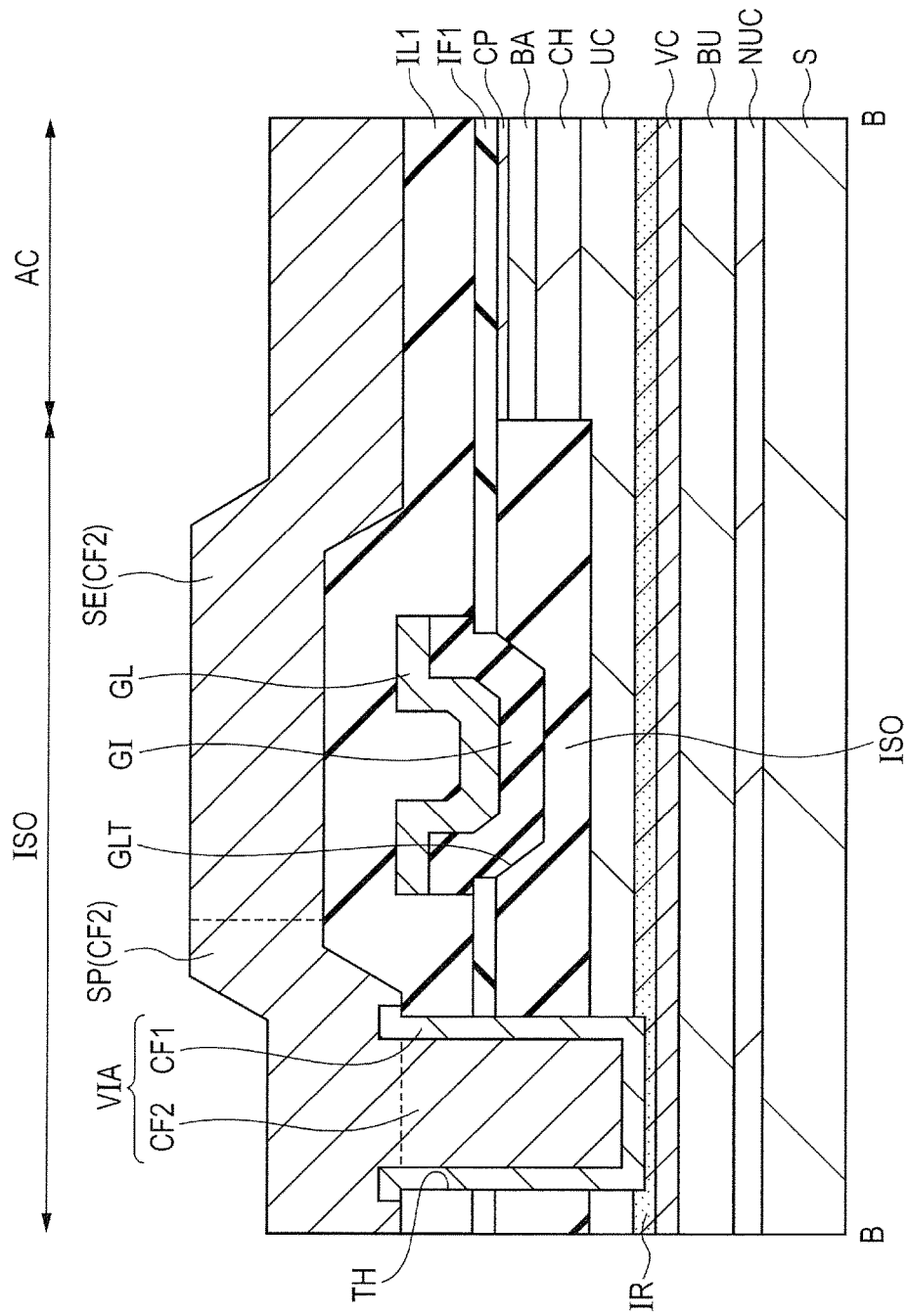
FIG. 55 is a sectional view illustrating the manufacturing process of the semiconductor device of the fifth embodiment, showing a step following FIG. 52.

Subsequently, as illustrated in FIGS. 54 and 55, as with the first embodiment, the conductive film CF2 is formed and patterned, thereby the source electrode SE and the drain electrode DE are formed on the cap layer CP on the two respective sides of the gate electrode GE, and the coupling VIA is formed. The source pad SP is formed at the end of the source electrode SE, and the drain pad DP is formed at the end of the drain electrode DE. As with the first embodiment, such pads can be formed by forming and patterning the conductive film CF2. Thus, the through-hole TH is located under the source pad SP, and the impurity region IR is located under bottom of the through-hole TH. The source pad SP is electrically coupled to the voltage clamp layer VC via the coupling VIA and the impurity region IR.

Subsequently, the protective film PRO is formed on the interlayer insulating film IL1 including the surfaces of the source electrode SE, the drain electrode DE, the source pad SP, and the drain pad DP. For example, a silicon oxynitride (SiON) film is formed as the protective film PRO on the interlayer insulating film IL1 including the surfaces of the source electrode SE, the drain electrode DE, the source pad SP, and the drain pad DP (FIGS. 46 to 48).

The semiconductor device of the fifth embodiment can be formed through the above-described steps. Such steps are merely shown as an example, and the semiconductor device of the fifth embodiment may be manufactured through other steps.

Thus, in the fifth embodiment, the voltage clamp layer VC as a conductive layer is provided between the buffer layer BU and the channel layer CH, and is coupled to the source electrode SE; hence, variations in characteristics of the semiconductor element can be decreased.

In the fifth embodiment, since the through-hole TH that extends to the impurity region (impurity layer) IR is provided, the impurity region IR is disposed under the bottom of the through-hole TH, and a good contact can be provided between the coupling VIA and the voltage clamp layer VC. In particular, even if the p-type impurity concentration in the voltage clamp layer VC is controlled to be relatively low (for example, about $1\times10^{18}$ (1E18) $cm^{-3}$) to increase a drain breakdown voltage, a good contact can be provided between the coupling VIA and the voltage clamp layer VC.

In the fifth embodiment, since the coupling VIA in the through-hole TH is disposed within the device isolation region ISO outside of the active region AC allowing electron conduction and under the formation region of the source pad SP, small size and a high degree of integration of the semiconductor element can be achieved. In addition, since a large active region AC allowing electron conduction can be provided, on resistance per area can be reduced.

Sixth Embodiment

Although the coupling VIA is provided in the device isolation region ISO in the fifth embodiment, the coupling VIA may be provided in the active region. AC. For example, the coupling VIA is provided under the source electrode SE in a sixth embodiment.

A semiconductor device of the sixth embodiment is now described in detail with reference to the accompanying drawings.

Description of Structure

Figure 56:
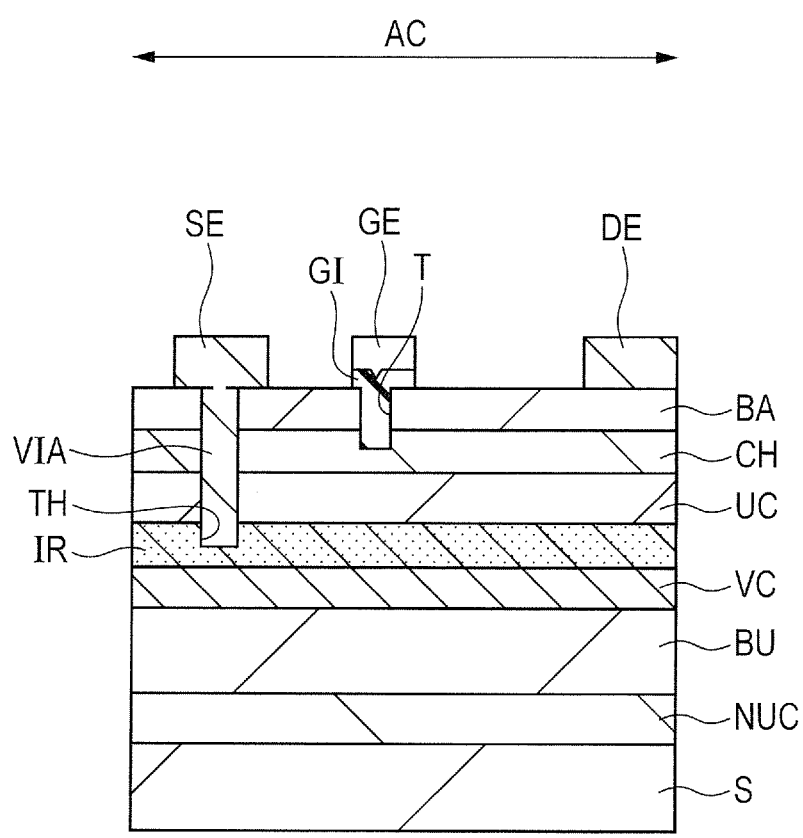
FIG. 56 is a sectional view schematically illustrating a configuration of a semiconductor device of a sixth embodiment.

FIG. 56 is a sectional view schematically illustrating a configuration of the semiconductor device of the sixth embodiment. The semiconductor device of the sixth embodiment has a configuration similar to that of the semiconductor device of the fifth embodiment except for a formation position of the coupling VIA.

As illustrated in FIG. 56, in the sixth embodiment, a coupling (also referred to as via) VIA, which extends through the barrier layer BA, the channel layer CH, and the channel base layer UC to the further underlying impurity region IR, is provided under the source electrode SE in the active region AC. The coupling VIA is electrically coupled to the source electrode SE. The impurity region IR is provided over the entire area of the surface portion of the voltage clamp layer VC. The coupling VIA is coupled to the voltage clamp layer VC via the impurity region IR.

The voltage clamp layer VC is thus provided and coupled to the source electrode SE, thereby variations in characteristics such as threshold potential and on resistance can be decreased as described in detail in the first embodiment. In addition, since the coupling VIA is disposed in the active region AC allowing electron conduction, the voltage can be further effectively clamped.

The impurity region IR is provided under the coupling VIA, thereby a good contact can be provided between the coupling VIA and the voltage clamp layer VC due to hopping conduction as described in detail in the second embodiment.

Figure 57:
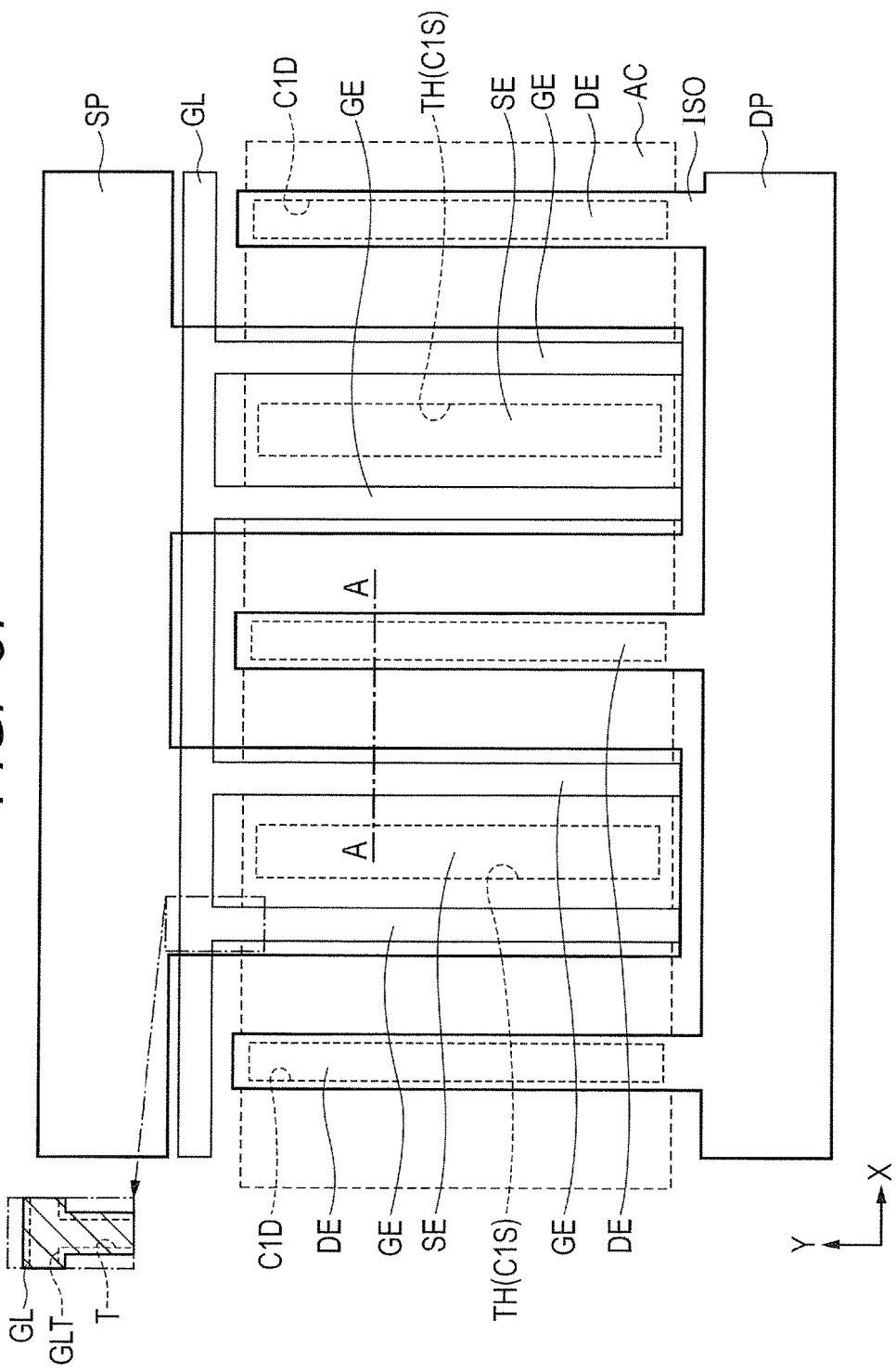
FIG. 57 is a plan view illustrating the configuration of the semiconductor device of the sixth embodiment.
Figure 58:
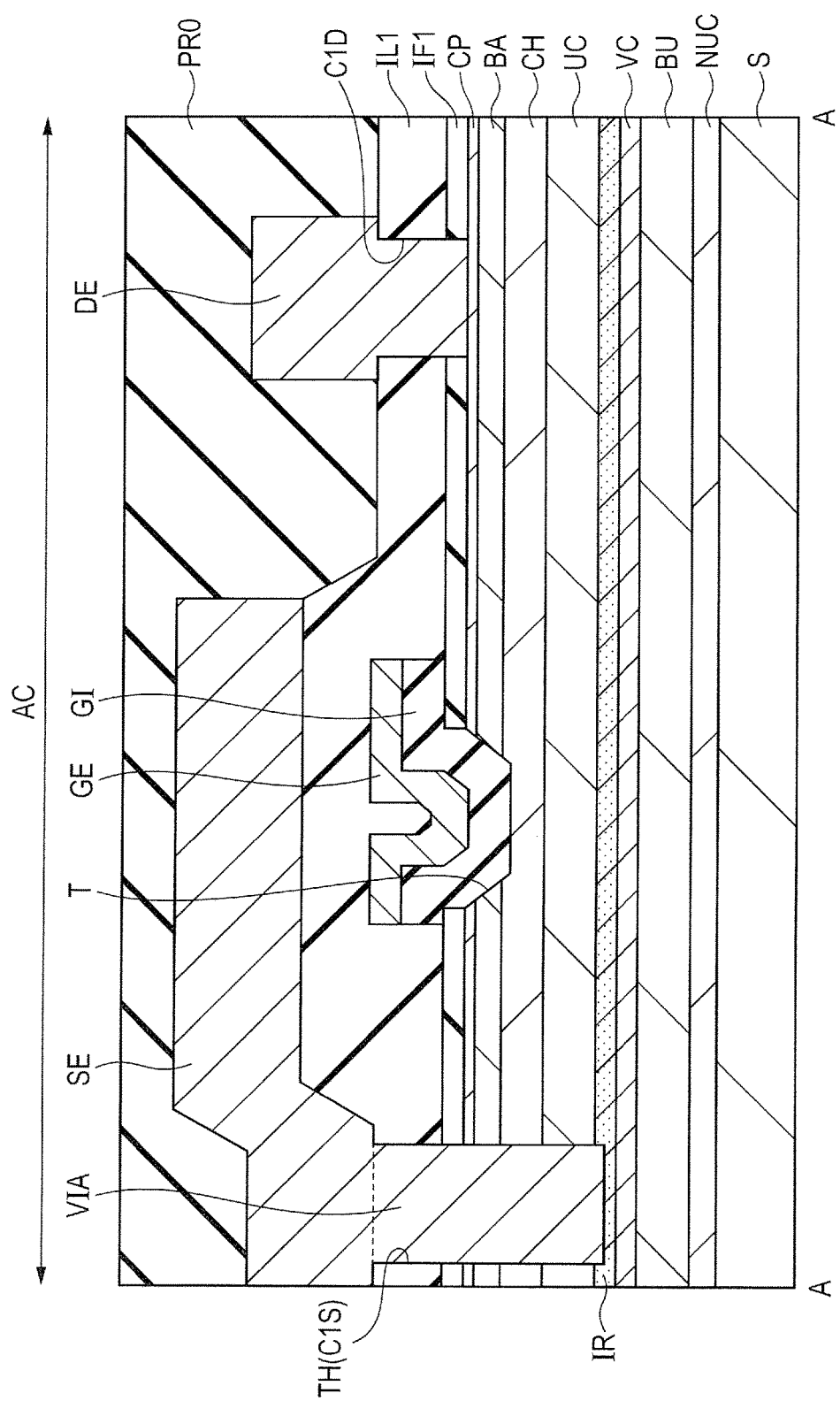
FIG. 58 is a sectional view illustrating the configuration of the semiconductor device of the sixth embodiment.

The semiconductor device of the sixth embodiment is described further in detail with reference to FIGS. 57 and 58. FIG. 57 is a plan view illustrating the configuration of the semiconductor device of the sixth embodiment. FIG. 58 is a sectional view illustrating the configuration of the semiconductor device of the sixth embodiment. The semiconductor device of the sixth embodiment is similar to that of the fifth embodiment except for a formation position of the coupling VIA.

As illustrated in FIGS. 57 and 58, a through-hole TH is disposed under the source electrode SE. The through-hole TH is filled with a conductive film to form the coupling VIA. The coupling VIA is electrically coupled to the voltage clamp layer VC. Hence, the source electrode SE is electrically coupled to the voltage clamp layer VC via the coupling VIA. The impurity region IR is disposed under the coupling VIA. To put it differently, the impurity region IR is disposed in the vicinity of the boundary between the coupling VIA and the voltage clamp layer VC. In other words, the coupling VIA is coupled to the voltage clamp layer VC via the impurity region IR.

For example, the impurity region IR is provided over the entire area of the surface portion of the voltage clamp layer VC. For example, the impurity region IR can be formed of a nitride semiconductor layer that has been heteroepitaxially grown while being doped with an impurity having a deep acceptor level.

A protective film PRO is disposed over the source electrode SE and the drain electrode DE.

The constitutional materials of the substrate S, the nucleation layer NUC, the buffer layer BU, the voltage clamp layer VC, the channel base layer UC, the channel layer (also referred to as electron traveling layer) CH, the barrier layer BA, the cap layer CP, and the insulating film IF1 are the same as those described in the first embodiment.

The constitutional materials of the gate insulating film GI, the gate electrode GE, the interlayer insulating film IL1, and the protective film PRO are the same as those described in the first embodiment.

The constitutional materials of the source electrode SE, the drain electrode DE, the source pad SP, the drain pad DP, and the coupling VIA are the same as those described in the first embodiment.

Description of Manufacturing Method

A method of manufacturing the semiconductor device of the sixth embodiment is now described with reference to FIGS. 59 to 63 while the configuration of the semiconductor device is further clarified. FIGS. 59 to 63 are sectional views illustrating a manufacturing process of the semiconductor device of the sixth embodiment.

Figure 59:
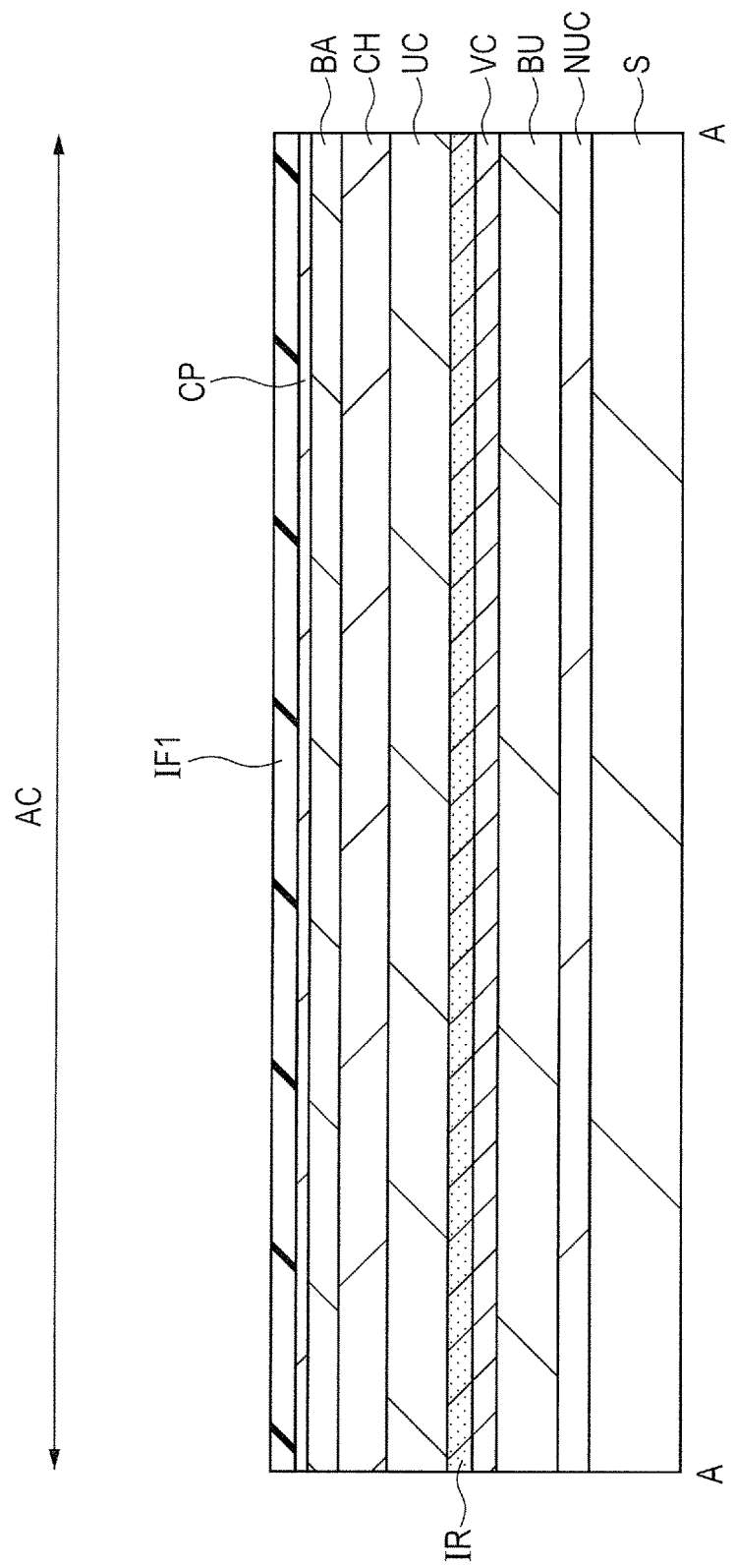
FIG. 59 is a sectional view illustrating a manufacturing process of the semiconductor device of the sixth embodiment.

As with the first embodiment, the nucleation layer NUC and the buffer layer BU are sequentially formed on the substrate S (FIG. 59). Furthermore, for example, an AlGaN layer (p-AlGaN layer) containing a p-type impurity is heteroepitaxially grown as the voltage clamp layer VC on the buffer layer BU using the metal organic chemical vapor deposition process or the like. For example, magnesium (Mg) is used as the p-type impurity. For example, a gallium nitride layer is deposited about 200 nm while being doped with magnesium (Mg). During magnesium the (Mg) doping, the gallium nitride layer is deposited while being doped with an impurity (in this exemplary case, carbon (C)) having an acceptor level deeper than that of the p-type impurity. Consequently, the impurity region IR is formed on the voltage clamp layer VC. To put it differently, the impurity region IR is formed in the surface portion of the voltage clamp layer VC. The Mg concentration in the deposited film is about $1 \times 10^{18}$ (1E18) cm$^{-3}$, for example. The concentration of the impurity (in this exemplary case, carbon (C)) having the deep acceptor level in the impurity region IR is about $5 \times 10^{18}$ (5E18) cm$^{-3}$, for example. The thickness of the impurity region IR is 200 nm or less.

Subsequently, as with the first embodiment, the channel base layer UC, the channel layer CH, the barrier layer BA, and the insulating film IF1 are sequentially formed on the impurity region IR.

Figure 60:
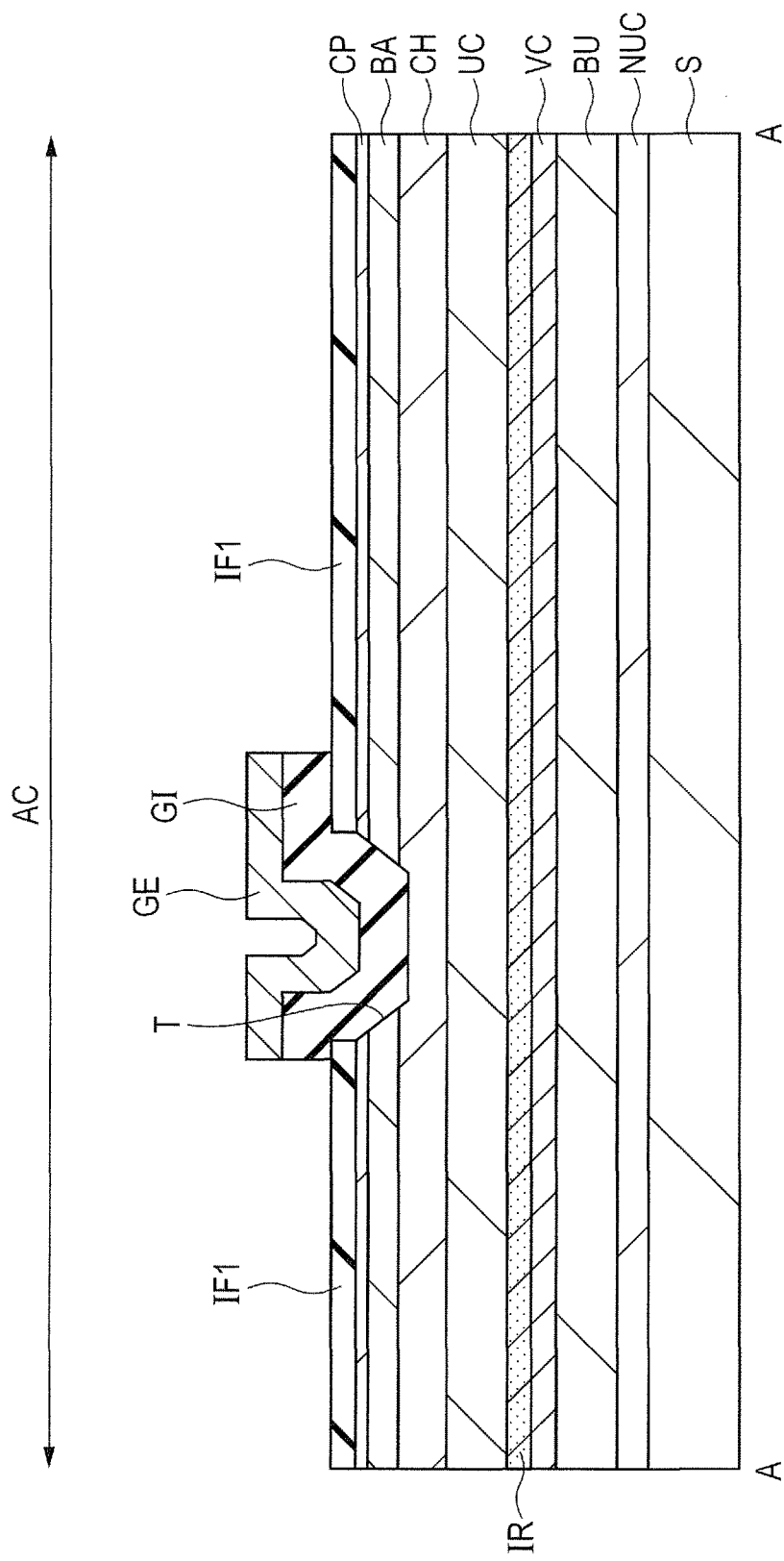
FIG. 60 is a sectional view illustrating the manufacturing process of the semiconductor device of the sixth embodiment, showing a step following FIG. 59.

Subsequently, as with the first embodiment, the insulating film IF1 is formed on the cap layer CP, and then a device isolation region (ISO) is formed. Subsequently, a trench T and the like are formed, and the gate electrode GE is formed on the insulating film IF1 including the inside of the trench T with the gate insulating film GI in between (FIG. 60).

Figure 61:
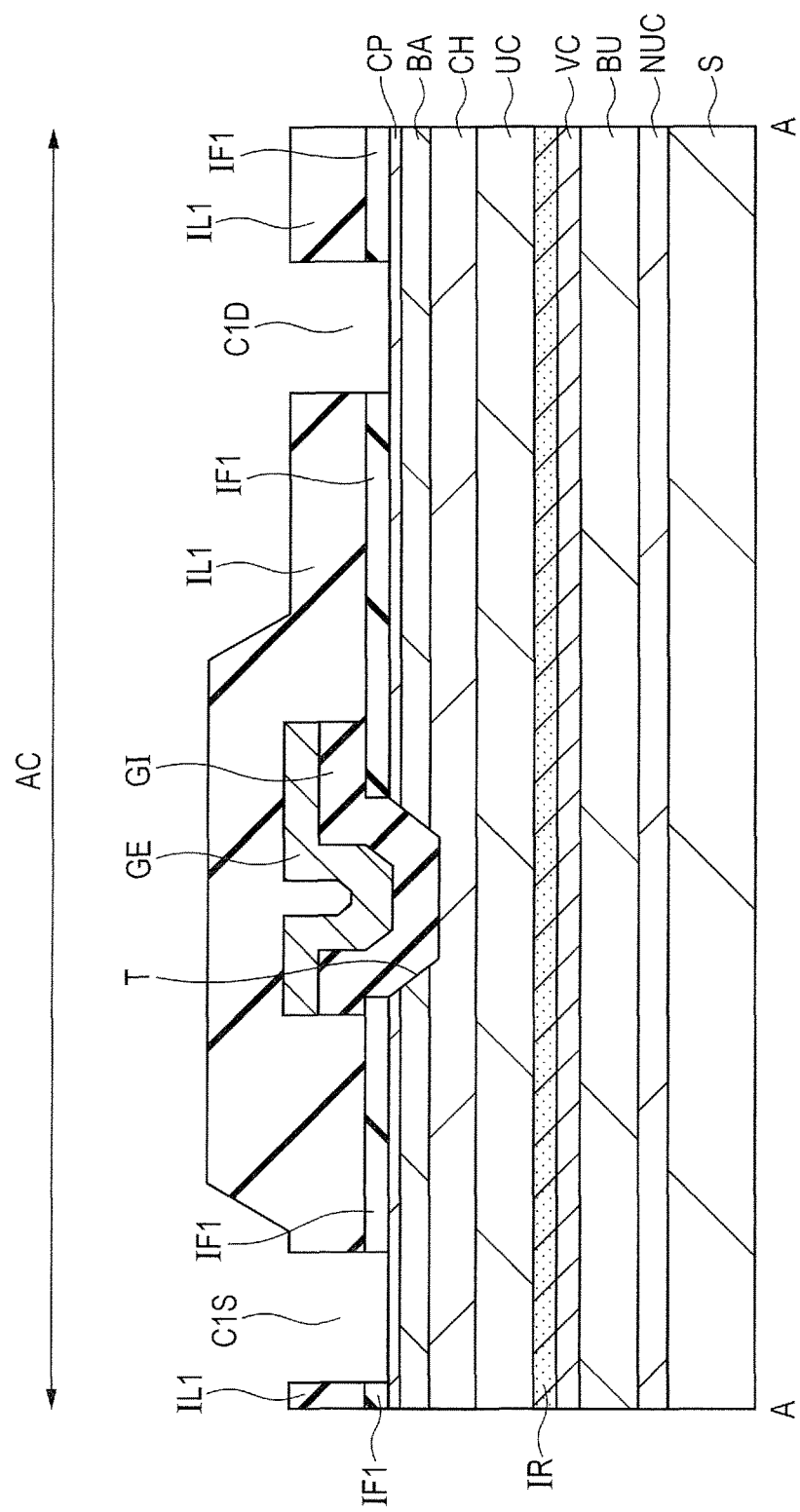
FIG. 61 is a sectional view illustrating the manufacturing process of the semiconductor device of the sixth embodiment, showing a step following FIG. 60.
Figure 62:
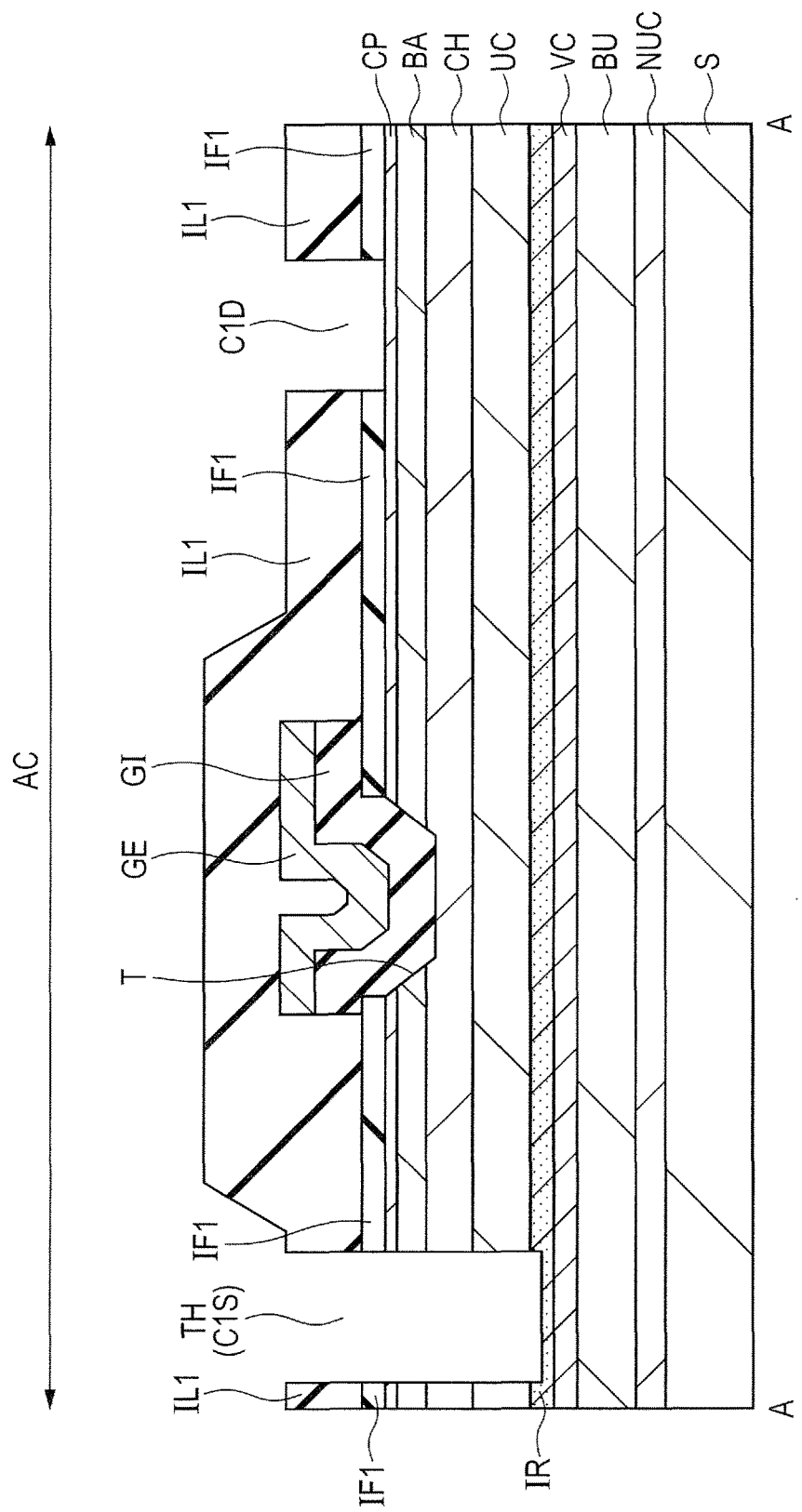
FIG. 62 is a sectional view illustrating the manufacturing process of the semiconductor device of the sixth embodiment, showing a step following FIG. 61.

Subsequently, as illustrated in FIG. 61, as with the first and second embodiments, the interlayer insulating film IL1 is formed, and then the contact holes C1S and C1D are formed through the interlayer insulating film IL1 and the insulating film IF1 using a photolithography technique and an etching technique. Furthermore, the through-hole TH is formed. The through-hole TH extends to the underlying impurity region IR (FIG. 62).

For example, an undepicted first photoresist film, which has an opening in each of a source electrode coupling region and a drain electrode coupling region, is formed on the interlayer insulating film IL1. Subsequently, the interlayer insulating film IL1 and the insulating film IF1 are etched with the first photoresist film as a mask, so that the contact holes C1S and C1D are formed (FIG. 61).

When a silicon oxide film is used as the interlayer insulating film IL1 while a silicon nitride film is used as the insulating film IF1, such films are dry-etched using a dry etching gas containing a fluorine-based gas such as $SF_6$, for example.

Subsequently, the first photoresist film is removed, and then an undepicted second photoresist film having an opening in a through-hole formation region is formed on the interlayer insulating film IL1 including the insides of the contact holes C1S and C1D. Subsequently, as with the second embodiment, the cap layer CP, the barrier layer BA, the channel layer CH, the channel base layer UC, and the impurity region IR are each partially etched with the second photoresist film as a mask to form the through-hole TH. In other words, there is formed the through-hole TH that extends to a certain depth of the impurity region IR through the cap layer CP, the barrier layer BA, the channel layer CH, and the channel base layer UC. The etching is performed such that the bottom of the through-hole TH is located within the impurity region IR.

When a silicon oxide film is used as the interlayer insulating film IL1 while a silicon nitride film is used as the insulating film IF1, such films are first removed by dry etching using a dry etching gas containing a fluorine-based gas such as $SF_6$, for example. Subsequently, the cap layer CP, the barrier layer BA, the channel layer CH, the channel base layer UC, and a certain depth of the impurity region IR are removed by dry etching using a dry etching gas containing a chlorine-based gas such as $BCl_3$, for example.

The impurity region IR is exposed from the bottom of the through-hole TH formed in the above step. Subsequently, the second photoresist film (not shown) is removed. The cap layer CP is exposed from the bottom of the contact hole C1D formed in the above step, and the impurity region IR is exposed from the bottom of the through-hole TH.

The formation order of the contact hole C1D and the through-hole TH is not limited to the above-described order. For example, the through-hole TH that extends to the impurity region IR may be formed prior to the contact hole C1D.

Figure 63:
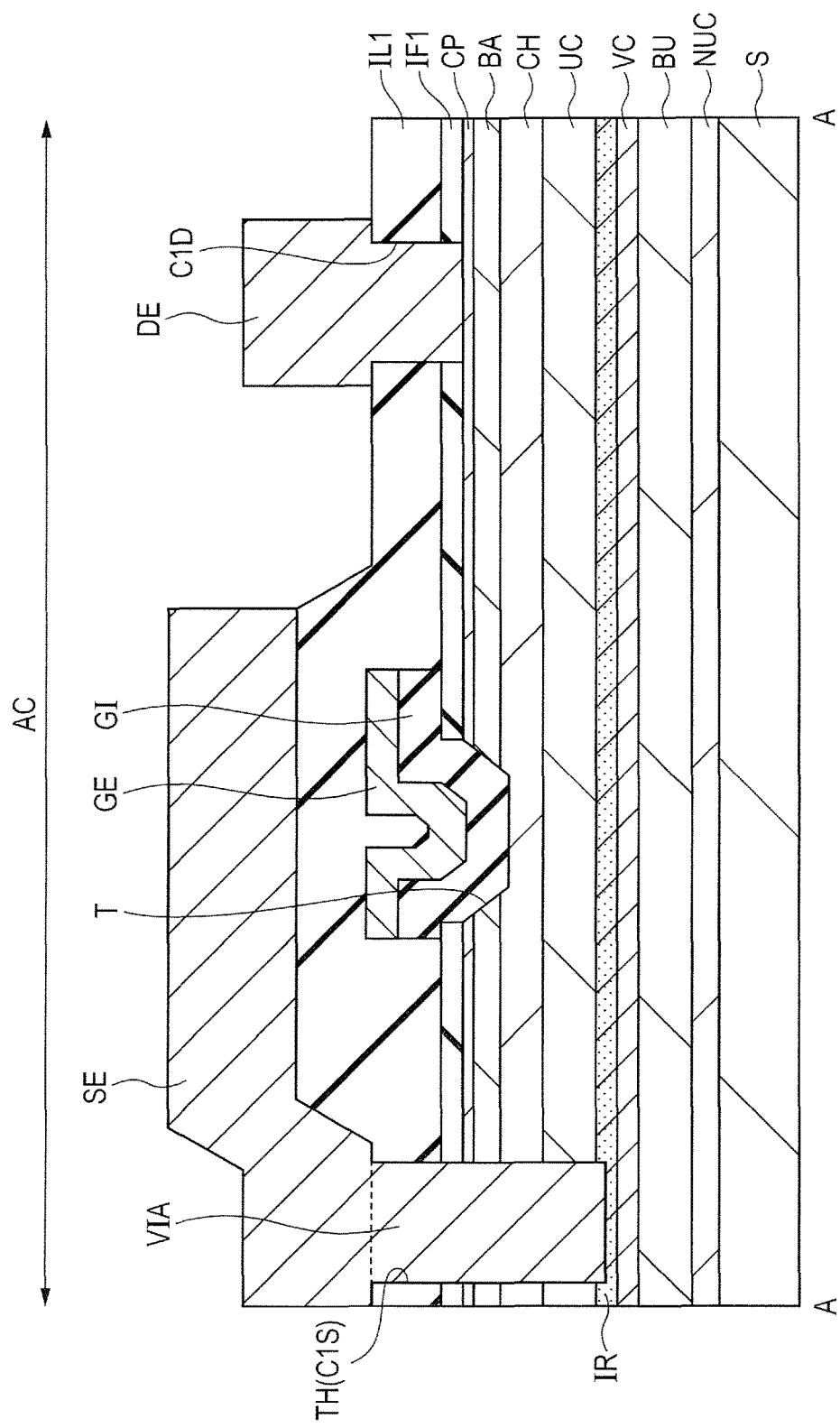
FIG. 63 is a sectional view illustrating the manufacturing process of the semiconductor device of the sixth embodiment, showing a step following FIG. 62.

Subsequently, as illustrated in FIG. 63, the source electrode SE and the drain electrode DE are formed on the cap layer CP on the two respective sides of the gate electrode GE, and the coupling VIA is formed. The source pad SP is formed at the end of the source electrode SE, and the drain pad DP is formed at the end of the drain electrode DE. Such pads can be formed in the same way as the second embodiment. The through-hole TH is located under the source pad SP, and the impurity region IR is located under the through-hole TH. The source pad SP is electrically coupled to the voltage clamp layer VC via the coupling VIA and the impurity region IR.

Subsequently, the protective film PRO is formed on the interlayer insulating film IL1 including the surfaces of the source electrode SE, the drain electrode DE, the source pad SP, and the drain pad DP. For example, a silicon oxynitride (SiON) film is formed as the protective film PRO on the interlayer insulating film IL1 including the surfaces of the source electrode SE, the drain electrode DE, the source pad SP, and the drain pad DP (FIGS. 57 and 58).

The semiconductor device of the sixth embodiment can be formed through the above-described steps. Such steps are merely shown as an example, and the semiconductor device of the sixth embodiment may be manufactured through other steps.

Thus, in the sixth embodiment, the voltage clamp layer VC as a conductive layer is provided between the buffer layer BU and the channel layer CH, and is coupled to the source electrode SE; hence, variations in characteristics of the semiconductor element can be decreased.

In the sixth embodiment, since the through-hole TH that extends to the impurity region (impurity layer) IR is provided, the impurity region IR is disposed under the bottom of the through-hole TH, and a good contact can be provided between the coupling VIA and the voltage clamp layer VC. In particular, even if the p-type impurity concentration in the voltage clamp layer VC is controlled to be relatively low (for example, about $1 \times 10^{18}$ (1E18) $cm^{-3}$) to increase a drain breakdown voltage, a good contact can be provided between the coupling VIA and the voltage clamp layer VC.

In the sixth embodiment, since the coupling VIA is disposed within the active region AC allowing electron conduction, the voltage can be further effectively clamped.

Seventh Embodiment

Although a recess-gate semiconductor device has been exemplified in the first to sixth embodiments, a semiconductor device having another configuration may be used. For example, as in a seventh embodiment, a junction-type semiconductor device, in which a gate junction layer is disposed under a gate electrode, may be used. The following semiconductor devices of first to sixth applications of the seventh embodiment are similar to those of the first to sixth embodiments, respectively, except for a configuration of a gate electrode section.

First Application

Figure 64:
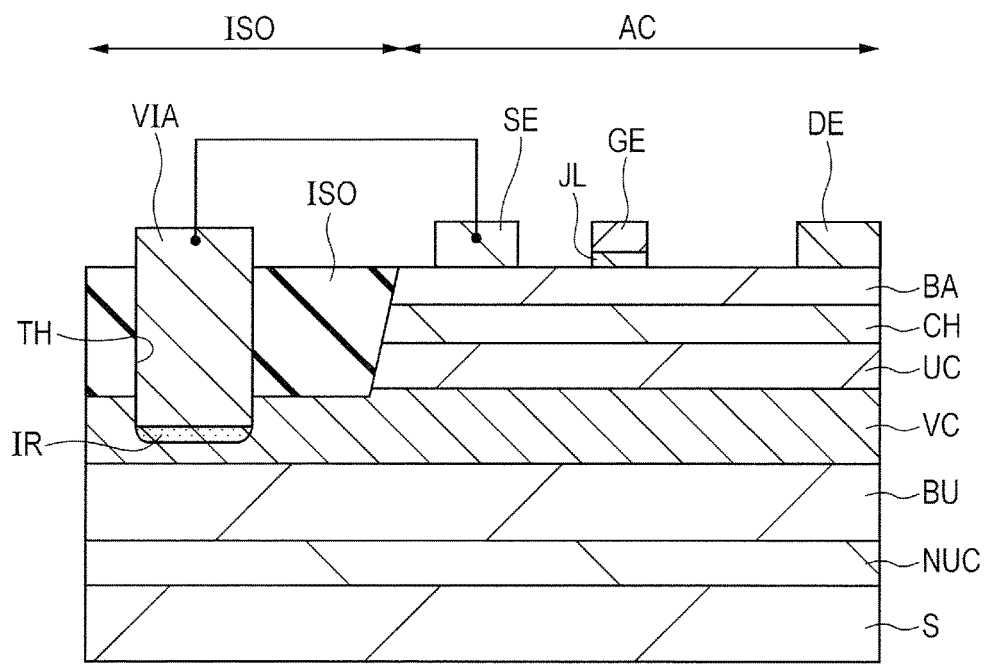
FIG. 64 is a sectional view schematically illustrating a configuration of a semiconductor device of a first application of a seventh embodiment.

FIG. 64 is a sectional view schematically illustrating a configuration of a semiconductor device of a first application of the seventh embodiment. The semiconductor device (semiconductor element) of the seventh embodiment is a transistor including a nitride semiconductor. The semiconductor device can be used as a power transistor of a high electron mobility transistor (HEMT) type.

In the semiconductor device of the seventh embodiment, as with the first embodiment, a nucleation layer NUC, a buffer layer BU, a voltage clamp layer VC, a channel base layer UC, a channel layer (also referred to as electron traveling layer) CH, and a barrier layer BA are provided in this order on a substrate S. The nucleation layer NUC includes a nitride semiconductor layer. The buffer layer BU includes one or more nitride semiconductor layers each including a nitride semiconductor doped with an impurity forming a deep level. In this exemplary case, the buffer layer BU includes a superlattice structure including a plurality of nitride semiconductor layers. The voltage clamp layer VC includes a nitride semiconductor layer including a nitride semiconductor doped with a p-type impurity, and is conductive. The channel base layer UC includes a nitride semiconductor layer having an electron affinity smaller than that of the channel layer CH. The channel layer CH includes a nitride semiconductor layer having an electron affinity larger than that of the channel base layer UC. The barrier layer BA includes a nitride semiconductor layer having an electron affinity that is smaller than that of the channel layer CH and than that of the channel base layer UC.

The semiconductor element of the seventh embodiment includes the barrier layer BA, a gate junction layer JL on the barrier layer BA, a gate electrode GE on the gate junction layer JL, and a source electrode SE and a drain electrode DE on the barrier layer BA on the two respective sides of the gate electrode GE. The semiconductor element is provided in an active region AC divided by a device isolation region ISO. The gate junction layer JL is doped with a p-type impurity. The gate junction layer JL is preferably in ohmic contact for holes with the gate electrode GE.

While a two-dimensional electron gas (2DEG) is generated on a channel layer CH side in the vicinity of the interface between the channel layer CH and the barrier layer BA, the two-dimensional electron gas (2DEG) is not generated under the gate junction layer JL since the conduction band of the channel layer CH is raised due to negative charge caused by acceptor ionization. Hence, the semiconductor device of the seventh embodiment can maintain its off state while the positive potential (threshold potential) is not applied to the gate electrode GE, and can maintain its on state while the positive potential (threshold potential) is applied to the gate electrode GE. The semiconductor device thus performs normally-off operation.

For example, a GaN layer can be used as the gate junction layer JL. Although the GaN layer may have a desired thickness according to target characteristics, the thickness is about 50 nm, for example. Materials for the gate junction layer JL may include the above-described GaN, AlN, and InN. The gate junction layer JL is preferably doped with a p-type impurity. Examples of the p-type impurity include Be, C, and Mg.

The constitutional materials of the gate electrode GE, the interlayer insulating film IL1, and the protective film PRO are the same as those described in the first embodiment.

In the seventh embodiment, a coupling (also referred to as via) VIA, which extends through the device isolation region ISO to the underlying voltage clamp layer VC, is provided in the device isolation region ISO, and is electrically coupled to the source electrode SE. In the seventh embodiment, an impurity region IR is provided under the coupling VIA.

In this way, the voltage clamp layer VC is provided and coupled to the source electrode SE, thereby variations in characteristics such as threshold potential and on resistance can be decreased.

The impurity region IR is provided under the bottom of the through-hole TH, thereby a good contact can be provided between the coupling VIA and the voltage clamp layer VC.

Since the coupling VIA in the through-hole TH is disposed within the device isolation region ISO and under the formation region of the source pad SP, small size and a high degree of integration of the semiconductor element can be achieved.

Figure 65:
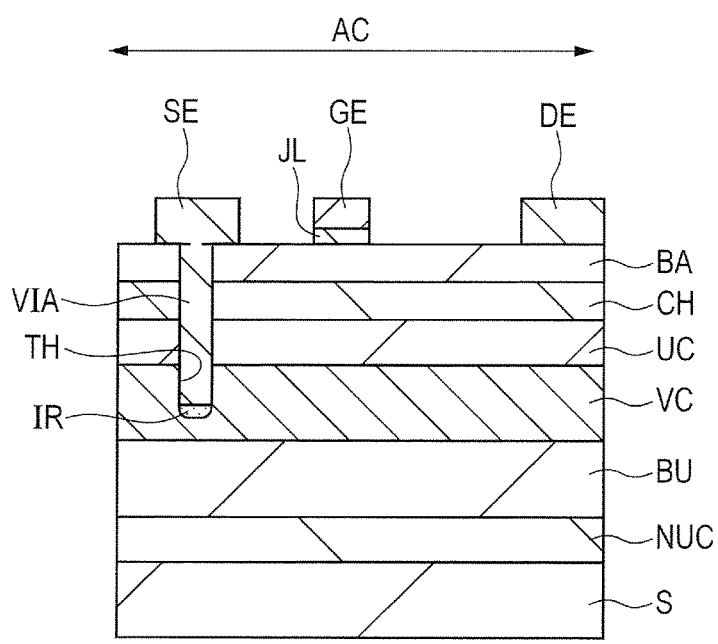
FIG. 65 is a sectional view schematically illustrating a configuration of a semiconductor device of a second application of the seventh embodiment.

In this way the first application also exhibits effects similar to those of the first embodiment and the like.
Second Application FIG. 65 is a sectional view schematically illustrating a configuration of a semiconductor device of a second application of the seventh embodiment.

Figure 66:
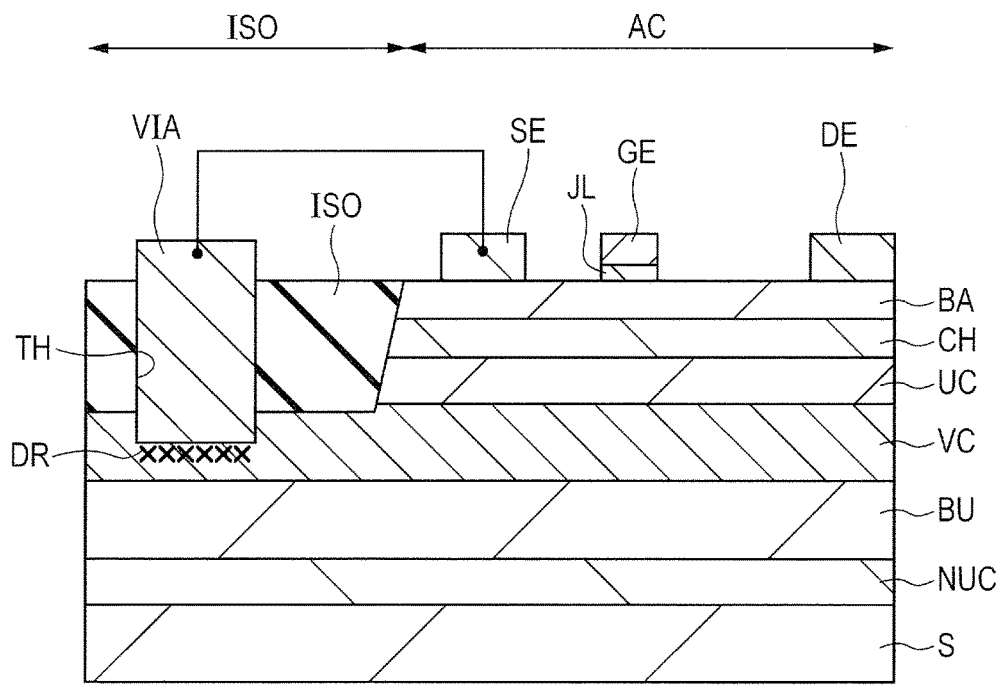
FIG. 66 is a sectional view schematically illustrating a configuration of a semiconductor device of a third application of the seventh embodiment.

Although the coupling VIA is provided in the device isolation region ISO in the first application, the coupling VIA may be provided in the active region AC. For example, as illustrated in FIG. 65, the coupling VIA is provided under the source electrode SE, and the impurity region IR is provided under the coupling VIA. The second application also exhibits effects similar to those of the second embodiment and the like.
Third Application FIG. 66 is a sectional view schematically illustrating a configuration of a semiconductor device of a third application of the seventh embodiment.

Figure 67:
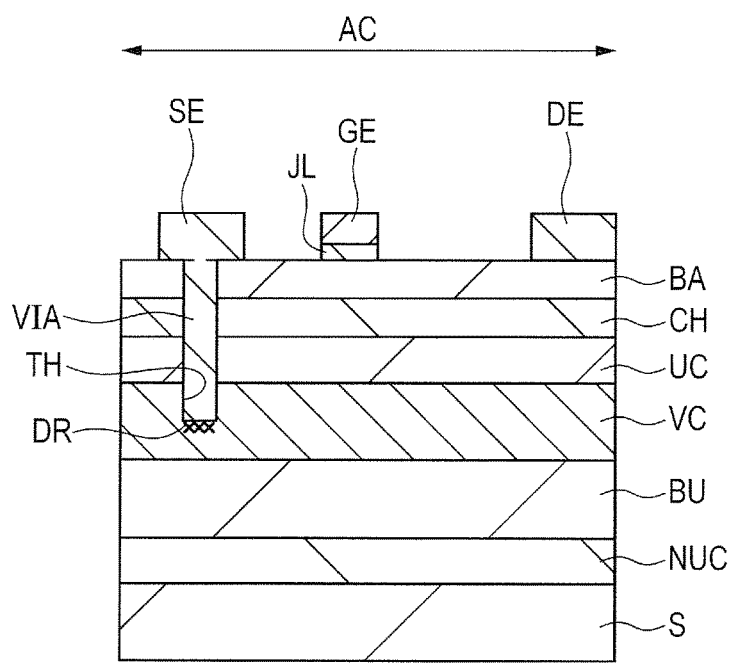
FIG. 67 is a sectional view schematically illustrating a configuration of a semiconductor device of a fourth application of the seventh embodiment.

Although the impurity region IR, in which the impurity having the deep acceptor level has been implanted, is provided as a hopping conduction region under the coupling VIA in the first application, a defect region DR may be provided as the hopping conduction region under the coupling VIA. The third application also exhibits effects similar to those of the third embodiment and the like.
Fourth Application FIG. 67 is a sectional view schematically illustrating a configuration of a semiconductor device of a fourth application of the seventh embodiment.

Figure 68:
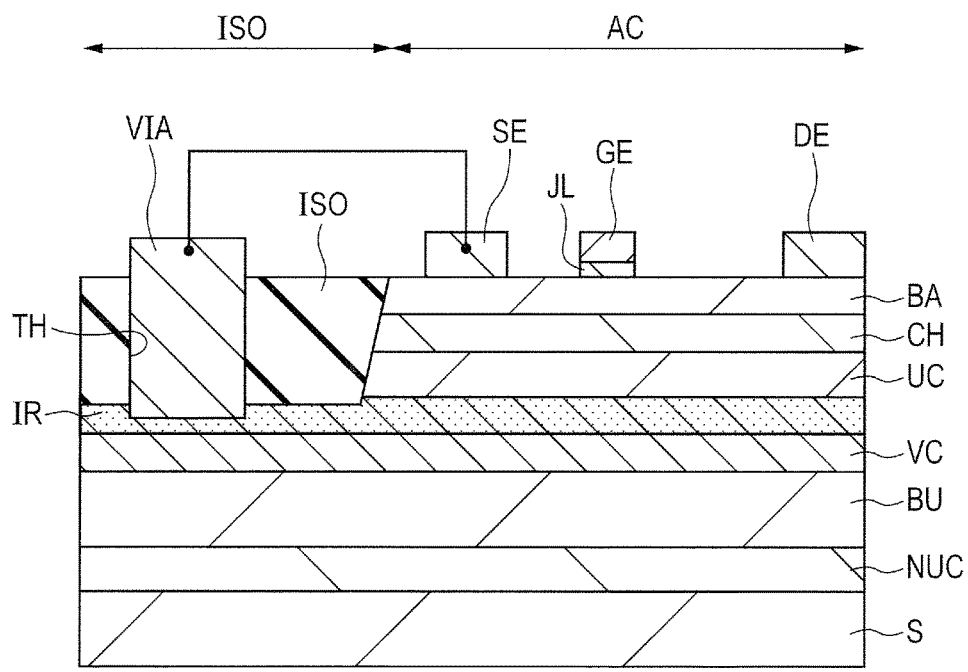
FIG. 68 is a sectional view schematically illustrating a configuration of a semiconductor device of a fifth application of the seventh embodiment.

Although the impurity region IR, in which the impurity having the deep acceptor level has been implanted, is provided as a hopping conduction region under the coupling VIA in the second application, a defect region DR may be provided as the hopping conduction region under the coupling VIA. The fourth application also exhibits effects similar to those of the fourth embodiment and the like.
Fifth Application FIG. 68 is a sectional view schematically illustrating a configuration of a semiconductor device of a fifth application of the seventh embodiment.

Figure 69:
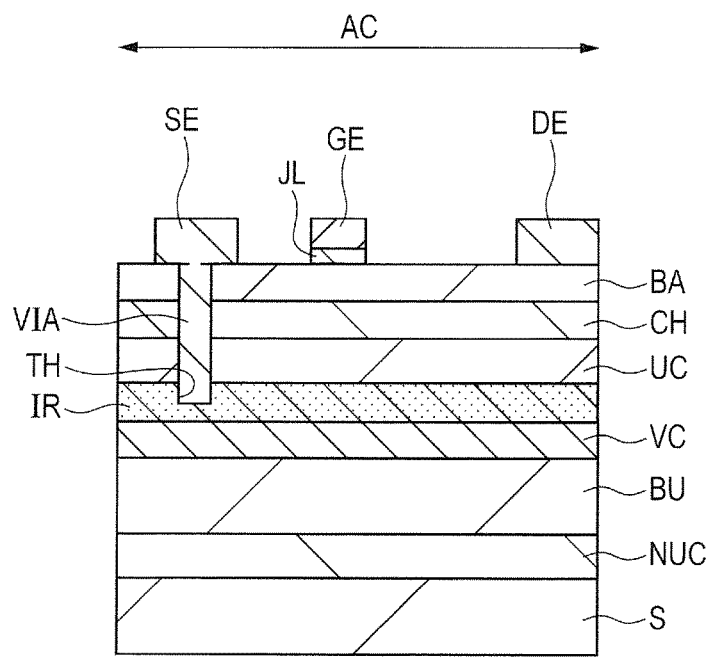
FIG. 69 is a sectional view schematically illustrating a configuration of a semiconductor device of a sixth application of the seventh embodiment.

Although the impurity region IR, in which the impurity having the deep acceptor level has been implanted, is provided only under the bottom of the coupling VIA in the first application, the impurity region IR may be provided in the entire area of the surface portion of the voltage clamp layer VC. The fifth application also exhibits effects similar to those of the fifth embodiment and the like.
Sixth Application FIG. 69 is a sectional view schematically illustrating a configuration of a semiconductor device of a sixth application of the seventh embodiment.

Although the coupling VIA is provided in the device isolation region ISO in the fifth application, the coupling VIA may be provided in the active region AC. In the seventh embodiment, for example, the coupling VIA is provided under the source electrode SE, and the impurity region IR is provided under the coupling VIA. The sixth application also exhibits effects similar to those of the sixth embodiment and the like.

The semiconductor device described in each of the first to sixth applications can be formed through a manufacturing process similar to that of the semiconductor device of the first embodiment or the like while being different in the configuration of the gate junction layer JL.
Seventh Application FIG. 70 is a sectional view illustrating a configuration of a semiconductor device of a seventh application of the seventh embodiment.

Although one through-hole (coupling VIA) TH is disposed under the source pad SP in the first embodiment, a plurality of through-holes (couplings VIA) TH may be disposed under the source pad SP.

Figure 70:
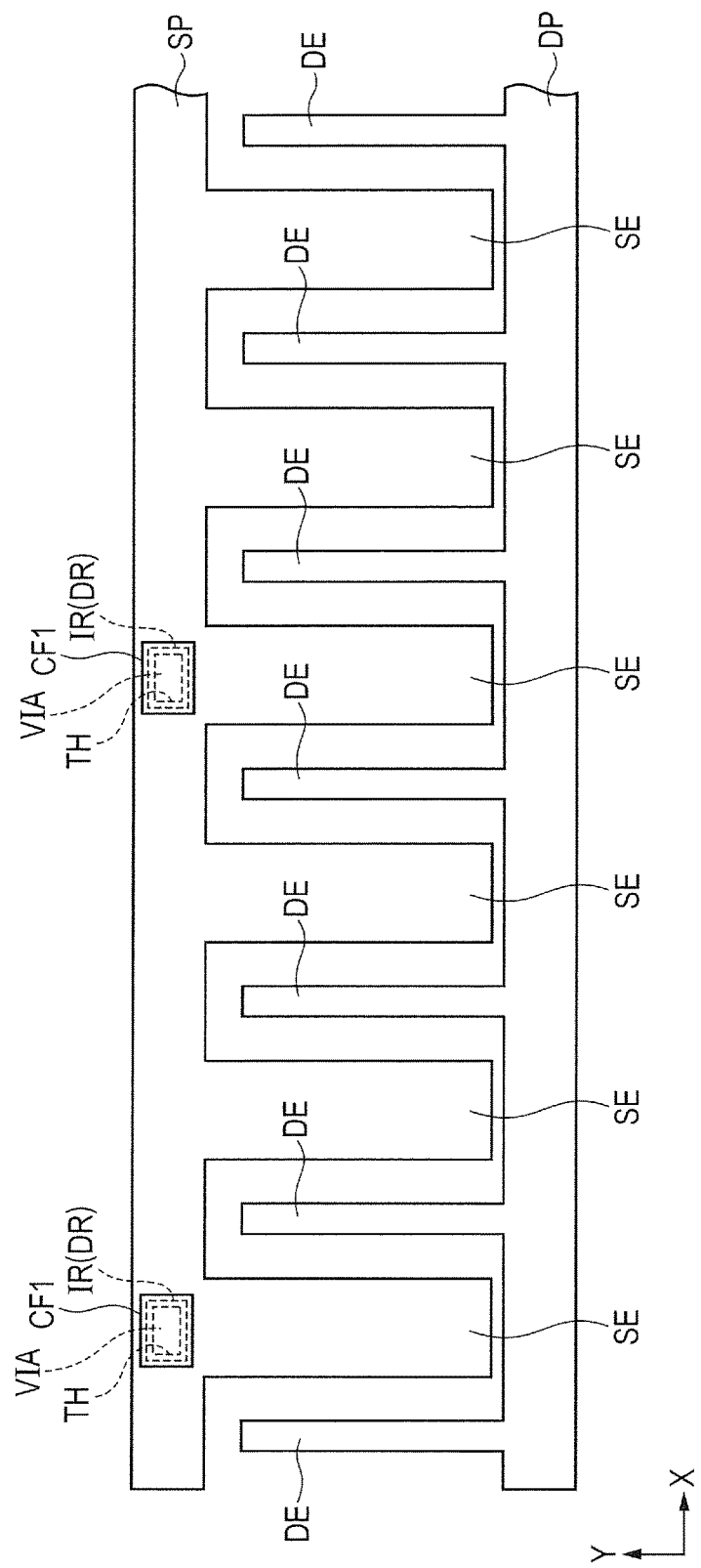
FIG. 70 is a plan view schematically illustrating a configuration of a semiconductor device of a seventh application of the seventh embodiment.

For example, as illustrated in FIG. 70, a plurality of through-holes (couplings VIA) TH may be provided under the source pad SP with a certain space.

Eighth Application

Figure 71:
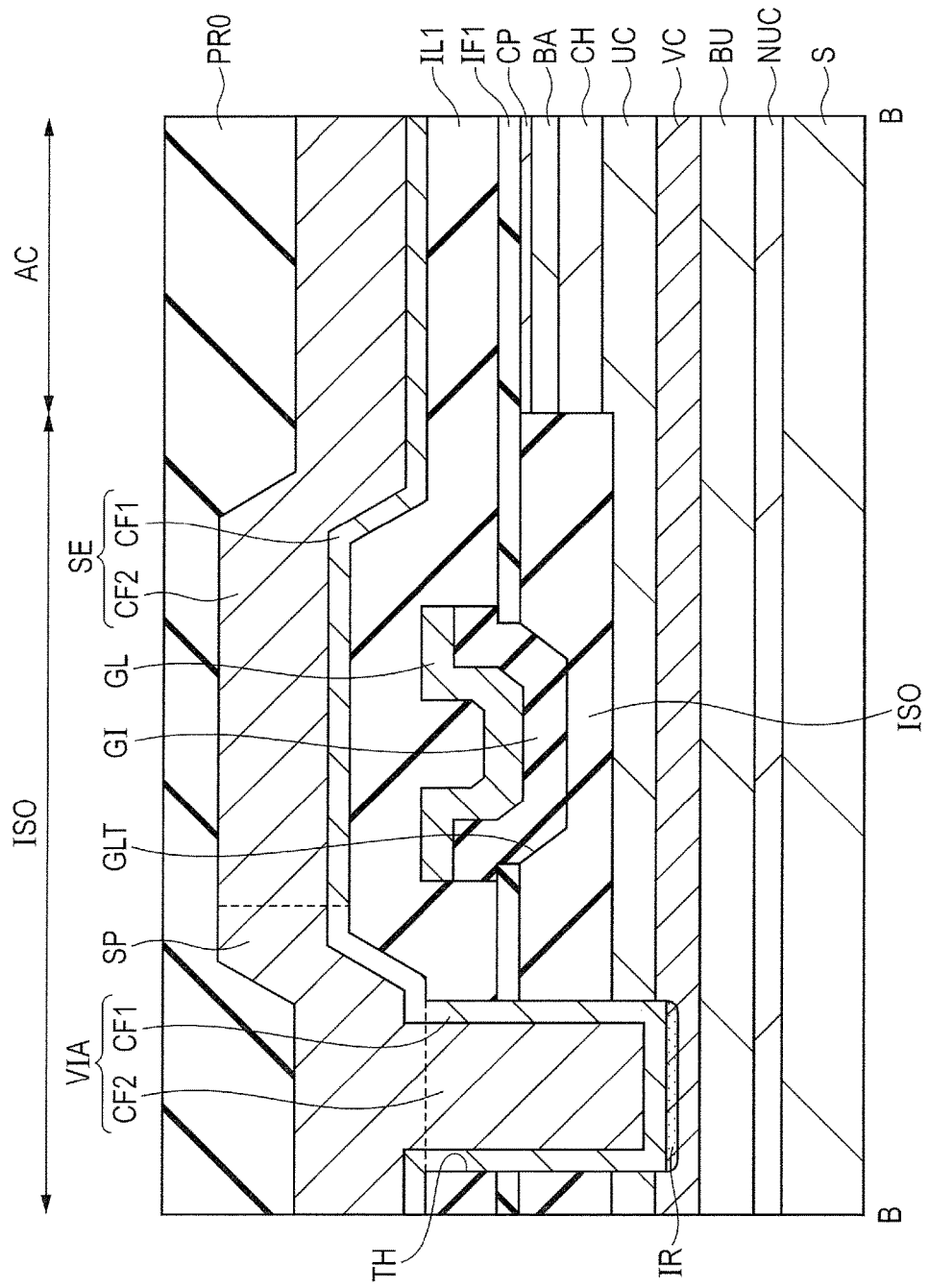
FIG. 71 is a sectional view schematically illustrating a configuration of a semiconductor device of an eighth application of the seventh embodiment.
Figure 72:
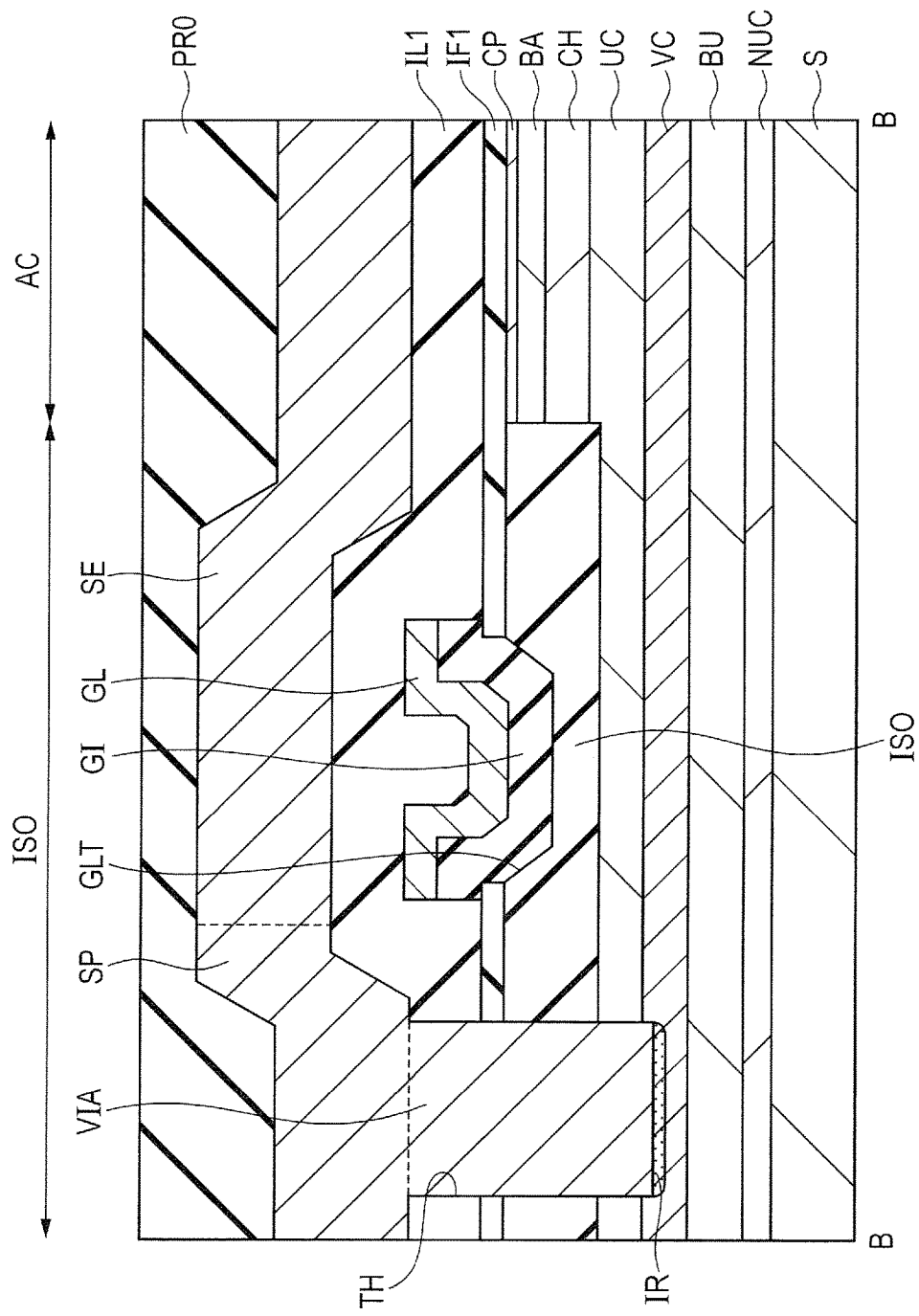
FIG. 72 is a sectional view schematically illustrating the configuration of the semiconductor device of the eighth application of the seventh embodiment.
Figure 73:
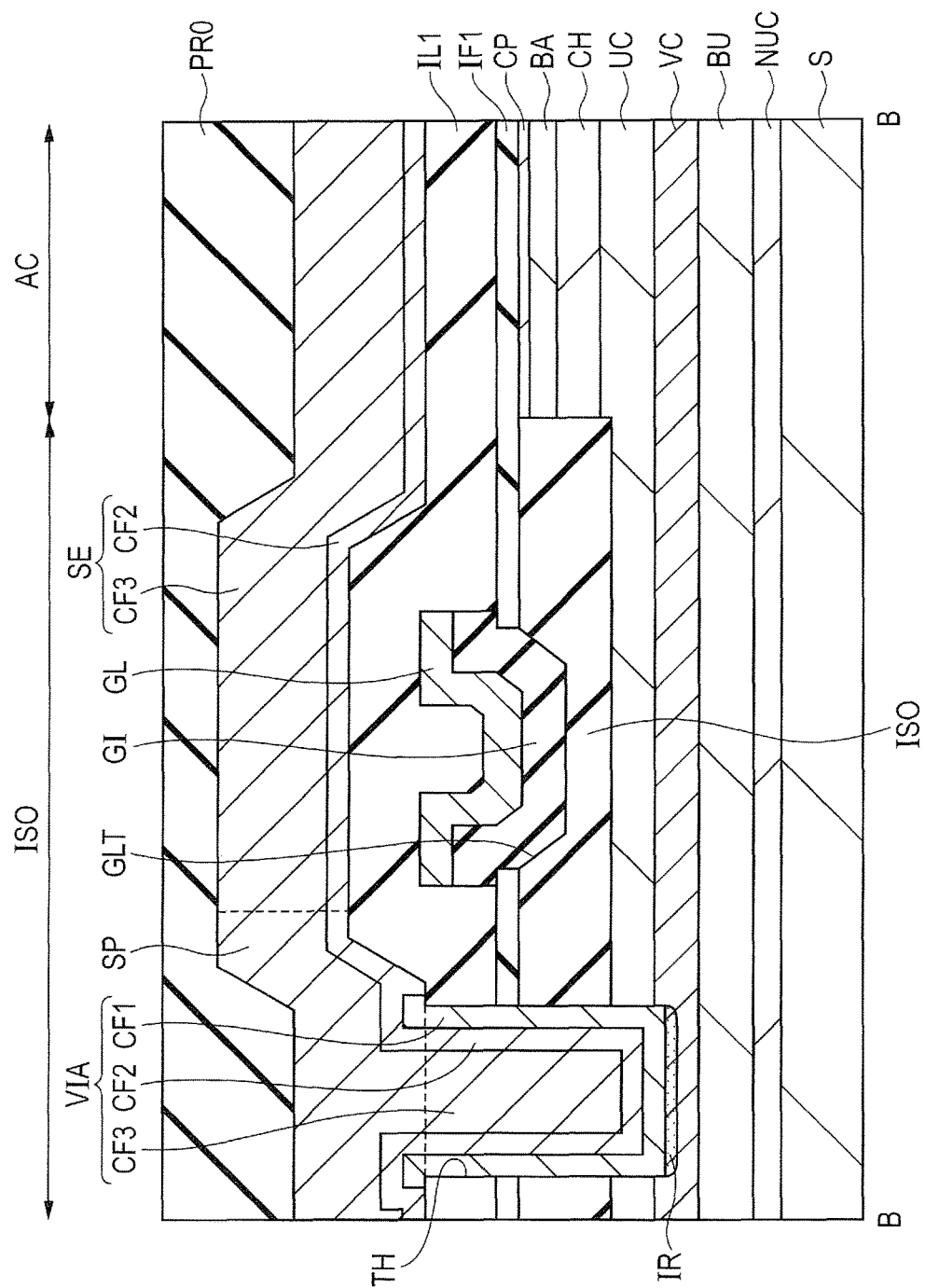
FIG. 73 is a sectional view illustrating the configuration of the semiconductor device of the eighth application of the seventh embodiment.

FIGS. 71 to 73 are sectional views illustrating a configuration of a semiconductor device of an eighth application of the seventh embodiment.

Although the coupling VIA is configured of the film stack of the conductive films CF1 and CF2 while the source electrode SE, the drain electrode DE, or the like is configured of a single-layer film of the conductive film CF2 in the first, third, and fifth embodiments, the film configuration of the coupling VIA, the source electrode SE, the drain electrode DE, or the like can be appropriately modified.

For example, the coupling VIA may have the same film configuration as that of the source electrode SE or the like. For example, the coupling VIA, the source electrode SE, or the like may be configured of a film stack of the conductive films CF1 and CF2 (FIG. 71). The coupling VIA, the source electrode SE, or the like may be configured of a single-layer film (FIG. 72).

The source electrode SE or the like may be configured of a film stack (for example, Al/TiN) different from that of the coupling VIA. In such a case, the coupling VIA is configured of a film stack (for example, Al/TiN/Ni) of three-layer films of conductive films CF1, CF2, and CF3 (FIG. 73).

In this way, the film configuration of the coupling VIA, the source electrode SE, or the like can be appropriately modified. When the coupling VIA, the source electrode SE, and the like are configured of the same material, the etching step can be omitted, leading to shorter process time. When the coupling VIA, the source electrode SE, and the like are configured of materials different from one another, an optimum material can be selected for each of them.

Although the invention achieved by the inventors has been described in detail according to some embodiments thereof hereinbefore, the invention should not be limited thereto, and it will be appreciated that various modifications or alterations thereof may be made within the scope without departing from the gist of the invention.

What is claimed is:

1. A semiconductor device, comprising:
    a substrate;
    a first nitride semiconductor layer provided over the substrate;
    a second nitride semiconductor layer provided over the first nitride semiconductor layer;
    a gate electrode disposed over the second nitride semiconductor layer;
    a first electrode and a second electrode provided over the second nitride semiconductor layer on two respective sides of the gate electrode;
    a coupling that couples the first electrode to the first nitride semiconductor layer; and
    an impurity region provided between the coupling and the first nitride semiconductor layer,
    wherein the first nitride semiconductor layer contains a p-type impurity, and
    wherein the impurity region contains an impurity having an acceptor level deeper than an acceptor level of the p-type impurity,
    wherein the substrate has a first region and a second region,
    wherein the gate electrode, the first electrode, and the second electrode are provided in the first region,
    wherein the second region is a device isolation region provided in the second nitride semiconductor layer, and
    wherein the coupling disposed in an inside of a through-hole that extends to the first nitride semiconductor layer through the device isolation region.

2. The semiconductor device according to claim 1, wherein the impurity having the deep acceptor level includes at least one of Zn, Cd, Be, and C.

3. The semiconductor device according to claim 1, wherein the impurity region is provided in an entire area of a surface portion of the first nitride semiconductor layer.

4. The semiconductor device according to claim 1, further comprising a third nitride semiconductor layer provided over the second nitride semiconductor layer.

5. The semiconductor device according to claim 4, wherein the electron affinity of the third nitride semiconductor layer is smaller than the electron affinity of the second nitride semiconductor layer.

6. The semiconductor device according to claim 5, further comprising a fourth nitride semiconductor layer provided between the first nitride semiconductor layer and the second nitride semiconductor layer.

7. The semiconductor device according to claim 6, wherein the electron affinity of the fourth nitride semiconductor layer is smaller than the electron affinity of the second nitride semiconductor layer.

8. The semiconductor device according to claim 1, wherein the coupling is physically separated from the first electrode.

9. The semiconductor device according to claim 1, wherein a first terminal section to be electrically coupled to the first electrode is disposed over the coupling.

10. The semiconductor device according to claim 1, wherein a bottom of the through-hole is located on a surface of the impurity region or located at a certain depth of the impurity region.

11. The semiconductor device according to claim 1, wherein the substrate has a first region and a second region,
    wherein the gate electrode, the first electrode, and the second electrode are provided in the first region,
    wherein the second region is a device isolation region provided in the second nitride semiconductor layer, and
    wherein the coupling is disposed in an inside of a through-hole that extends to the first nitride semiconductor layer through the second nitride semiconductor layer.

12. The semiconductor device according to claim 11, wherein the first electrode is disposed over the coupling.

13. The semiconductor device according to claim 4, further comprising a trench that extends to a certain depth of the second nitride semiconductor layer through the third nitride semiconductor layer,
    wherein the gate electrode is disposed within the trench through a gate insulating film.

14. The semiconductor device according to claim 4, further comprising a fifth nitride semiconductor layer over the third nitride semiconductor layer,
    wherein the gate electrode is disposed over the third nitride semiconductor layer with the fifth nitride semiconductor layer in between, and
    wherein electron affinity of the fifth nitride semiconductor layer is larger than electron affinity of the third nitride semiconductor layer.

* * * * *